United States Patent [19]

Sawada et al.

[11] Patent Number: 5,508,963
[45] Date of Patent: Apr. 16, 1996

[54] SEMICONDUCTOR INTEGRATED CIRCUIT

[75] Inventors: Akihiro Sawada; Hiroyuki Yamauchi; Hironori Akamatsu; Shunichi Iwanari; Masashi Agata; Hirohito Kikukawa, all of Osaka; Hisakazu Kotani, Hyogo, all of Japan

[73] Assignee: Matsushita Electric Industrial Co., Ltd., Osaka, Japan

[21] Appl. No.: 209,120

[22] Filed: Mar. 11, 1994

Related U.S. Application Data

[63] Continuation-in-part of Ser. No. 128,726, Sep. 30, 1993, Pat. No. 5,396,124.

[30] Foreign Application Priority Data

| Mar. 12, 1993 | [JP] | Japan | 5-051881 |
| May 18, 1993 | [JP] | Japan | 5-115795 |
| Aug. 27, 1993 | [JP] | Japan | 5-212667 |

[51] Int. Cl.$^6$ .................................................. G11C 7/00
[52] U.S. Cl. ................. 365/200; 365/225.7; 365/230.06
[58] Field of Search ............................. 365/200, 230.06, 365/225.7; 371/10.1, 10.3

[56] References Cited

U.S. PATENT DOCUMENTS

| 4,376,300 | 3/1983 | Tsang | 365/200 |
| 4,471,472 | 9/1984 | Young | 365/200 |
| 4,951,253 | 8/1990 | Sahara et al. | 365/200 |
| 5,206,831 | 4/1993 | Wakamatsu | 365/200 |

FOREIGN PATENT DOCUMENTS 2-21500  1/1990  Japan .

OTHER PUBLICATIONS

K. Sasaki et al., "A 9ns 1 Mb CMOS SRAM", ISSCC Digest of Technical Papers, pp. 34–35 (1989).
M. Miyauchi et al., "4Mb Field Memory", ICD90–112, pp. 45–49 (1990).
H. Kikukawa et al., "Novel Flexible Redundancy Architecture for 64Mb DRAM and Beyond", IEICE Digest of Technical Papers of Autumn Conference, vol. 5, p. 152 (1992).

Primary Examiner—Joseph A. Popek
Attorney, Agent, or Firm—Willian Brinks Hofer Gilson & Lione

[57] ABSTRACT

N-piece redundant address comparing circuits are individually composed of impedance converting circuits, so that information using redundancy is transmitted as an impedance value. Consequently, even though the N becomes larger as the capacity of a memory becomes larger, a signal line having large capacitance and the node of a redundant judging circuit are not charged or discharged. A high-speed operation can be realized without being affected by the capacitance of the signal line or by the capacitance of the node of the redundant judging circuit.

23 Claims, 58 Drawing Sheets

F I G. 23
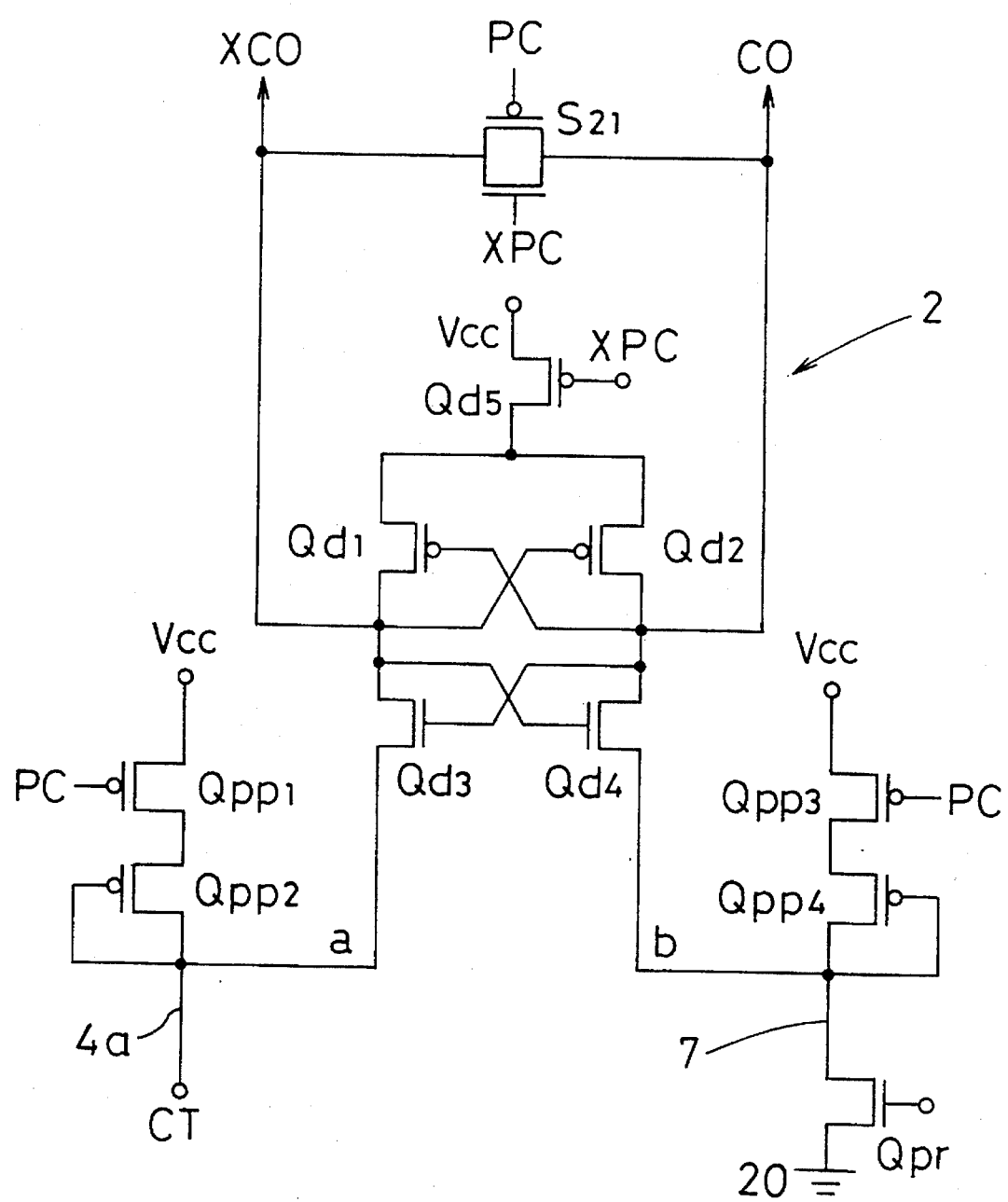

F I G. 24
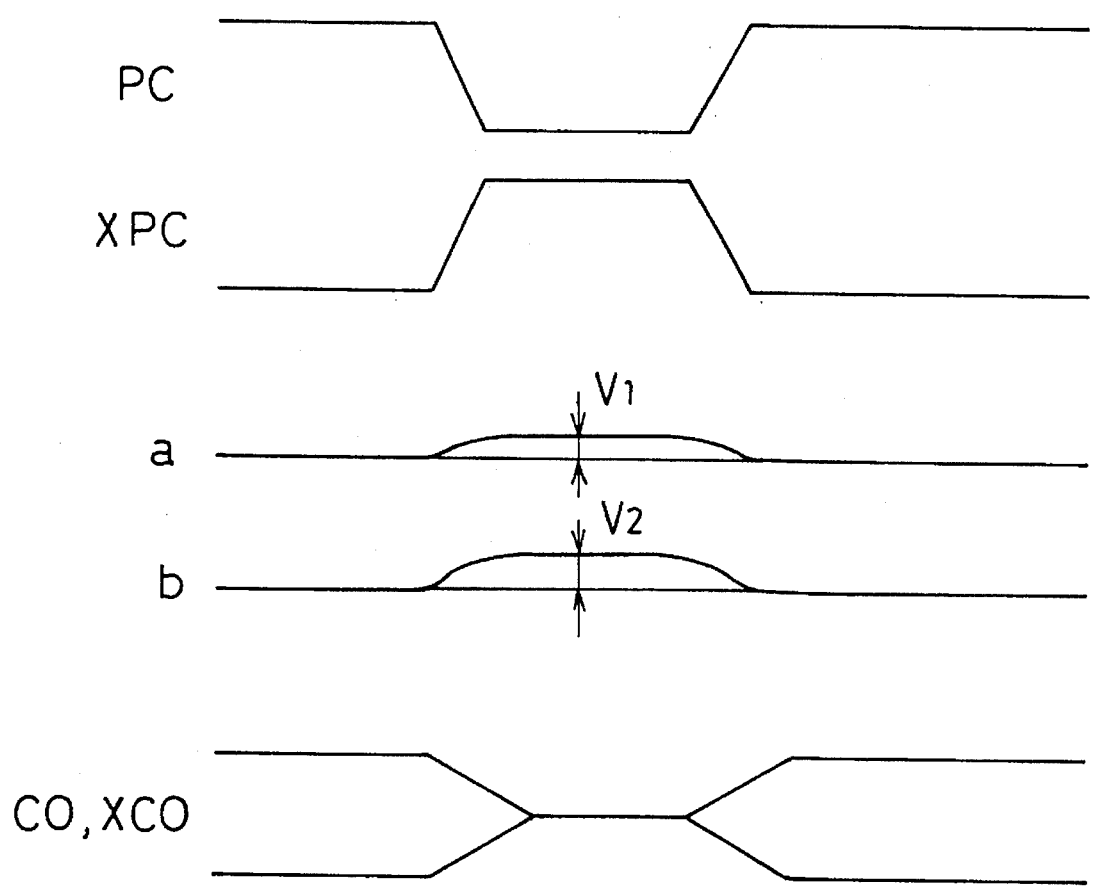

201~206 ADDRESS INPUT TERMINALS
233 REDUNDANT FUSE PRECHARGE SIGNAL INPUT TERMINAL
234 REDUNDANCY DETECT SIGNAL OUTPUT TERMINAL
235 ADDITIONAL INFORMATION STORAGE UNIT

ADDRESS 281

PREDECODE SIGNAL 283

REDUNDANT SIGNAL 284

REDUNDANT COLUMN DECODE SIGNAL 341

COLUMN DECODE SIGNALS 260~263

REDUNDANT I/O DETECT SIGNAL 291

PAIR OF REDUNDANT DATA LINES 295

PAIRS OF DATA LINES 264~267

PAIRS OF DATA LINES 273~275

PAIR OF DATA LINES 272

FIG. 35

| | STATE OF 289 | STATE OF 290 |
|---|---|---|
| I/O0 SELECTED | H | H |
| I/O1 SELECTED | H | L |
| I/O2 SELECTED | L | H |
| I/O3 SELECTED | L | L |

FIG. 38

| MEMORY ARRANGEMENT | NUMBER OF FUSES | 4 | 8 | 16 | 32 |
|---|---|---|---|---|---|
| 4-BIT MEMORY OF PRIOR ART | TOTAL NUMBER OF RELIEVABLE FAULTS PER CHIP | 4 | 8 | 16 | 32 |
| | MAXIMUM NUMBER OF RELIEVABLE FAULTS PER I/O | 1 | 2 | 4 | 8 |
| 8-BIT MEMORY OF PRIOR ART | TOTAL NUMBER OF RELIEVABLE FAULTS PER CHIP | — | 8 | 16 | 32 |
| | MAXIMUM NUMBER OF RELIEVABLE FAULTS PER I/O | — | 1 | 2 | 4 |
| 16-BIT MEMORY OF PRIOR ART | TOTAL NUMBER OF RELIEVABLE FAULTS PER CHIP | — | — | 16 | 32 |
| | MAXIMUM NUMBER OF RELIEVABLE FAULTS PER I/O | — | — | 1 | 2 |
| 4-BIT MEMORY OF PRESENT INVENTION | TOTAL NUMBER OF RELIEVABLE FAULTS PER CHIP | 4 | 8 | 16 | 32 |
| | MAXIMUM NUMBER OF RELIEVABLE FAULTS PER I/O | 4 | 8 | 16 | 32 |
| 8-BIT MEMORY OF PRESENT INVENTION | TOTAL NUMBER OF RELIEVABLE FAULTS PER CHIP | 4 | 8 | 16 | 32 |
| | MAXIMUM NUMBER OF RELIEVABLE FAULTS PER I/O | 4 | 8 | 16 | 32 |
| 16-BIT MEMORY OF PRESENT INVENTION | TOTAL NUMBER OF RELIEVABLE FAULTS PER CHIP | 4 | 8 | 16 | 32 |
| | MAXIMUM NUMBER OF RELIEVABLE FAULTS PER I/O | 4 | 8 | 16 | 32 |

436 FIRST I/O JUDGING CIRCUIT
437 SECOND I/O JUDGING CIRCUIT
439 COLUMN PREDECODER
471~510 COLUMN SWITCHES

150 REDUNDANT FUSE PRECHARGE SIGNAL INPUT TERMINAL
155 REDUNDANCY DETECT SIGNAL OUTPUT TERMINAL
156~161 ADDRESS INPUT TERMINALS

ADDRESS 12

PREDECODE SIGNAL
13

REDUNDANT SIGNAL
30

REDUNDANT SIGNALS
31 ~ 37

COLUMN DECODE
SIGNAL 18

COLUMN DECODE
SIGNALS 19 ~ 21

REDUNDANT COLUMN
DECODE SIGNAL 195

PAIR OF DATA LINES
42

PAIRS OF DATA LINES
43 ~ 45

718~725   SERIAL/RANDOM CONTROL CHANGEOVER CIRCUITS
734~741   ADDRESS SIGNALS

726~733 SERIAL/RANDOM CONTROL CHANGEOVER CIRCUITS
742~749 ADDRESS SIGNALS

SEMICONDUCTOR INTEGRATED CIRCUIT

This application is a Continuation-In-Part of application Ser. No. 08/128,726 filed Sep. 30, 1993 now U.S. Pat. No. 5,396,124.

BACKGROUND OF THE INVENTION

The present invention relates to a semiconductor integrated circuit such as a microprocessor, a semiconductor memory having a redundant circuit, or the like.

In an integrated semiconductor memory such as a mass SRAM (static RIM), a mass DRAM (dynamic RAM) or the like, there are disposed spare cells in addition to normal memory cells (normal cells) in order to relieve defective cells if any. "A 9 ns 1 Mb CMOS SRAM", ISSCC digest of Technical Papers, pp 34–35, 1989 by K. Sasaki et al. or Japanese Laid-Open Publication No. 2-21500 discloses a spare cell reading method shown in FIGS. 15 and 16.

FIG. 15 is a circuit diagram showing the arrangement of a reading circuit portion in a conventional SRAM. In the arrangement shown in FIG. 15, the memory cells are divided into two blocks, i.e., a first cell array in which n-piece first normal cells 11.1, 11.2, ... and one first spare cell 21 are connected to a first pair of data lines 31, and a second cell array in which n-piece second normal cells 12.1, 12.2, ... and one second spare cells 22 are connected to a second pair of data lines 32. Normal word lines 31.1, 35.2, 35.3, 35.4, ... are disposed for selecting one of 2n-piece normal cells 11.h, 12.h (h=1 to n), and spare word lines 37.1, 37.2 are disposed for selecting one of the two spare cells 21, 22.

There is also disposed a decoder 41 for receiving an address. Connected to the decoder 41 are (i) n-piece normal global word lines 33.1, 33.2, ... the voltage of one of which is raised to a high level in response to an input address, (ii) one spare global word line 36 of which voltage is raised to a high level simultaneously with the one normal global word line above-mentioned, and (iii) first and second block selecting lines 34a, 34b for selecting the cell arrays. In the following description, signals on the n-piece normal global word lines 33.1, 33.2, ... are respectively designated as NGWL1, NGWL2, ..., signals on the 2n-piece normal word lines 35.1, 35.2, 35.3, 35.4, ... are respectively designated as NWL1, NWL2, NWL3, NWL4, ... a signal on the spare global word line 36 is designated as SGWL, signals on the two spare word lines 37.1, 37.2 are respectively designated as SWL1, SWL2, and signals on the first and second block selecting lines 34a, 34b are designated as BLK1, BLK2.

2n-Piece AND circuits 42.1, 42.2, 42.3, 42.4, ... are disposed for raising one of the NWLi (i=1 to 2 n) to a high level. Of these, n-piece AND circuits 42.1, 42.3, ... corresponding to i which is an odd number, are disposed for selecting one of the n-piece first normal cells 11.1, 11.2, ... in response to NGWLh (h=1 to n) and the BLK2. AND circuits 44.1, 44.2 are disposed for respectively raising the SWL1 and the SWL2 to high levels. One AND circuit 44.1 is adapted to select the second spare cell 22 in response to the SGWL and the BLK1, and the other AND circuit 44.2 is adapted to select the first spare cell 21 In response to the SGWL and the BLK2. More specifically, when the BLK1 becomes a high level or a logical value 1 (the BLK2 becomes a low level or a logical value 0) and information on one of the first normal cells 11.1, 11.2, ... is read out onto the first pair of data lines 31, information on the second spare cell 22 is read out onto the second pair of data lines 32.

When the BLK2 becomes equal to 1 (the BLK1 is equal to 0) and information on one of the second normal cells 12.1, 12.2, ... is read out onto the second pair of data lines 32, information on the first spare cell 21 is read out onto the first pair of data lines 31. Information on the first pair of data lines 31 is entered into a first sense amplifier 46.1, and information on the second pair of data lines 32 is entered into a second sense amplifier 46.2.

The first spare cell 21 serves as a substitute cell for the second normal cells 12.1, 12.2, ... and the second spare cell 22 serves as a substitute cell for the first normal cells 11.1, 11.2, .... A spare address comparing circuit 91 is adapted to judge whether or not a plurality of previously stored or programmed spare addresses contain an address identical with the input address. In the affirmative, it is required to select the first or second spare cell 21, 22 as a substitute cell. In the negative, the input address is called a normal address, requiring no substitute cell. To control the foregoing, the spare address comparing circuit 91 is arranged such that a redundancy judging signal SPARE on an output signal line 92 is set to 1 when a spare address is entered, and that the SPARE is set to 0 when a normal address entered. When the SPARE is equal to 0, a redundancy judging switch 93 is adapted to supply the BLK1 to the first sense amplifier 46.1 and the BLK2 to the second sense amplifier 46.2, thus activating one sense amplifier 46.1 or 46.2. On the other hand, when the SPARE is equal to 1, the redundancy judging switch 93 is adapted to supply the BLK1 to the second sense amplifier 46.2 and the BLK2 to the first sense amplifier 46.1, thus activating the other sense amplifier 46.2 or 46.1.

According to the arrangement above-mentioned, information of one of the first and second normal cells 11.h, 1.2.h (h=1 to n) is read out onto an output data-line 39 when a normal address is entered, and information of the first or second spare cell 21 or 22 is read out onto the output data line 39 when a spare address is entered. The foregoing is shown in FIG. 16. More specifically, FIG. 16 shows an example where the second normal cell 12.1 selected by the NWL2 is accessed subsequently to the access to the first normal cell 11.1 selected by the NWL1.

First, the NGWL1, the BLK1 and the SGWL are raised by the decoder 41. This causes the NWL1 to be raised to a high level through the AND circuit 42.1 to select the first normal cell 11.1. Simultaneously, the SWL1 is raised to a high level through the AND circuit 44.1 to select the second spare cell 22. At this time, when the input address is a normal address, the SPARE becomes equal to 0. Accordingly, the first sense amplifier 46.1 is activated, causing information of the first normal cell 11.1 to be read out through the first pair of data lines 31. On the other hand, when the input address given for accessing to the first normal cell 11.1, is a spare address, the SPARE becomes equal to 1. Accordingly, the second sense amplifier 46.2 is activated, so that information of the second spare cell 21 instead of the first normal cell 11.1 which is defective, is read out through the second pair of data lines 32. If the second normal cell 12.1 is defective, the first spare cell 21 is used as a substitute cell in a similar manner.

The arrangement in FIG. 15 is adapted such that, in order to read a spare cell at a high speed, one of the NGWL1, NGWL2, ... and the SGWL are simultaneously raised to high levels before it is judged whether or not the input address is a spare address. However, only one defective cell can be relieved for each cell array, resulting in low defect-relief rate. Japanese Patent Laid-Open Publication No. 2-21500 discloses an arrangement in which a plurality of defective cells in one cell array can relieved. According to this arrangement, the memory cells are divided into, for example, four blocks (first to fourth cell arrays). It is now supposed that each cell array has n-piece normal cells and three spare cells. By using three spare global word lines and four block selecting lines, there are utilized (i) one spare cell in each of the second to fourth cell arrays as a substitute cell for the first cell array, (ii) one spare cell in each of the third, fourth and first cell arrays as a substitute cell for the second cell array, (iii) one spare cell in each of the fourth, first and second cell arrays as a substitute cell for the third cell array, and (iv) one spare cell in each of the first to third cell arrays as a substitute cell for the fourth cell array. One sense amplifier is prepared for each cell array, and all the voltages of three spare global word lines are raised to high levels simultaneously with the voltage of one of n-piece normal global word lines, regardless of the input address which is a normal address or a spare address.

According to the conventional arrangement above-mentioned in which the defect relief rate is improved, even though the input address is a normal address, it is required that each time an input address is given, there are raised, to high levels, all the voltages of a plurality of spare global word lines in addition to one of the n-piece normal global word lines. This disadvantageously increases the current consumption.

Further, it is required to dispose a plurality of block selecting lines (four lines in the arrangement above-mentioned) in each cell array. This increases the wiring area, causing the chip area to be disadvantageously increased. With an increase in the number of cells which can be relieved in one cell array, the number of block selecting lines passing in each cell array, is increased. This further increases the chip area. Further, it is required to dispose one sense amplifier for each cell array. This also increases the chip area.

When the chip area is increased as a semiconductor memory is increased in capacity, this increases the wiring length of an output signal line for transmitting a redundancy judging signal between the spare address comparing circuit and the redundancy Judging switch. This causes the wiring capacitance to be increased, thus provoking a problem of signal delay. Likewise, other conventional semiconductor integrated circuit such as a microprocessor or the like, presents such a problem of signal delay due to wiring capacitance.

Next, a specific embodiment of the redundancy judging circuit in a conventional DRAM will be described with reference to FIGS. 28 to 31.

FIG. 28 shows the conventional redundancy judging circuit. In the drawing, each of redundant address comparing circuits 311.1 to 311.N of voltage conversion type receives an input address AY and individual redundant address comparing lines 314.1 to 314.N generate outputs C.1 to C.N, respectively. An overall redundant use detecting circuit 312 receives inputs C.1 to C.N and generates an output CO. The CO is a signal indicating whether or not a plurality of spare addresses include one that is identical with the input address AY, and is used for selecting normal cells and not selecting spare cells, or alternatively, for selecting the spare cells and not selecting the normal cells. Spare generating circuits 313.1 to 313.N of voltage conversion type receive inputs C.1 to C.N, respectively, and spare lines 315.1 to 315.N generate outputs SP.1 to SP.N, which are used for selecting one spare cell to be accessed.

There are two types of redundancy judgment: One is executed by the redundant address comparing circuits 311.1 to 311.N for judging whether or not the m-bit input address AY (AY1 to AYm, XAY1 to XAYm) is identical with the spare address programmed in fuses constituting, e.g., a ROM (Read Only Memory). By way of example, FIG. 29A shows the structure of the redundant address comparing circuit 311.N. The redundant address comparing circuit 311.N is composed of a dynamic NOR circuit consisting of N-channel MOSFETs Qa1 to Qam and Qb1 to Qbm, P-channel MOSFETs Qp1 and Qq1, fuses Fa1 to Fam and Fb1 to Fbm, a driver DR1, and like component. The result of judgment by each of the redundant address comparing circuits 311.1 to 311.N is outputted as H or L, depending on the logic level of the output voltage.

The other type of redundancy judgment is executed by the overall redundant use detecting circuit 312 for judging whether or not at least one of the N-piece redundant address comparing circuits 311.1 to 311.N has received the input address AY that is identical with the spare address. FIG. 29B shows the overall redundant use detecting circuit 312 which is composed of a dynamic NOR circuit consisting of N-channel MOSFETs QC1 to QCN, P-channel MOSFETs Qp2 and Qq2, a driver DR2, and like component. The result of judgment by the overall redundant use detecting circuit 312 is also outputted as H or L, depending on the logic level of the output voltage.

The operation of the foregoing redundancy judging circuit will roughly be described with reference to FIG. 30A. If there is a change in the input address AYn, XAYn, for example, an address transition detect signal ATD composed of a low-level pulse is applied to the Qp1, so that the potential of the output C.N of the redundant address comparing circuit 311.N, for example, is changed. The voltage change is then inputted to the overall redundant use detecting circuit 312 and similarly changes the potential of the CO. In this case, a delay in operation is generated over a time Td between the change of the AYn, XAYn and the change in potential of the CO. FIG. 30B shows the relationship between the operational delay time τd and the number of nodes C.1 to C.N. From the drawing, it will be appreciated that the increase of the Td is almost proportional to the increase of the N.

The C.1 to C.N are also inputted to the spare generating circuits 313.1 to 313.N, which are provided based on a one-by-one correspondence. The spare generating circuits 313.1 to 313.N are basically composed of such a circuit of drivers DR3 and DR4 connected in cascade as shown in FIG. 29C which shows, by way of example, the structure of the spare generating circuit 813.N.

FIG. 31 schematically shows the signal path in an IC chip. Memory cells on the chip are divided into a plurality of blocks. Each block comprises a memory array 330 in which the memory cells are disposed and a memory subarray 331 for controlling the access to the memory array 330. The signal path schematically shown in FIG. 31 indicates a typical on-chip arrangement of a redundant address comparing circuit 311 (representative of the N-piece redundant address comparing circuits 311.1 to 311.N), a spare generating circuit 313 (representative of the N-piece spare generating circuits 313.1 to 313.N), and the overall redundant use detecting circuit 312. It also indicates the process in which the memory cells in each block are accessed. The spare cells are selected by a combination of the output SP of the spare generating circuit 313 and a signal BLK, which is one of a plurality of block select signals.

As the capacity of a memory is increased, its signal path is also increased. For example, the signal path of a 64 M-bit DRAM exceeds 12 mm. The output SP of the spare generating circuit 313 disposed in the center of the chip, e.g., is transmitted along the signal line having a length of 12 mm so that, upon reaching the memory subarray 331, it is selected by a transfer gate control in response to the block select signal BLK, thereby eventually enabling an access to an objective memory cell.

Meanwhile, however, the output SP of the spare generating circuit 313 is significantly delayed due to the delay resulting from wiring, with the result that the operation of the spare line is also delayed and hence the access to the spare cells is delayed. The situation is the same with the output CO of the overall redundant use detecting circuit 312. If the generation of an inhibition signal or activation signal to a normal line is delayed, there arises either of the following problems: If the inhibition signal is delayed, both normal line, which is not inhibited only temporarily, and spare line may be selected simultaneously, resulting in a lower-speed reading operation. On the other hand, if the activation signal is delayed, the reading out of a memory cell may be delayed accordingly. Each problem is disadvantageous for providing a higher-speed reading operation.

The redundancy Judging circuit also has a factor of inhibiting a high-speed access to the memory cells. In the conventional embodiment, since the dynamic NOR circuit shown in FIG. 29A compares the input address with the spare address programmed in the fuse to judge whether or not the former address is identical with the latter, the floating capacitance of the node of the output C.N increases as more fuses are used in accordance with, e.g., the enhancement of the storage capacity. As a result, the operation of the dynamic NOR circuit becomes slower, as shown-in FIG. 30B. In other words, the time required for charging the node of the output C.N by means of the P-channel MOSFET Qp1 of FIG. 29A is disadvantageously increased. The situation is the same with the nodes of the other outputs C.1 to C.(N–1).

The output voltage of the dynamic NOR circuit, which constitutes the redundant address comparing circuit 311, is inputted to the other dynamic NOR circuit constituting the overall redundant use detecting circuit 312 shown in FIG. 29B. Consequently, if the generation of the output voltage of the redundant address comparing circuit 313 is delayed, the generation of the output CO of the overall redundant use detecting circuit 312 is delayed accordingly. Moreover, the time required for charging the node CO by means of the P-channel MOSFET Qp2 of FIG. 29B is also increased in the overall redundant use detecting circuit 312, similarly to the redundant address comparing circuit 311, resulting in the generation of a delay. Consequently, the generation of the inhibition signal to the normal line is delayed and both normal line and spare line are selected temporarily, thus disadvantageously reducing the speed of a reading operation.

If the degree of redundancy is raised, an improvement in production yield of the memory chips can be expected. However, the use of a redundant circuit incurs the increase of the chip size, while the number of chips obtained from one wafer is reduced. Therefore, it is impossible to mount an excessively large number of redundant circuits on a single chip. In view of the foregoing, a method of using a redundant circuit with higher efficiency has been devised in recent years (Kikukawa, et al., "Novel Flexible Redundancy Architecture for 64 Mb DRAM and Beyond", IEICE Digest of Technical Papers of Autumn Conference, vol. 5, p.152, 1992).

In a memory LSI of multi-bit configuration, in particular, the efficient use of a redundant circuit is strongly desired.

Below, an embodiment of the redundant circuit used in the conventional DRAM of multi-bit configuration will be described with reference to the drawings.

FIG. 41 is a schematic view of a 4-bit DRAM using the conventional redundant circuit. In the drawings are shown a memory cell array 1 for I/O0, a memory cell array 2 for I/O1, a memory cell array 3 for I/O2, a memory cell array 4 for I/O3, a redundant cell array 5 for I/O0, a redundant cell array 6 for I/O1, a redundant cell array 7 for I/O2, and a redundant cell array 8 for I/O3. There are also shown a column predecoder 11, a column address bus 12, a column predecode signal bus 13, column decoders 14 to 17, column decode signals 18 to 21, redundant fuse circuits 22 to 29 for column addresses, redundant signal lines 30 to 37, an intermediate amp 38 for I/O0, an intermediate amp 39 for I/O1, an intermediate amp 40 for I/O2, an intermediate amp 41 for I/O3, pairs of data lines 42 to 45 from the memory cell arrays to the intermediate amps in the I/O's, pairs of data lines 46 to 49 from the intermediate amps to the output circuits (not shown) in the I/O's, column switches 50 to 89, column switches 91 to 98 for the redundant cell arrays, redundant column decoders 191 to 194, and redundant column decode signals 195 to 198.

FIG. 42 is a schematic view of the contents of the memory cell arrays 1 to 4 in FIG. 41. FIG. 43 is a specific circuit diagram of the redundant fuse circuits 22 to 29 in FIG. 41. In FIG. 42 are shown word lines 101 to 105, a memory cell 106, sense amps 107 to 111, a pair of data lines 112 from the memory cell array to the intermediate amp, N-channel MOSFETs 113 to 122, bit lines 123 to 132, column decode signal lines 133 to 137, and column switches 138 to 142. In FIG. 43 are shown a redundant fuse precharge signal input terminal 150, a first power supply 151, P-channel MOSFETs 152 and 153, an inverter 154, a redundancy detect signal output terminal 155, address input terminals 156 to 161, N-channel MOSFETs 162 to 167, fuse elements 168 to 173, and an internal node 174.

Below, the operation of the conventional DRAM of multi-bit configuration thus constituted will be described. In FIG. 41, the memory cell arrays 1 to 4 are first activated so that data is read out of the memory cells to be amplified. In the individual I/O's, the amplified data is read out onto the pairs of data lines 42 to 45 via the column switches 50 to 89, further amplified by the intermediate amps 38 to 41, and then transferred to the output circuit along the pairs of data lines 46 to 49. At this stage, one out of the column switches 50 to 89 is selected in each I/O in response to one of the column decode signals 18 to 21 driven by the column decoders 14 to 17, respectively. The column switches are individually connected to the bit lines, as shown in FIG. 42, so that the data on the bit line of the selected column address is read out onto the pair of data lines. The selection with the column address is carried out by predecoding the column address inputted via the column address bus 12 in the predecode circuit 11 and transmitting its output signal to the column decoders 14 to 17 via the column predecode signal bus 13.

If the address inputted is under redundant relief, any of the redundant fuses 22 to 29 judges that the inputted address is a redundant address and outputs a redundant address detect signal to any of the redundant signal lines 30 to 37. If the redundant address detect signal is outputted onto the redundant signal line 30, e.g., it follows that the redundant address detect signal Is for I/O0. Consequently, the redundant column decoder 191 for I/O0 is operated so as to output the redundant column decode signal 195, thereby reading data out of the redundant cell array 5 onto the pair of data lines 42 via the redundant column switch 91 or 92. When the redundant address detect signal is outputted onto the redundant signal line 30, the operation of the column decoder 14 is stopped, and hence the reading of data out of the memory cell array 1 is also stopped, thereby preventing a misoperation resulting from the collision of data on the pair of data lines 42. Meanwhile, the I/O1 to I/O3 are normally operated. FIG. 44 is a timing chart showing the foregoing operation. The redundant fuses 22 to 29 are such circuits for judging redundant addresses as shown in FIG. 43, in which, of the address input terminals 156 to 161, each even-numbered terminal and its adjacent odd-numbered terminal form a pair to which complementary signals indicating the address are inputted. If the inputted address matches the address programmed in the fuse elements 168 to 173 (the state in which the fuses are disconnected and hence the electric charge of the node 174 is not removed by the ground), the output of the circuit generates "H", which will serve as the redundant address detect signal indicating the redundant address.

In general, as the bit width of a memory of multi-bit configuration is increased, the column address thereof is degenerated accordingly. Since the present conventional embodiment is of 4-bit configuration, the lower 2 bits of its column addresses are degenerated, compared with a chip of 1-bit configuration. The blocks divided in the degenerate lower 2 bits correspond to the I/O0 to I/O3, and the memory cell arrays are isolated corresponding to the 1/00 to 1/03. The memory thus constituted is not supplied with a signal for distinguishing the I/O0 to I/O3 from outside the chip, so that it becomes necessary to provide each I/O with the redundant cell array. As for the redundant fuse, it is desirable to individually perform redundant relief with respect to each I/O in order to improve the relief efficiency. For this purpose, however, the redundant fuse circuit must be disposed in each I/O as shown in FIG. 41, for the redundant fuse circuit only has the function of judging a redundant address.

In the conventional memory of multi-bit configuration shown in FIG. 41, therefore, the area occupied by the redundant circuits increases as the number of the I/O's increases, since it is necessary to provide each I/O with the redundant circuit, resulting in an increase in the chip size. Since the redundant circuit, especially redundant fuse circuit, requires a large area, an increase in number of the redundant circuits presents a serious problem. An increase in the chip area reduces the number of chips obtained from one wafer, resulting In the reduction of the production yield, which renders the provision of the redundant circuits ineffective.

In a memory LSI provided with a serial port, the lowering of the operating speed due to the use of the redundant circuits has become a problem, and a method of improving the situation has been devised (Miyauchi, et al., "4 Mb Field Memory", IEICE Digest of Technical Papers ICD90–112, pp. 45–49, 1990).

Below, an embodiment of the redundant circuit of a conventional memory being provided with a serial port will be described with reference to the drawings.

FIG. 60 is a schematic view of the conventional memory being provided with a serial port using the redundant circuits. In the drawing are shown a P/S circuit (parallel to serial converting circuit) 101 for a normal memory cell array, a P/S circuit 102 for a redundant memory cell array, a normal memory cell array 103, a redundant memory cell array 104, and a serial data bus 105.

Below, the operation of the conventional memory with a serial port thus constituted will be described. In FIG. 60, the memory cell array 103 is first activated so that data is read out of the memory cell to be amplified by the amplifier circuit. The amplified data is transferred to the P/S circuit 101, where the data is subjected to a P/S conversion, so as to be transferred to an output circuit via the serial data bus 105. If the selected address contains a failed memory cell, the redundant memory cell array 104 is activated, so that correct data is outputted from the P/S circuit for a redundant memory cell to the serial data bus 105.

FIG. 61 is a view diagrammatically showing the foregoing operation, in which are shown a redundant memory cell 901, a P/S circuit 902 for redundant data, a serial data bus 903, a P/S circuit 904 for normal memory cell array, a parallel data bus 905, and a normal memory cell 906. In the drawing, o and ● designate normal data and faulty data, respectively. In FIG. 61, it is assumed that the faulty data is read out into the P/S circuit 904 for a normal memory cell array via the parallel data bus 905 (the faulty data is the sixth one from left). The normal P/S circuit 904 performs a P/S conversion by sequentially reading data onto the serial data bus 903. However, since the sixth data from left is faulty, it is required to read correct data out of the P/S circuit for redundant data 902 to the serial data bus 903 exactly when the sixth data is supposed to be read out.

In the conventional memory thus constituted, the replacement by redundant data is performed on the serial data bus which transfers data at a high speed. However, the constitution is disadvantageous in that it cannot operate properly if serial output is to be implemented at a higher speed.

SUMMARY OF THE INVENTION

It is a first object of the present invention to provide a semiconductor memory having a redundant circuit which can not only achieve a high-speed reading of a memory cell and a high defect-relief rate, but also reduce the current consumption and the chip area.

it is a second object of the present invention to provide a semiconductor integrated circuit in which an influence of wiring capacitance is reduced to enable a signal to the transmitted at a high speed.

It is a third object of the present invention to provide a large-capacity semiconductor memory in which a redundancy judging circuit can be operated at a high speed.

It is a fourth object of the present invention to provide a semiconductor memory of multi-bit configuration having higher relief efficiency without increasing the number of redundant circuits disposed therein.

It is a fifth object of the present invention to provide a semiconductor memory having a serial port in which a redundant circuit can operate properly even when serial output is performed at a high speed.

To achieve the first object, the present invention is arranged such that (i) there are disposed, in each of adjacent two cell arrays, a plurality of spare cells for the counter cell array, (ii) two block selecting lines are disposed such that, when a normal cell in one of the cell arrays is selected, (iii) the selection of a normal cell and the selection of a spare cell are simultaneously executed, (iv) a spare cell is accessed only when the input address is a spare address, and (v) one amplifier is commonly used for both cell arrays.

To achieve the second object, the present invention is arranged such that (i) there is generated a difference between output impedances to two complementary-signal transmitting lines, (ii) there is generated and detected a difference in current between the two complementary-signal transmitting lines according to the output impedance difference, and (iii) the current difference thus detected is converted into a potential difference, based on which signal transmission in the semiconductor integrated circuit is achieved.

To achieve the third object, the present invention is arranged so that (1) the impedance of one of N-piece individual redundant address comparing lines is differentiated from the impedance of the other (N–1)-piece individual redundant address comparing lines and (ii) redundant information is transmitted by utilizing the difference in impedance.

To achieve the fourth object, the present invention is arranged so that, in time of redundancy judgment, the redundant fuse circuit generates a degenerate address, which was previously stored therein, so as to eliminate the necessity of providing the redundant circuit in each block in which the address is degenerate.

To achieve the fifth object, the present invention is arranged so that data from a failed cell is replaced by data from the redundant cell array in the parallel portion of a parallel to serial converting circuit, thereby performing redundant relief in a parallel data bus operable at a low speed, not in a serial data bus operable at a high speed, unlike a conventional memory having a serial port.

BRIEF DESCRIPTION OF THE DRAWINGS

FIG. 23 is a circuit diagram of an input impedance differential amplifier showing the internal structure of an overall redundant use detecting circuit in a redundancy detecting circuit of a DRAM serving as a semiconductor integrated circuit according to a seventh embodiment of the present invention;

FIG. 24 is an operational waveform chart of the input impedance differential amplifier in FIG. 23;

FIG. 35 is a table showing an example of the programs stored in the redundant fuse circuits in FIG. 33;

FIG. 38 is a table showing the efficiencies of various redundant circuits for comparison;

DETAILED DESCRIPTION OF THE INVENTION

The following description will discuss sixteen semiconductor integrated circuits according to embodiments of the present invention.

(First Embodiment)

Figure 1:
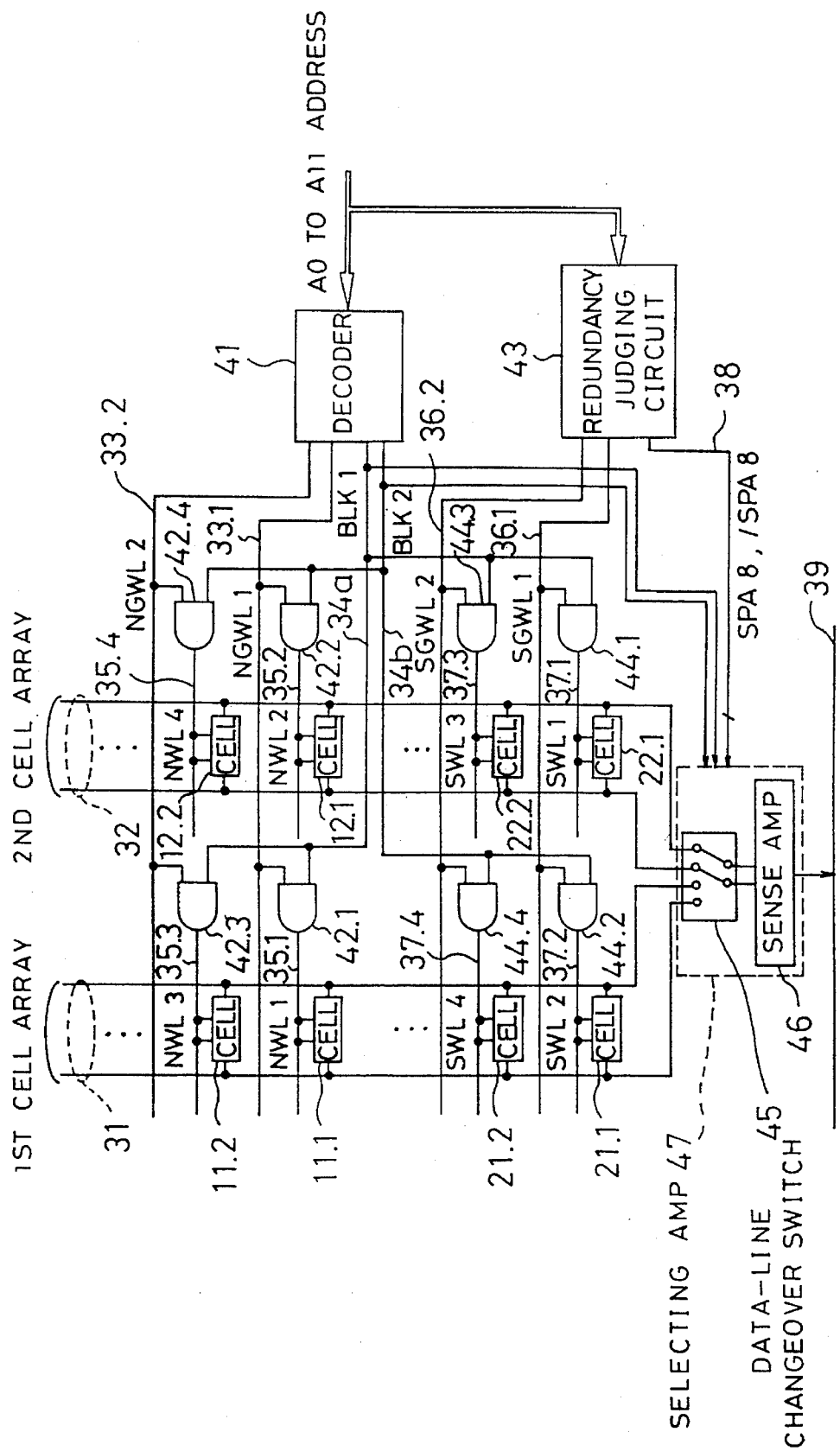
FIG. 1 is a circuit diagram illustrating the arrangement of a reading circuit portion in an SRAM serving as a semiconductor integrated circuit according to a first embodiment of the present invention.

FIG. 1 is a circuit diagram illustrating the arrangement of a reading circuit portion of an SRAM serving as a semiconductor integrated circuit according to a first embodiment of the present invention. In the arrangement shown in FIG. 1, it is premised that an address having 12 bits of A0 to A11 is entered, and that the memory cells are divided into 16 blocks. In FIG. 1, only two adjacent blocks are shown as first and second cell arrays, and other blocks are not shown. The relation between third and fourth cell arrays (not shown) is similar to the relation between the first and second cell arrays in FIG. 1. The foregoing is also applied to other cell arrays. Each of the memory cells is of the TFT Ype or high resistance type having a flip-flop.

In FIG. 1, the first cell array comprises n-piece (which is equal to 256) first normal cells 11.1, 11.2, . . . commonly connected to a first pair of data lines 31, and m-piece (which is not less than 2) first spare cells 21.1, 21.2, . . . . Likewise, a second cell array comprises n-piece second normal cells 12.1, 12.2, . . . commonly connected to a second pair of data lines 32, and m-piece second spare cells 22.1, 22.2, . . . . Normal word lines 35.1, 35.2, 35.3, 35.4 . . . are disposed for selecting one of 2n-piece normal cells 11.h, 12.h (h=1 to n). Spare word lines 37.1, 37.2, 37.3, 37.4, . . . are disposed for selecting one of 2m-piece spare cells 21.j, 22.3 (j=1 to m).

There is also disposed a decoder 41 for receiving an address having 12 bits of A0 to A11. Connected to the decoder 41 are (i) n-piece normal global word lines 33.1, 33.2, . . . the voltage of one of which is raised to a high level in response to an input address, adn 8ii) first and second block selecting lines 34a, 34b each for selecting a cell array. A redundancy judging circuit unit 43 is adapted to receive an address having 12 bits of A0 to A11. Connected to the redundancy judging circuit 43 are (i) m-piece spare global word lines 36.1, 36.2, . . . the voltage of one of which is raised to a high level only when the input address is a spare address, and (ii) a data-line changeover signal line 38.

In the following description, signals on the n-piece normal global word lines 33.1, 33.2, . . . are respectively designated as NGWL1, NGWL2, . . . signals on the 2n-piece normal word lines 35.1, 35.2, 35.3, 35.4, . . . are respectively designated as NWL1, NWL2, NWL3, NWL4, . . . , signals on the m-piece spare global word lines 36.1, 36.2, . . . are respectively designated as SGWL1, SGWL2, . . . signals on the 2m-piece spare word lines 37.1, 37.2, 37.3, 37.4, . . . are respectively designated as SWL1, SWL2, SWL3, SEL4, . . . and signals on the first and second block selecting lines 34a, 34b are respectively designated as BLK1, BLK2. The decoder 41 is adapted to supply, in addition to the BLK1 and BLK2, BLK3 to BLK16 for selecting the third to sixteenth cell arrays, but the BLK3 to the BLK16 are not shown in FIG. 1. One of these block selecting signals BLK1 to BLK16 is adapted to be asserted according to the result obtained by decoding, for example, the upper four bits A8 to A11 of an input address having 12 bits of A0 to A11. In particular, the first block selecting signal BLK1 becomes a high level when each of A8 to A11 is equal to 0, and the second block selecting signal BLK2 becomes a high level when only one bit A8 out of A8 to A11 is equal to 0. The lower eight bits A0 to A7 are decoded and become NGWL1, NGWL2, . . . . The dataline changeover signal line 38 comprises two complementary-signal transmitting lines. Signals SPA8, /SPA8 on the complementary-signal transmitting lines are generated by the redundancy judging circuit unit 43 based on the specific bit A8 out of the input address having 12 bits of A0 to A11.

2n-piece AND circuits 42.1, 42.2., 42.3, 42.4, . . . are disposed for raising one of NWLi (i=1 to 2 n) to a high level. Of these, n-piece AND circuits 42.1, 42.3, . . . corresponding to i which is an odd number, are adapted to select one of the n-piece first normal cells 11.1, 11.2, . . . in response to NGWLh (h=1 to n) and the BLK1, and n-piece AND circuits 42.2, 42.4, . . . corresponding to i which is an even number, are disposed for selecting one of the n-piece second normal cells 12.1, 12.2, . . . In response to the NGWLh (h=1 to n) and the BLK2. Likewise, 2m-piece AND circuits 44.1, 44.2, 44.3, 44.4, . . . are disposed for raising one of SWLK (k=1 to 2 m) to a high level. Of these, m-piece AND circuits 44.1, 44.3, . . . corresponding to k which is an odd number, are adapted to select one of the m-piece second spare cells 22.1, 22.2, . . . in response to SGWLj (j=1 to m) and the BLK1, and m-piece AND circuits 44.2, 44.4, . . . is adapted to select one of the m-piece first spare cells 21.1, 21.2, . . . in response to SGWLJ (j=1 to m) and the BLK2. More specifically, when the BLK1 becomes a high level or a logical value 1 (the BLK2 becomes a low level or a logical value 0) and information of one of the first normal cells 11.1, 11.2, . . . is read out onto the first pair of data lines 31, information of one of the second spare cells 22.1, 22.2, . . . is read out onto the second pair of data lines 32. When the BLK2 becomes equal to 1 (the BLK1 becomes equal to 0) and information of one of the second normal cells 12.1, 12.2, . . . is read out onto the second pair of data lines 32, information of one of the first spare cells 21.1, 21.2, . . . is read out onto the first pair of data lines 31.

There is disposed an output data line 39, to which information on the first pair of data lines 31 or information on the second pair of data lines 32 is supplied through a selecting amplifier 47. When the block selecting signal BLK1 or BLK2 is entered to the selecting amplifier 47 from the decoder 41, the changeover of the selecting amplifier 47 is controlled by the data-line changeover signals SPA8, /SPA8 from the redundancy judging circuit unit 43. As will be discussed in detail, the selecting amplifier 47 has a data-line changeover switch 45 and a single sense amplifier 46.

Figure 2:
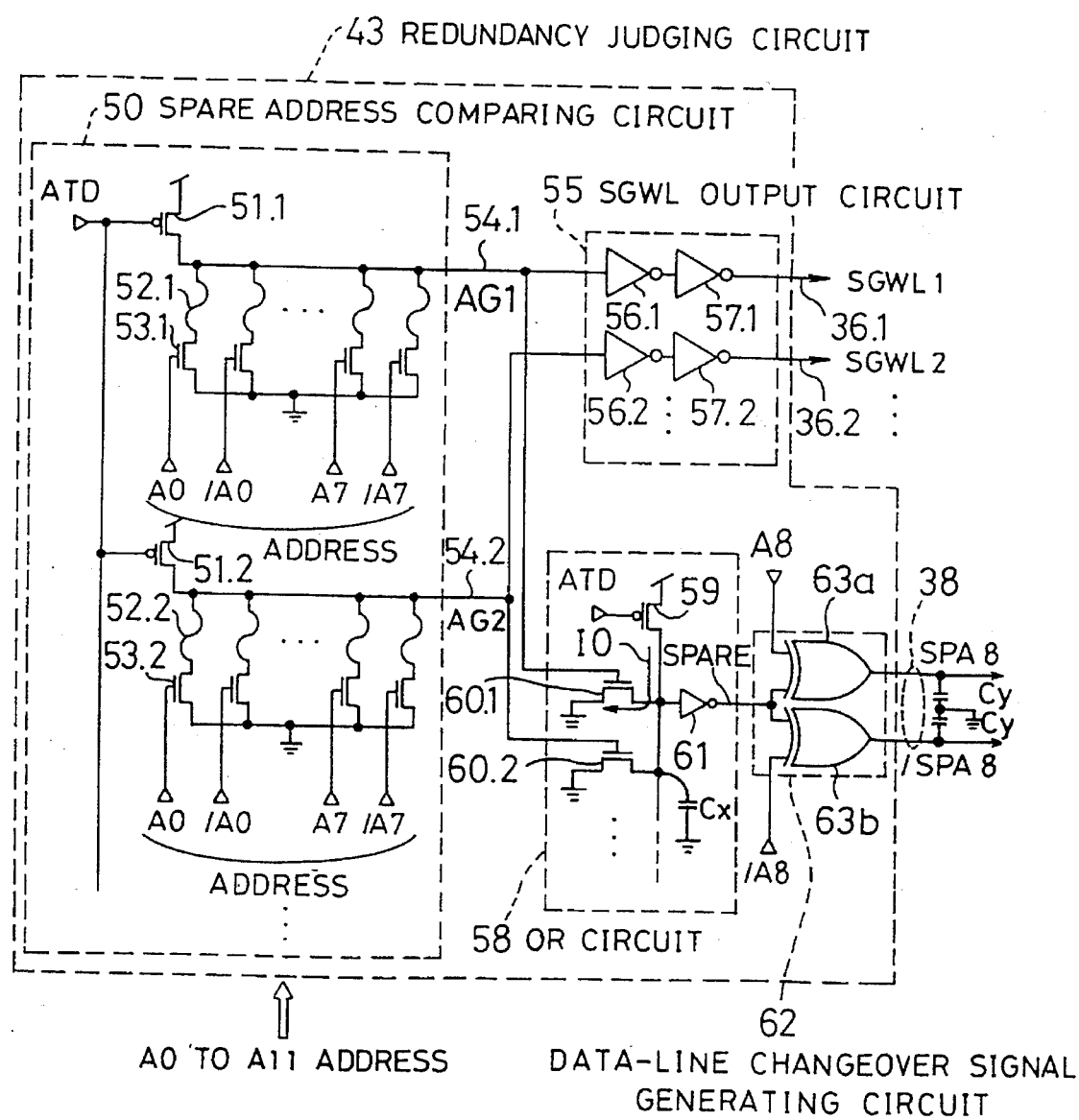
FIG. 2 is a circuit diagram illustrating the inside arrangement of the redundancy judging circuit unit in FIG. 1.

FIG. 2 is a circuit diagram illustrating the inside arrangement of the redundancy judging circuit unit 43. As shown in FIG. 2, the redundancy judging circuit unit 43 comprises a spare address comparing circuit 50, a spare global word line output circuit (SGWL output circuit) 55, an OR circuit 58 and a data-line changeover signal generating circuit 62.

The spare address comparing circuit 50 has (i) fuses 52.1, 52.2, . . . for programming maximum m-piece spare addresses, (ii) pull-up p-channel MOSFETs 51.1, 51.2, . . . , to the gates of which commonly supplied is an address transition detecting signal ATD which is changed to a low level pulse when the input address varies, and (iii) N-channel MOSFETs 53.1, 53.2, . . . of which one ends are grounded. The spare address comparing circuit 50 is adapted to compare a plurality of spare addresses programmed by the fuses 52.1, 52.2, . . . with the lower eight bits A0 to A7 of an input address having 12 bits of A0 to A11.

When the plurality of programmed spare addresses contain an address having the lower eight bits A0 to A7 identical with those of the input address, the voltage of a coincidence signal line concerned out of coincidence signal lines 54.1, 54.2, . . . is raised to a high level. Coincidence signals AG1. AG2, . . . on the coincidence signal lines 54.1, 54.2, . . . are supplied to the SGWL output circuit 55 and the OR circuit 58. When there is no identical address, i.e., when the input address is a normal address, all the coincidence signal lines 54.1, 54.2, . . . are maintained at low levels.

In the SGWL output circuit 55, the coincidence signal lines 54.1, 54.2, . . . are connected to input terminals of first inverters 56.1, 56.2, . . . , of which output terminals are connected to input terminals of second inverters 57.1, 57.2, . . . . The spare global word lines 36.1, 36.2, . . . are connected to output terminals of the second inverters 57.1, 57.2, . . . . Accordingly, only when a spare address is entered, one of the m-piece spare global word lines 36.1, 36.2, . . . is raised to a high level.

The OR circuit 58 has (i) a pull-up P-channel MOSFET 59, to the gate of which the address transition detecting signal ATD is supplied, (ii) m-piece N-channel MOSFETs 60.1, 60.2, . . . , to the gates of which the AG1, AG2, . . . are supplied, and (iii) and output inverters 61. For example, when the first coincidence signal AG1 becomes a high level, a feedthrough current IO flows from the power supply to the grounding line through the P-channel MOSFET 59 and the first N-channel MOSFET 60.1, and the voltage of the inverter 61 at the input point thereof becomes a low level. As a result, a high-level redundancy judging signal SPARE is supplied from the inverter 61. The foregoing is also applied when any other coincidence signal becomes a high level. More specifically, when one of the M-piece coincidence signals AG1, AG2, . . . from the spare address comparing circuit 50 is in a high level, the SPARE becomes a high level, and information that the input address having 12 bits of A0 to A11 is a spare address, is transmitted to the data-line changeover signal generating circuit 62.

The data-line changeover signal generating circuit 62 has first and second EXOR circuits 63a, 63b. Supplied to a first input terminal of the first EXOR circuit 63a is the least significant bit A8 of the upper four bits A8 to A11 for block selection, out of the 12 bits of A0 to A11 of the input address. The SPARE is supplied to a second input terminal from the OR circuit 58. On the other hand, an inversional signal/A8 or A8 is supplied to a first input terminal of the second EXOR circuit 63b, and the SPARE is supplied to a second input terminal thereof. The output SPA8 of the first EXOR circuit 63a and the output/SPA8 of the second EXOR circuit 63b are transmitted, as complementary signals on the data-line changeover signal line 38, to the selecting amplifier 47, of which inside arrangement will be discussed in the following.

Figure 3:
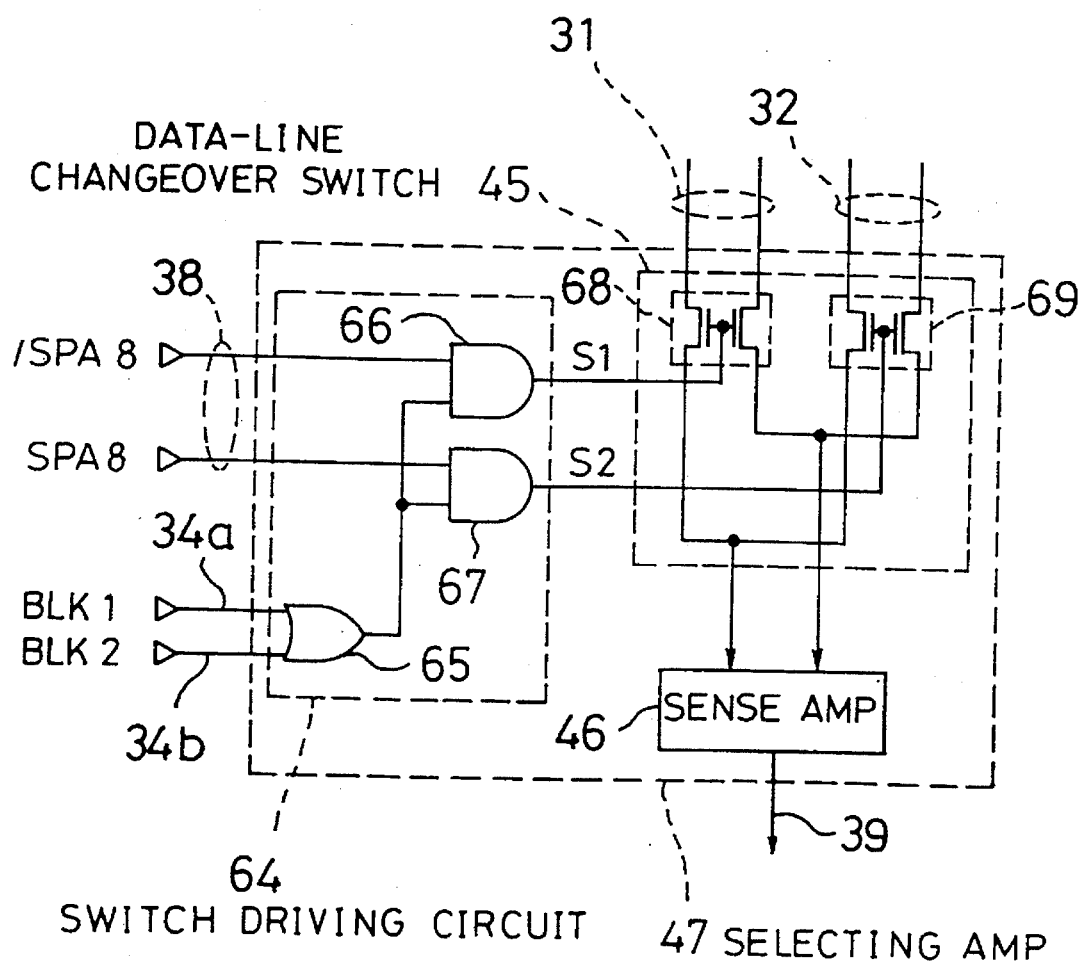
FIG. 3 is a circuit diagram illustrating the inside arrangement of the selecting amplifier in FIG. 1.

FIG. 3 is a circuit diagram illustrating the inside arrangement of the selecting amplifier 47. As shown in FIG. 3, the selecting amplifier 47 comprises (i) the data-line changeover switch 45 having two N-channel transfer gates 68, 69 for selectively supplying either one of information on the first pair of data lines 32, (ii) a switch driving circuit 64 for switching the selecting operation of the data-line changeover switch 45 according to the SPA8, /SPA8 supplied from the redundancy judging circuit unit 43, and (iii) the sense amplifier 46 for amplifying and supplying an output of the data-line changeover switch 45 to the output data line 39.

The switch driving circuit 64 has an OR circuit 65 for operating the logical sum of the BLK1 and the BLK2, and first and second AND circuits 66, 67. The first AND circuit 66 is adapted to supply, as a first selecting signal S1, a signal of logical product of the/SPA8 and an output of the OR circuit 65 such that the N-channel transfer gate 68 at the side of the first pair of data lines 31 is conducted. The second AND circuit 67 is adapted to supply, as a second selecting signal S2, a signal of logical product of the SPA8 and an output of the OR circuit 65 such that the N-channel transfer gate 69 at the side of the second pair of data lines 32 is conducted.

Figure 4:
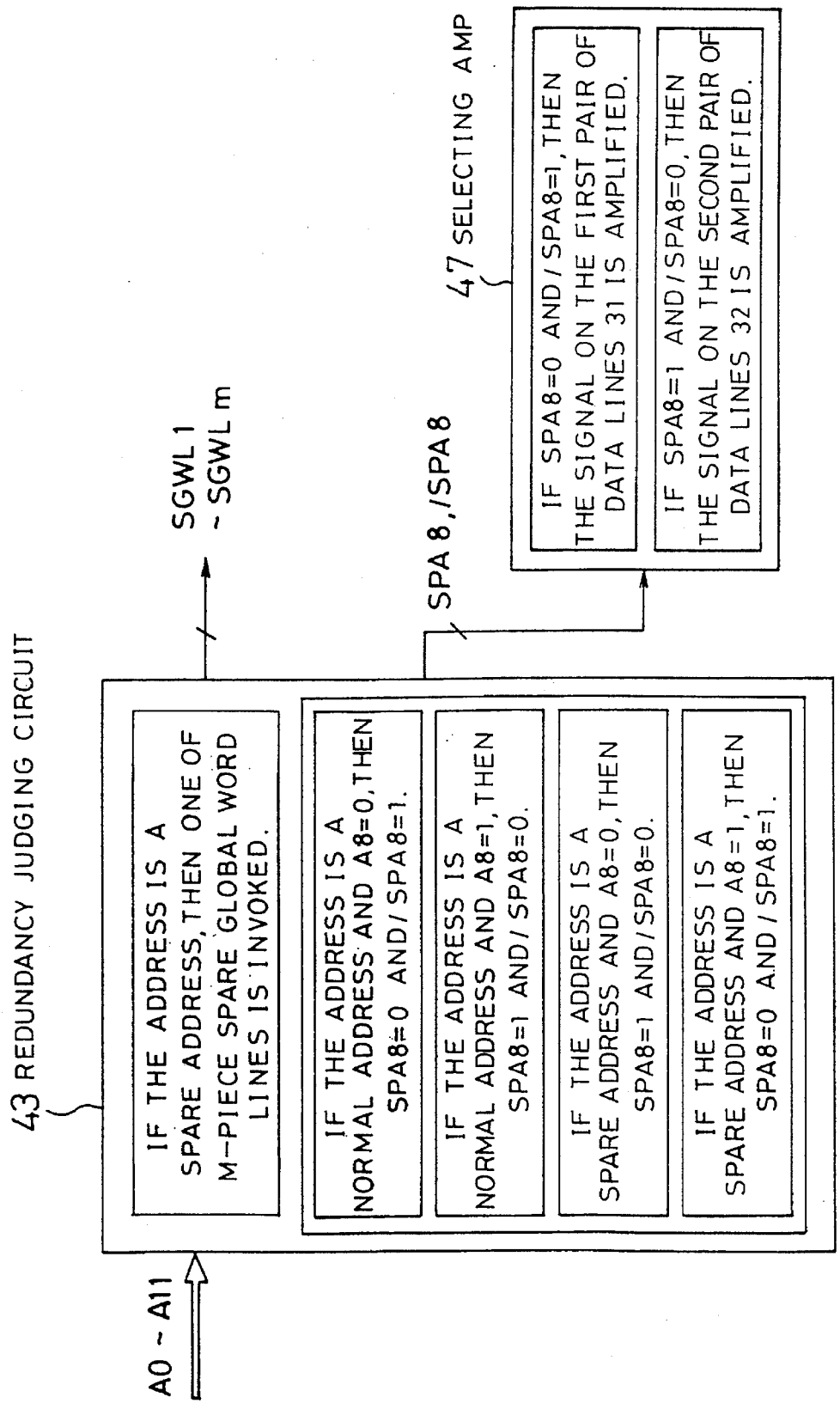
FIG. 4 is a conceptual view illustrating the functions of the redundancy judging circuit unit in FIG. 2 and the selecting amplifier in FIG. 3.

FIG. 4 shows the functions of the redundancy judging circuit unit 43 and the selecting amplifier 47 which have been discussed in the foregoing.

The redundancy judging circuit unit 43 has a function of raising, to a high level, one of the m-piece spare global word lines 36.1, 36.2, . . . only at the time when a spare address is entered. Further, the redundancy judging circuit unit 43 has a function that the SPA8 is made equal to 0 (low level) and the/SPA8 is made equal to 1 (high level) by the operations of the two EXOR circuits 63a, 63b when the input address is a normal address (SPARE=0) and the A8 is equal to 0 (/A8 is equal to 1). The SPA8 is made equal to 1 and the /SPA8 is made equal to 0 when the input address is a normal address (SPARE=0) and the A8 is equal to 1 (/A8=0), the SPA8 is made equal to 1 and the/SPA8 is made equal to 0 when the input address is a spare address (SPARE=1) and the A8 is equal to 0 (/A8=1), and the SPA8 is made equal to 0 and the/SPA8 is made equal to 1 when the input address is a spare address (SPARE=1) and the A8 is equal to 1 (/A8=0). On the other hand, the selecting amplifier 47 has a function of amplifying information on the first pair of data lines 31 when the SPA8 is equal to 0 and the /SPA8 is equal to 1, and of amplifying information on the second pair of data lines 32 when the SPA8 is equal to 1 and the/SPA8 is equal to 0.

Figure 5:
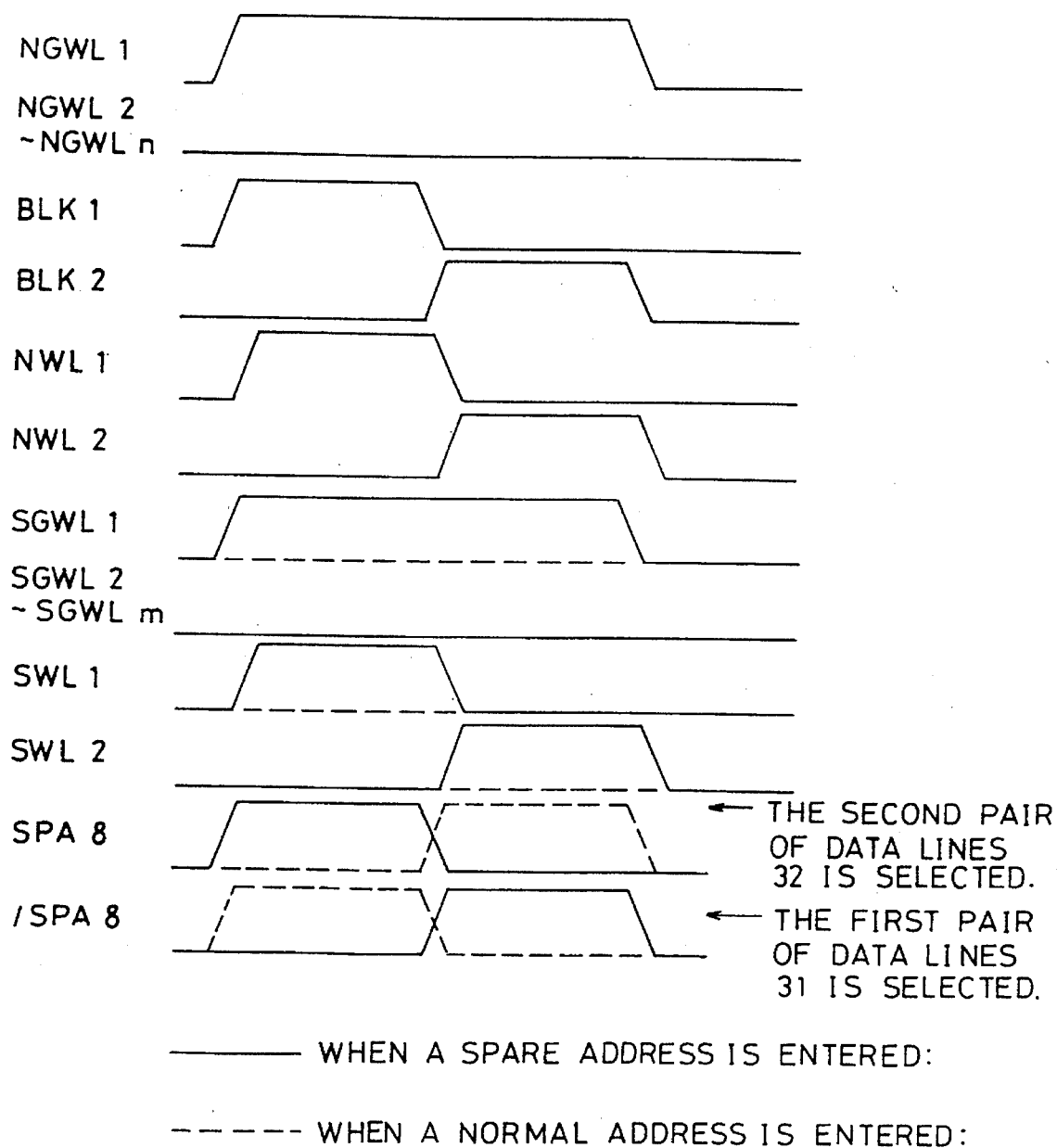
FIG. 5 is a diagram of operational waveforms of the SRAM reading circuit portion in FIG. 1.

According to the arrangement above-mentioned, information of one of the first and second normal cells 11.h, 12.h (h=1 to n) is read out onto the output data line 39 when a normal address is entered, and information of one of the first and second spare cells 21.j, 22.j (j=1 to m) is read out onto the output data line 39 when a spare address is entered. This is illustrated in FIG. 5, which shows an example where the second normal cell 12.1 selected by the NWL2 is accessed subsequently to the access to the first normal cell 11.1 selected by the NWL1.

First, the following description will discuss a case where a normal address is entered. The NGWL1 and the BLK1 are raised by the decoder 41. This causes the NWL1 to be raised to a high level through the AND circuit 42.a to select the first normal cell 11.1. On the other hand, since the redundancy judging circuit unit 43 maintains all the SGWL1, SGWL", . . . to low levels, all the SWK1, SWK2, . . . are in low levels. Further, since the redundancy judging circuit unit 43 causes the SPA8 and the/SPA8 to be made equal to 0 and 1, respectively, the selecting amplifier 47 is switched to the side of the first pair of data lines 31. As a result, information read out from the first normal cell 11.1 onto the first pair of data lines 31, is amplified and supplied to the output data line 39. By the decoder 41, the BLK2 is raised instead of the BLK1. This causes the NWL2 to be raised to a high level through the AND circuit 42.2 to select the second normal cell 12.1. On the other hand, since the redundancy judging circuit unit 43 maintains all the SGWL1, SGWL2, . . . to low levels, all the SWL1, SWL2, . . . are in low levels. Further, since the redundancy judging circuit unit 43 causes the SPA8 and the /SPA8 to be made equal to 1 and 0, respectively, the selecting amplifier 47 is switched to the side of the second pair of data lines 32. As a result, information read out from the second normal cell 12.1 onto the second pair of data lines 32, is amplified and supplied to the output data line 39.

The following description will discuss a case where a spare address is entered. The NGWL1 and the BLK1 are raised by a decoder 41. This causes the NWL1 to be raised to select the first normal cell 11.1. Simultaneously, the redundancy judging circuit unit 43 detects that the input address is a spare address, and causes the SGWL1 to be raised. This causes the SWL1 to be raised to a high level through the AND circuit 44.1 to select the second spare cell 22.1. Further, since the redundancy judging circuit unit 43 causes the SPA8 and the/SPA8 to be made equal to 1 and 0, respectively, the selecting amplifier 47 is switched to the side of the second pair of data lines 32. As a result, information read out onto the second pair of data lines 32 from the second spare cell 22.1 instead of the first normal cell 11.1 which is defective, is amplified and supplied to the output data line 39. If the second normal cell 12.1 is defective, information read out onto the first pair of data lines 31 from the first spare cell 21.1, is supplied to the output data line 39.

As discussed in the foregoing, according to this embodiment, while the decoder 41 decodes the input address A0 to A11 in order to select one of the 2n-piece normal cells 11.h, 12.h (h=1 to n), the redundancy judging circuit unit 43 simultaneously Judges whether the input address is a spare address or a normal address, and determines which spare cell is to be used as a substitute cell. This enables a spare cell to be read out at a high speed equivalent to a speed at which a normal cell is read. Further, disposed in the second cell array adjacent to the first cell array are the m-piece second spare cells 22.1, 22.2, . . . as substitute cells of the n-piece first normal cells 11.1, 11.2, . . . in the first cell array. Also disposed in the first cell array adjacent to the second cell array are the m-piece first spare cells 21.1, 21.2, . . . as substitute cells of the n-piece second normal cells 12.1, 12.2, . . . in the second cell array. This assures a high defect-relief rate, yet reducing the number of the block selecting lines disposed in each cell array to at most two (34a, 34b). Unlike in a conventional arrangement, the chip area can be reduced without a great number of block selecting lines required to be disposed in each cell array in order to enhance the defect relief rate.

Further, the redundancy Judging circuit unit 43 is arranged to supply one of the SGWL1, SGWL2, . . . only at the time when a spare address is entered. This reduces the current consumption at the time when a normal address is entered. Unlike in a conventional arrangement in which one sense amplifier is disposed for each cell array, one selecting amplifier 47 is disposed per two cell arrays. This reduces the number of the required sense amplifiers 46, so that the chip area can be further reduced.

In this embodiment, an input address has 12 bits, of which four bits are used for block selection. However, it is a matter of course that the present invention is not limited to such an arrangement.

To relieve a great number of defective cells for enhancing the yield with a tendency to increase a semiconductor memory in capacity, it is required to increase the number of inputs of the coincidence signals AG1, AG2, . . . in the OR circuit 58 shown in FIG. 2. In this connection, when the number of the N-channel MOSFETs 60.1, 60.2 . . . is increased, this disadvantageously increases the parasitism capacitance Cx adjunct to the input point of the inverter 61. Further, when the chip area is increased with the tendency to increase a semiconductor memory in capacity, the wiring length of the data-line changeover signal line 38 between the redundancy judging circuit unit 43 and the selecting amplifier 47, is increased. This results in an increase in wiring capacitance Cy (See FIG. 2), thus provoking a problem of signal delay. Second and third embodiments of the present invention to be discussed in the following, include means of solving the problem above-mentioned.

(Second Embodiment)

An SRAM serving as a semiconductor integrated circuit according to a second embodiment of the present invention, is adapted such that the transmission of the data-line changeover signals SPA8,/SPA8 from the redundancy judging circuit unit 43 to the selecting amplifier 47 in the first embodiment, is achieved based on a difference in electric current. The second embodiment employs a circuit arrangement shown in FIG. 6 as a modification of the data-line changeover signal generating circuit 62 in FIG. 2, and a circuit arrangement shown in FIG. 7 as a modification of the switch driving circuit 64 in FIG. 3. Other portions of the second embodiment are similar to the first embodiment and will not be discussed in the following.

Figure 6:
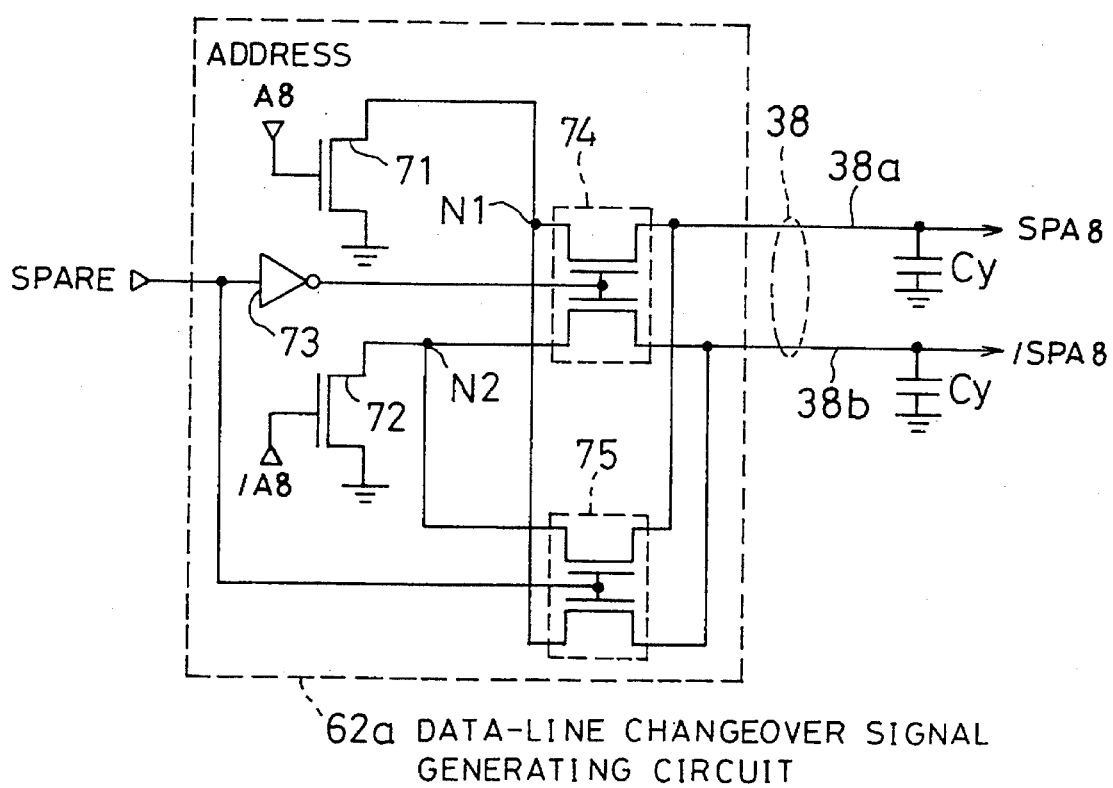
FIG. 6 is a circuit diagram illustrating the inside arrangement of a data-line changeover signal generating circuit in a redundancy judging circuit unit of an SRAM serving as a semiconductor integrated circuit according to a second embodiment of the present invention.

As shown in FIG. 6, a data-line changeover signal generating circuit 64a in the second embodiment has first and second N-channel MOSFETs 71, 72, an inverter 73 and first and second N-channel transfer gates 74, 75. The first and second N-channel MOSFETs 71, 72 have (i) gates to which A8, /A8 are respectively given, (ii) sources respectively connected to nodes N1, N2, and (iii) drains which are grounded. The redundancy judging signal SPARE supplied from the OR circuit 58, is supplied to the gate terminal of the first N-channel transfer gate 74 through the inverter 73, and also supplied directly to the gate terminal of the second N-channel transfer gate 75. In the first N-channel transfer gate 74, the nodes N1 and N2 are respectively connected to a first signal transmitting line 38a and a second signal transmitting line 38b of the data-line changeover signal line 38. On the contrary, the second N-channel transfer gate 75 is arranged such that the nodes N2 and N1 are respectively connected to the first signal transmitting line 38a and the second signal transmitting line 38b of the data-line changeover signal line 38.

Figure 7:
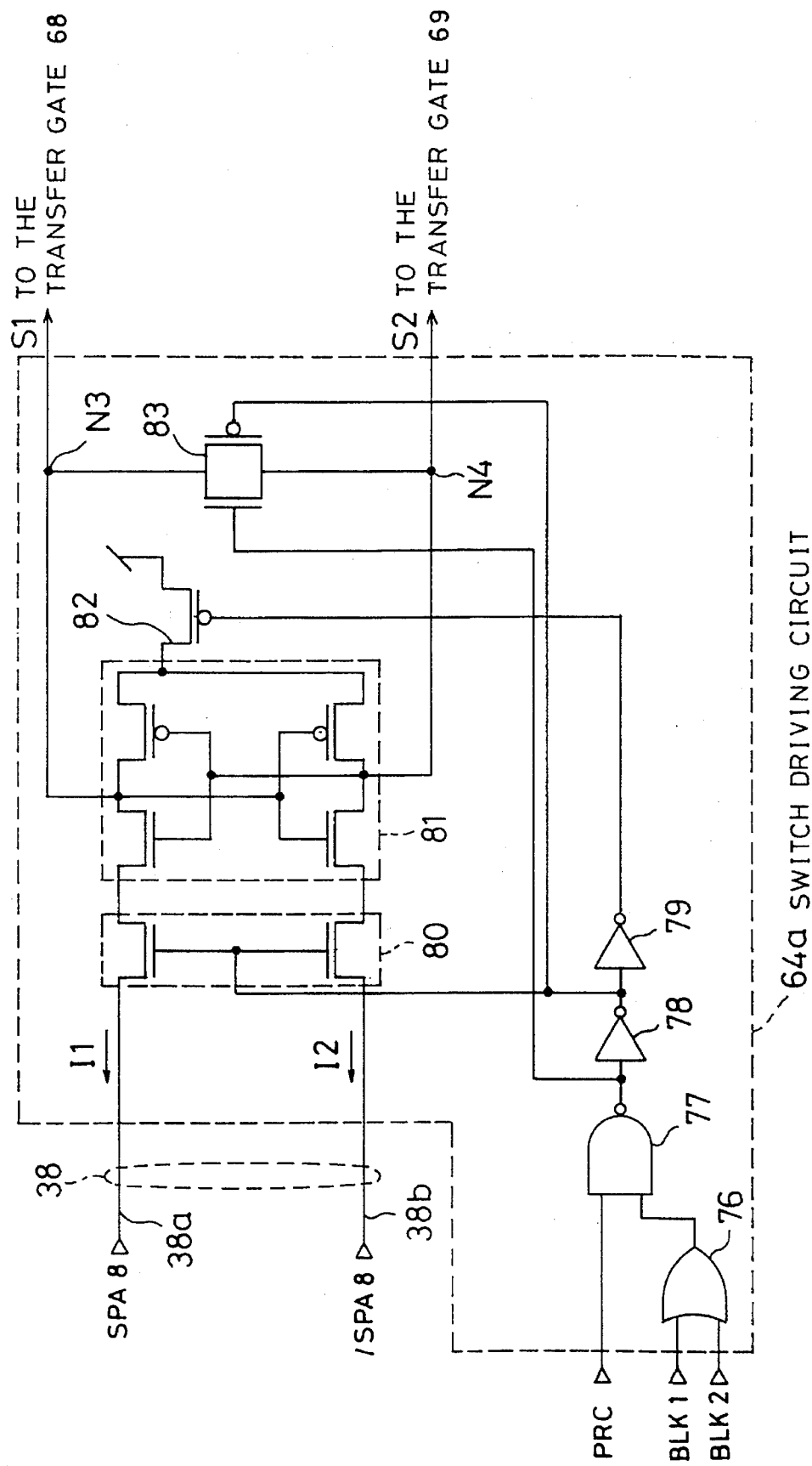
FIG. 7 is a circuit diagram illustrating the inside arrangement of the switch driving circuit in the selecting amplifier of the SRAM serving as a semiconductor integrated circuit according to the second embodiment of the present invention.

As shown in FIG. 7, a switch driving circuit 62a in the second embodiment comprises: an OR circuit 76; a NAND circuit 77; two inverters 78, 79; and N-channel transfer gate 80 connected to the data-line changeover signal line 38; a current-detection-type amplifier 81 having two sets of P-channel MOSFETs and N-channel MOSFETs; a pull-up P-channel MOSFET 82; and an equalizer 83 for short-circuiting output nodes N3 and N4 of the current-detection-type amplifier 81. The OR circuit 76 is adapted to supply, to the NAND circuit 77, a signal of logical sum of first and second block selecting signals BLK1, BLK2. The NAND circuit 77 is adapted to operate a logical product of an output of the OR circuit 76 and an amplifier activating signal PRC generated at the time when the input address varies, likewise the address transition detecting signal ATD. While the output of the NAND circuit 77 is in a high level, the N-channel transfer gate 80 and the P-channel MOSFET 82 are turned off and the equalizer 83 is conducted to maintain the N3 and the N4 at the same potential. When the output of the NAND circuit 77 becomes a low level, the equalizer 83 is turned off and both the N-channel transfer gate 80 and the P-channel MOSFET 82 are conducted. As a result, a power supply voltage Vcc is applied to the current-detection-type amplifier 81, and two input terminals of the current-detection-type amplifier 81 are respectively connected to the first and second signal transmitting lines 38a, 38b through the N-channel transfer gate 80.

In the data-line changeover signal generating circuit 62a (FIG. 6), if for example A8 is equal to 0 (/A8 is equal to 1) at the time when a normal address is entered (SPARE=0), the second N-channel MOSFET 72 and the first N-channel transfer gate 74 are conducted. This causes the first signal transmitting line 38a to become in a floating state (in a high-impedance state), and the second signal transmitting line 38b to be grounded through the second N-channel MOSFET 72. That is, a difference in impedance is generated between the signal transmitting lines 38a, 38b. Based on such impedance difference, there is supplied a small current I2 (I1=0) only to the second signal transmitting line 38b from the current-detection-type amplifier 81 in the switch driving circuit 64a (FIG. 7) in which the N-channel transfer gate 80 and the P-channel MOSFET 82 are conducted. It means that data-line changeover signals SPA8=0 (the first signal transmitting line 38a) and /SPA8=1 (the second signal transmitting line 38b) are transmitted based on a current difference (I2 is greater than I1). As a result, the potential of one output node N3 of the current-detection-type amplifier 81 is increased and immediately becomes a high level, and the potential of the other output node N4 is dropped and immediately becomes a low level. More specifically, according to the difference in impedance between the first and second signal transmitting lines 38a, 38b, the current-detection-type amplifier 81 generates, between both signal transmitting lines 38a, 38b, a difference in current, which is then detected and converted into a difference in potential. When the potential of the node N3, i.e., the first selecting signal S1, becomes a high level in the manner above-mentioned, the N-channel transfer gate 68 at the side of the first pair of data lines 31 in FIG. 3 is conducted. Accordingly, information read out from, for example, the first normal cell 11.1 onto the first pair of data lines 31, is supplied to the output data line 39, likewise in the first embodiment.

When a normal address in which A8 is equal to 1 (/A8 is equal to 0) is entered, the first N-channel MOSFET 71 and the second N-channel transfer gate 75 are conducted in the data-line changeover signal generating circuit 62a (FIG. 6). Accordingly, the first signal transmitting line 38a is grounded through the first N-channel MOSFET 71, and the second signal transmitting line 38b becomes in a floating state (a high impedance state). Based on such impedance difference, a small current I1 (I2=0) is supplied, this time, only to the first signal transmitting line 38a from the current-detection-type amplifier 81 in the switch driving circuit 64a (FIG. 7). It means that data-line changeover signals SPA8=1 (the first signal transmitting line 38a) and SPA8=0 (the second signal transmitting line 38b) are transmitted based on a current difference (I1 is greater than I2). As a result, the potential of the node N3 of the currentdetection-type amplifier 81 becomes a low level, and the potential of the node N4 becomes a high level. When the potential of the node N4, i.e., the second selecting signal S2, becomes a high level in the manner above-mentioned, the N-channel transfer gate 69 at the side of the second pair of data lines 32 in FIG. 3 is conducted. Accordingly, information read out from, for example, the second normal cell 12.1 onto the second pair of data lines 32, is supplied to the output data line 39, likewise in the first embodiment.

When a spare address is entered, the selection of the first and second N-channel transfer gates 74, 75 in the data-line changeover signal generating circuit 62a (FIG. 6) is reverse to that to be made when a normal address is entered. Accordingly, the selecting operation of the selecting amplifier 47 is also inverted.

As discussed in the foregoing, according to the second embodiment, the data-line changeover signals SPA8, /SPA8 are transmitted, based on a difference in current, from the redundancy judging circuit unit 43 to the selecting amplifier 47. Accordingly, even though the wiring length of the data-line changeover signal line 38 is lengthened to increase the wiring capacitance Cy, a signal delay is relaxed as compared with the case where the transmission of the signals above-mentioned is achieved based on a difference in voltage. Further, the current I1 or I2 supplied from the current-detection-type amplifier 81 to the data-line changeover signal line 38 disappears in a short period of time, enabling the current consumption to be lowered.

In the second embodiment, two N-channel MOSFETs 71, 72 are used for generating a difference in output impedance between the two signal transmitting lines 38a, 38b in the data-line changeover signal generating circuit 62a (FIG. 6). However, there may be used any elements as far as their resistance values up to the grounding line vary by a control signal. Further, there is used, in the switch driving circuit 64a (FIG. 7), the current-detection-type amplifier 81 of the cross couple type formed by two pair of P-channel MOSFETs and N-channel MOSFETs. However, any other arrangement may be used as far as a current difference can be detected and converted into a potential difference.

(Third Embodiment)

Figure 8:
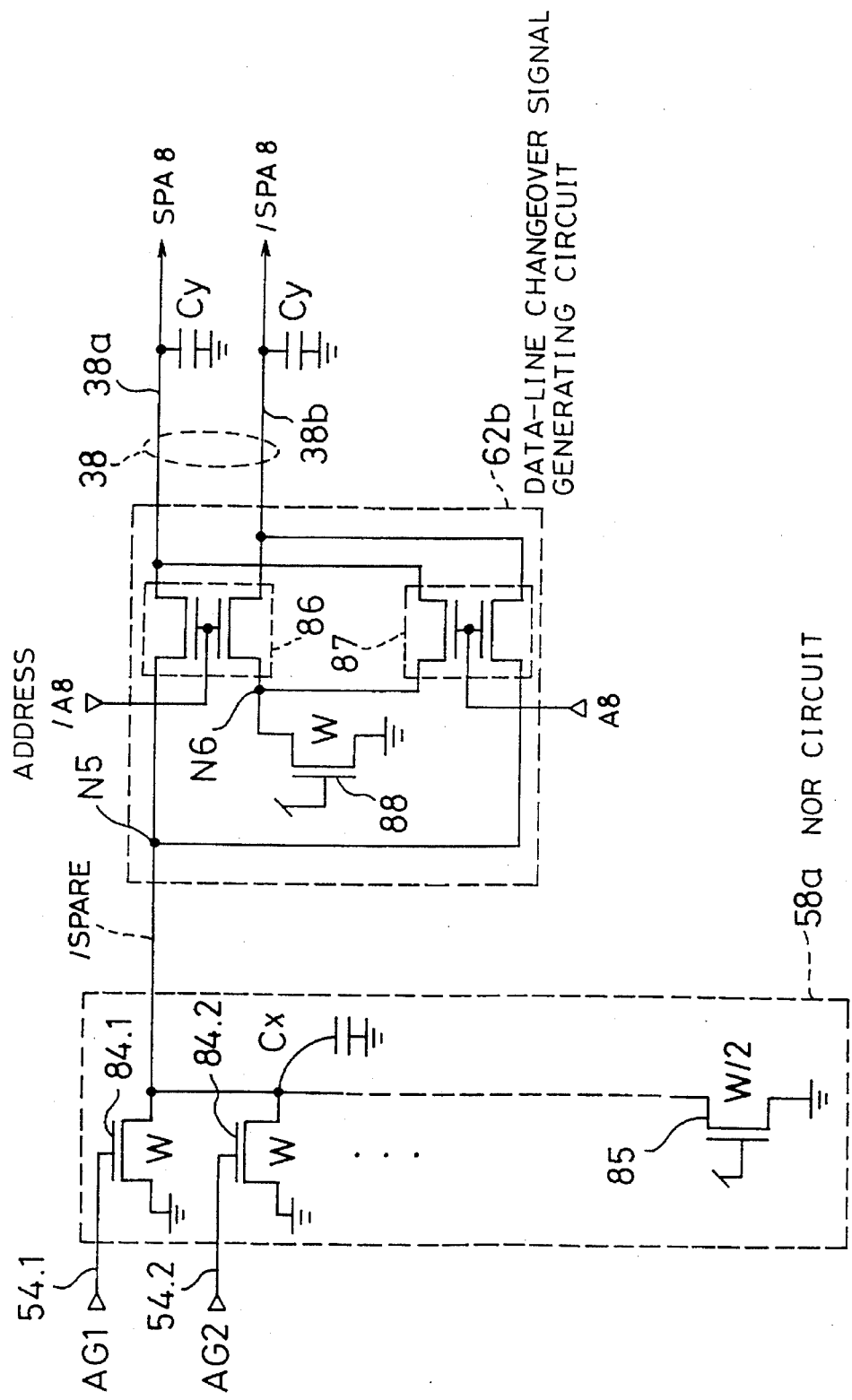
FIG. 8 is a circuit diagram illustrating the inside arrangements of a logical sum circuit and a data-line changeover signal generating circuit in a redundancy judging circuit unit of an SRAM serving as a semiconductor integrated circuit according to a third embodiment of the present invention.

An SRAM serving as a semiconductor integrated circuit according to a third embodiment of the present invention, employs a circuit arrangement shown in FIG. 8 as a modification of the circuit arrangement including the OR circuit 58 and the data-line changeover signal generating circuit 62 in FIG. 2. The third embodiment is the same as the second embodiment in that the circuit arrangement shown in FIG. 7 is used as a modification of the switch driving circuit 64 in FIG. 3. In the third embodiment, other portions are similar to the first embodiment.

As shown in FIG. 8, an NOR circuit 58a is used in the third embodiment instead of the OR circuit 58 in the redundancy judging circuit unit 43 (FIG. 2), and has (i) m-piece N-channel MOSFETs 84.1, 84.2, . . . to the gates of which AG1, AG2, . . . are given from the spare address comparing circuit 50 through the coincidence signal lines 54.1, 54.2, . . . , and (ii) an N-channel MOSFET 85 for impedance adjustment. Each of the m-piece N-channel MOSFETs 84.1, 84.2, . . . serving as input MOSFETs, has a gate width W, while the impedance adjusting N-channel MOSFET 85 has a gate width W/2. Further, a power supply voltage Vcc is always applied to the gate of the impedance adjusting N-channel MOSFET 85. These (m+1)-piece N-channel MOSFETs 84.1, 84.2, . . . , and 85 are commonly connected to one node NS. That is, the node N5 is always grounded through the impedance adjusting N-channel MOSFET 85 having the gate width W/2.

A data-line changeover signal generating circuit 62b for receiving a redundancy judging signal/SPARE from the NOR circuit 58a, has first and second N-channel transfer gates 86, 87, and an impedance adjusting N-channel MOSFET 88. The impedance adjusting N-channel MOSFET 88 has a gate width W which is equal to that of each of the m-piece N-channel MOSFETs 84.1, 84.2, . . . in the NOR circuit 58a. Further, the power supply voltage Vcc is always applied to the gate of the impedance adjusting N-channel MOSFET 88. On the other hand, A8 and A8 are given to the gate terminals of the first and second N-channel transfer gates 86, 87, respectively. In the first N-channel transfer gate 86, the node NS is connected to the first signal transmitting line 38a of the data-line changeover signal line 38, and a node N6 to which the impedance adjusting N-channel MOSFET 88 is connected, is connected to the second signal transmitting line 38b. In the second N-channel transfer gate 87, the node N6 is connected to the first signal transmitting line 88a, and the node N5 is connected to the second signal transmitting line 38b. The node N6 is always grounded through the impedance adjusting N-channel MOSFET 88 having the gate width W.

First, the following description will discuss the operation at the time when a normal address is entered. When a normal address is entered, all the AG1, AG2, . . . are in low levels. Accordingly, the m-piece N-channel MOSFETs 84,1, 84.2, . . . serving as input MOSFETs in the NOR circuit 58a, are turned off. Accordingly, the node N5 is grounded only through the impedance adjusting N-channel MOSFET 85 having the gate width W/2 in the NOR circuit 58a. For example, when A8 is equal to 0 (/AS is equal to 1) in the state above-mentioned, the first N-channel transfer gate 86 is conducted. This causes the first signal transmitting line 38a to be grounded through the MOSFET 85 having the gate width W/2, and the second signal transmitting line 38b to be grounded through the MOSFET 88 having the gate width W, thus generating a difference in impedance between both signal transmitting lines 38a, 38b. Based on the impedance difference, there is generated a current difference (I2 is greater than I1) between the first and second signal transmitting lines 38a, 38b by the operation of the current-detection-type amplifier 81 in the switch driving circuit 64a (FIG. 7) likewise in the second embodiment. It means that, based on the current difference, data-line changeover signals SPA8=0 (the first signal transmitting line 38a ) and /SPA8=1 (the second signal transmitting line 38b) are transmitted. As a result, the N-channel transfer gate 68 at the side of the first pair of data lines 31 in FIG. 3 is conducted. Accordingly, information read out from, for example, the first normal cell 11.1 onto the first pair of data lines 31, is supplied to the output data line 39. When a normal address having A8 equal to 1 (/A8=0) is entered, the second N-channel transfer gate 87 is conducted instead of the first N-channel transfer gate 86. Accordingly, the selecting operation of the selecting amplifier 47 is inverted.

The following description will discuss the operation at the time when a spare address is entered. When a spare address is entered, one of the AG1, AG2, . . . becomes a high level. Accordingly, one of the m-piece N-channel MOSFETs 84.1, 84.2, . . . as Input MOSFETs In the NOR circuit 58a is conducted. For example, when it is now supposed that the first N-channel MOSFET 84.1 is conducted in response to the AG1, the node NS is grounded through the first N-channel MOSFET 84.1 and the impedance adjusting N-channel MOSFET 85 which are connected in parallel with each other. In the state above-mentioned, when for example A8 is equal to 0 (/A8 is equal to 1), the first N-channel transfer gate 86 is conducted. Accordingly, the first signal transmitting line 38a is grounded through the MOSFET 84.1 having the gate width W and the MOSFET 85 having the gate width W/2 which are connected in parallel with each other, and the second signal transmitting line 38b is grounded through the MOSFET 88 having the gate width W. This produces a difference in impedance between both signal transmitting lines 38a, 38b. The size relation between the impedances is reverse to that obtained at the time when a normal address is entered. Accordingly, generated between the first and second signal transmitting lines 38a, 38b is a current difference (I1 is greater than I2) which is reverse to the current difference generated at the time when a normal address is entered. Thus, information read out from, for example, the second spare cell 22.1 onto the second pair of data lines 32, is supplied to the output data line 39 by the selecting amplifier 47. Likewise, information read out from, for example, the first spare cell 21.1 onto the first pair of data lines 31, is supplied to the output data line 39 by the selecting amplifier 47 when a spare address having A8 equal to 1 (/A8=0) is entered.

Figure 9:
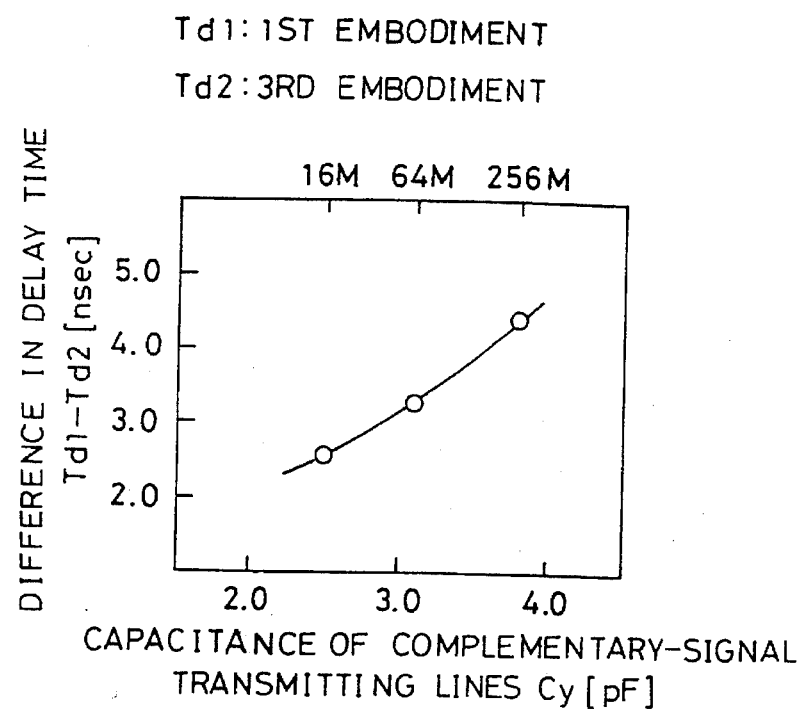
FIG. 9 is a view illustrating the effect of improvement in delay of a data-line changeover signal in the third embodiment of the present invention, such effect being shown in terms of the relation with wiring capacitance Cy.
Figure 10:
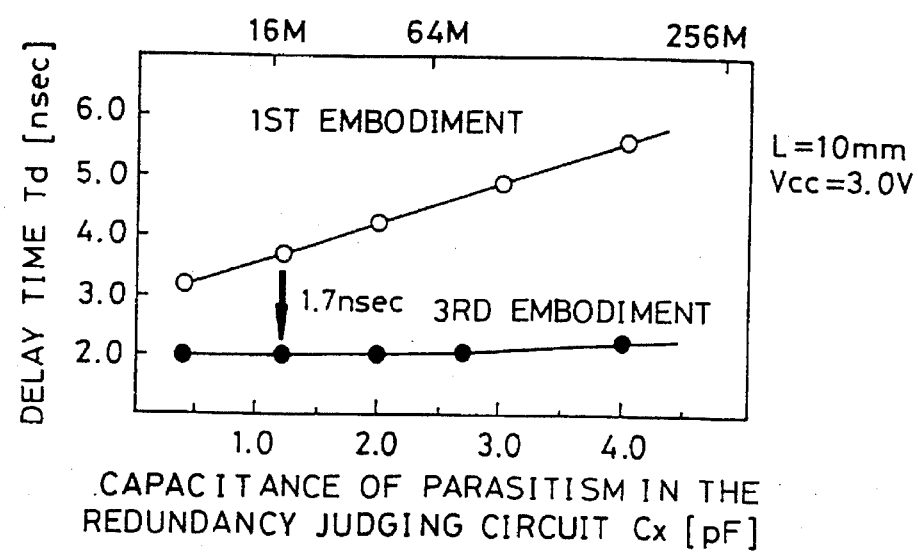
FIG. 10 is a view illustrating the effect of improvement in delay of a data-line changeover signal in the third embodiment of the present invention, such effect being shown in terms of the relation with parasitism capacitance Cx in the redundancy judging circuit unit.
Figure 11:
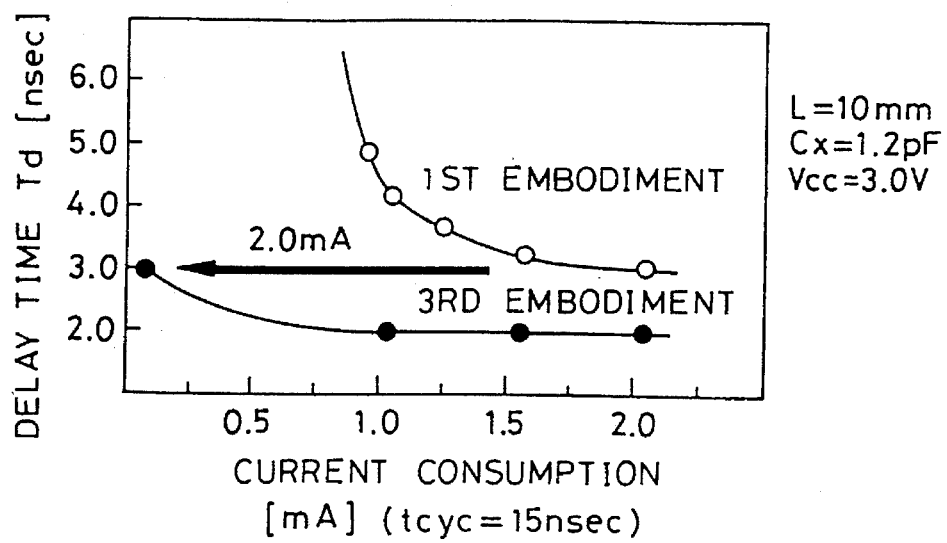
FIG. 11 is a view illustrating the effect of improvement in current consumption in the third embodiment of the present invention, such effect being shown in terms of the relation with delay time of a data-line changeover signal.
Figure 12:
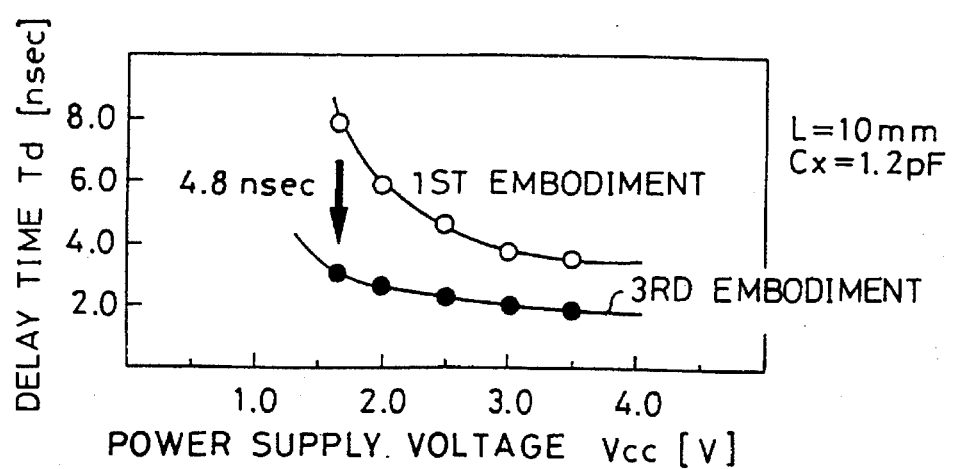
FIG. 12 is a view illustrating the effect of improvement in delay time of a data-line changeover signal with respect to power supply voltage dependency in the third embodiment of the present invention.

As discussed in the foregoing, according to the third embodiment, even though, with a tendency to increase a semiconductor memory in capacity, the wiring length L of the data-line changeover signal line (complementary-signal transmitting line) 38 is lengthened to increase the wiring capacitance Cy, a signal delay time Td is shortened likewise in the second embodiment. The delay time Td is defined as a period of time between the point of time when the output of the spare address comparing circuit 50 varies and the point of time when the signal reaches the data-line changeover switch 45. In the OR circuit 58 in FIG. 2, a great Feedthrough current IO flows from the power supply through any of the input MOSFETs when a spare address is entered. In this third embodiment, however, even though one of the m-piece N-channel MOSFETs 84.1, 84.2, ... in the OR circuit 58a in FIG. 8, is conducted, a great feedthrough current does not flow therein, thus reducing the current consumption. Further, the nodes N5, N6 are always maintained at voltages near to the grounding potential through the impedance adjusting N-channel MOSFETs 85, 88. Accordingly, there can be achieved a high-speed redundancy judgment which does not depend on the parasitism capacitance Cx adjunct to the node N5. When a plurality of input MOSFETs 84.1, 84.2, ... are disposed in the NOR circuits 58a in order to enhance the defect relief rate, the parasitism capacitance Cx is increased. Accordingly, this embodiment is particularly effective. As compared with the first embodiment, the effects produced by this third embodiment are shown in FIGS. 9 to 11. From the measurement result shown in FIG. 12, it is understood that the third embodiment produces an excellent effect to lower the power supply voltage Vcc when the SRAM is driven by batteries.

The third embodiment employs, as impedance adjusting elements, the two N-channel MOSFETs 85, 88 which have different gate widths and to the gates of which the power supply voltage Vcc is applied. However, a difference in at-conduction impedance may be generated based on a difference in gate length. Further, a difference in at-conduction impedance may be generated based on a difference in gate voltage. It is also possible to employ a mere resistance of which impedance value does not vary.

(Fourth Embodiment)

Figure 13:
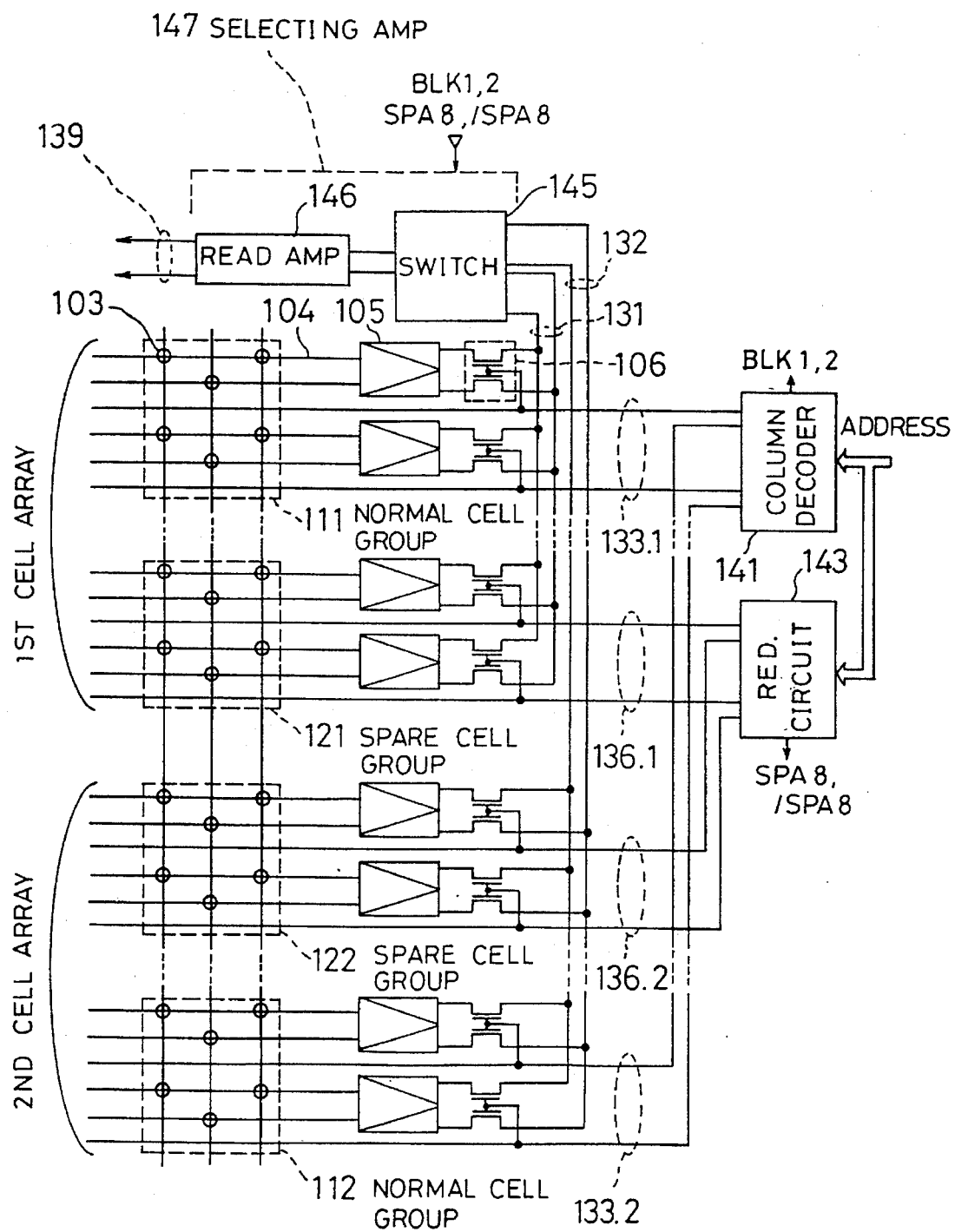
FIG. 13 is a circuit diagram illustrating the arrangement of a reading circuit portion of a DRAM serving as a semiconductor integrated circuit according to a fourth embodiment of the present invention.

The present invention may be applied to not only an SRAM, but also a DRAM. FIG. 13 is a circuit diagram illustrating the arrangement of a reading circuit portion of a DRAM serving as a semiconductor integrated circuit according to a fourth embodiment of the present invention. In FIG. 13, memory cells 103 are divided into a plurality of blocks including (i) a first cell array formed by a first normal cell group 111 and a first spare cell group 121, and (ii) a second cell array formed by a second normal cell group 112 and a second spare cell group 122. Normal column selecting lines 133.1, 133.2, ... are to be selected by a column decoder 141, and spare column selecting lines 136.1, 136.2, ... are to be selected by a redundancy judging circuit unit 143. Output information of a sense amplifier 105 connected to a bit line 104 of each memory cell 103, is read out onto a first or second pair of data lines 131, 132 through a column switch 106. Pieces of information on both pair of data lines 131, 132, are read out onto a pair of output data lines 139 through a selecting amplifier 147 having a data-line changeover switch 145 and a read amplifier 146.

In the fourth embodiment, the normal column selecting lines 133.1. 133.2, ... and the spare column selecting lines 136.1, 136.2, ... respectively correspond to the normal global word lines 33.1, 33.2, ... and the spare global word lines 36.1, 36.2, ... in FIG. 1. Since the operation of the DRAM is basically the same as that of the SRAM mentioned earlier, the description thereof is here omitted.

(Fifth Embodiment)

Figure 14:
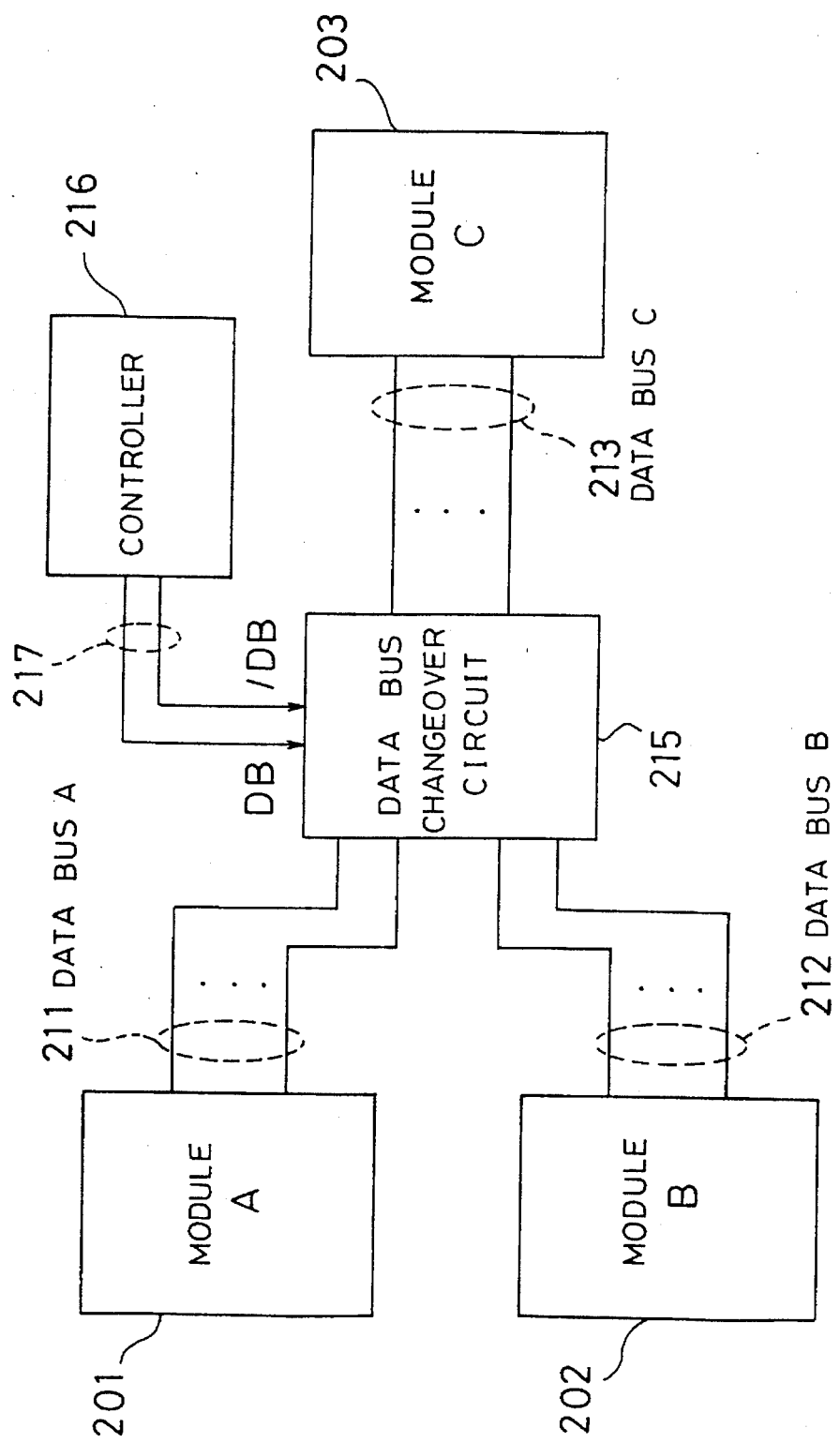
FIG. 14 is a block diagram illustrating the arrangement of data bus portions of a microprocessor serving as a semiconductor integrated circuit according to a fifth embodiment of the present invention.
Figure 15:
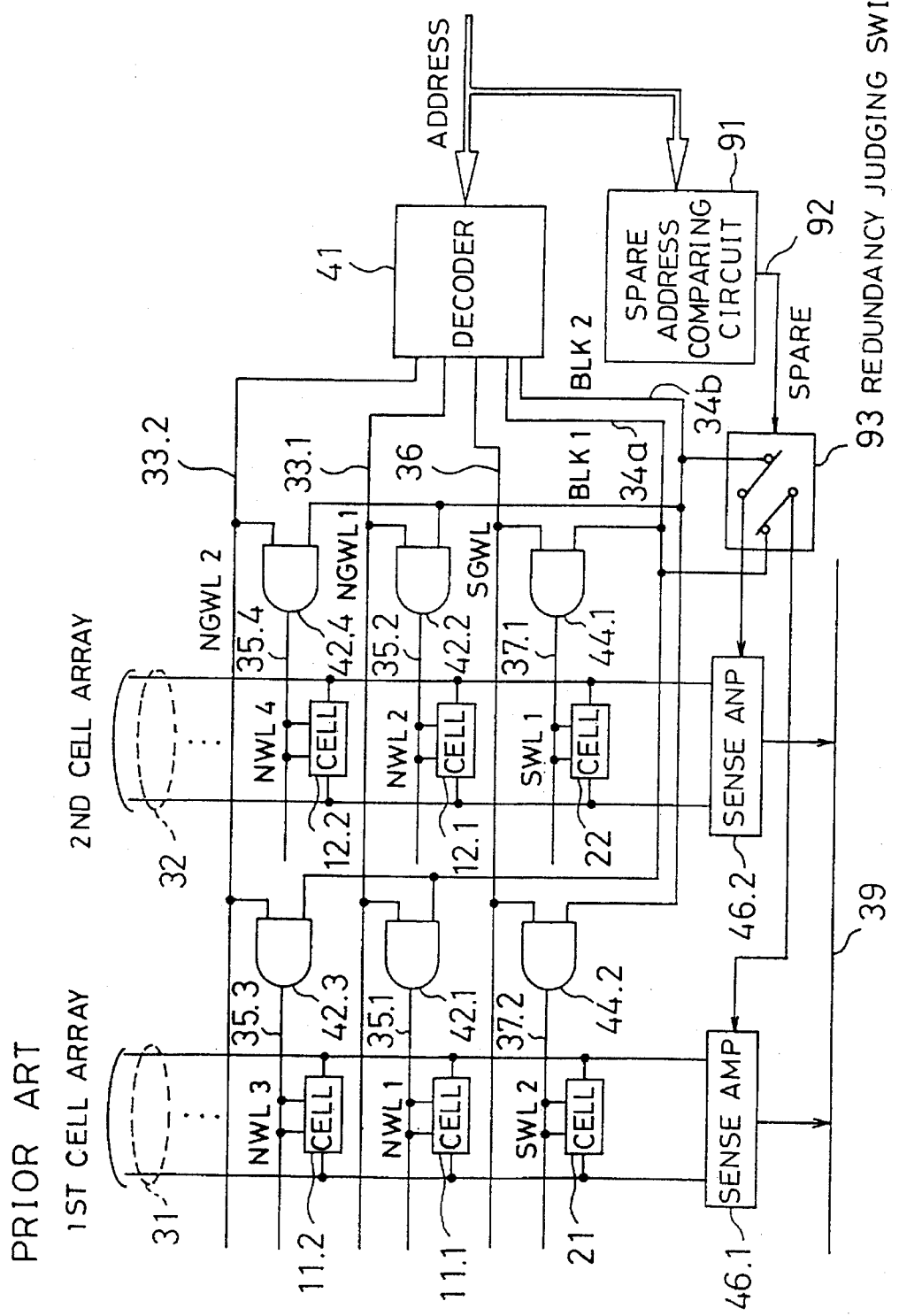
FIG. 15 is a circuit diagram illustrating the arrangement of a reading circuit portion of a conventional SRAM.
Figure 16:
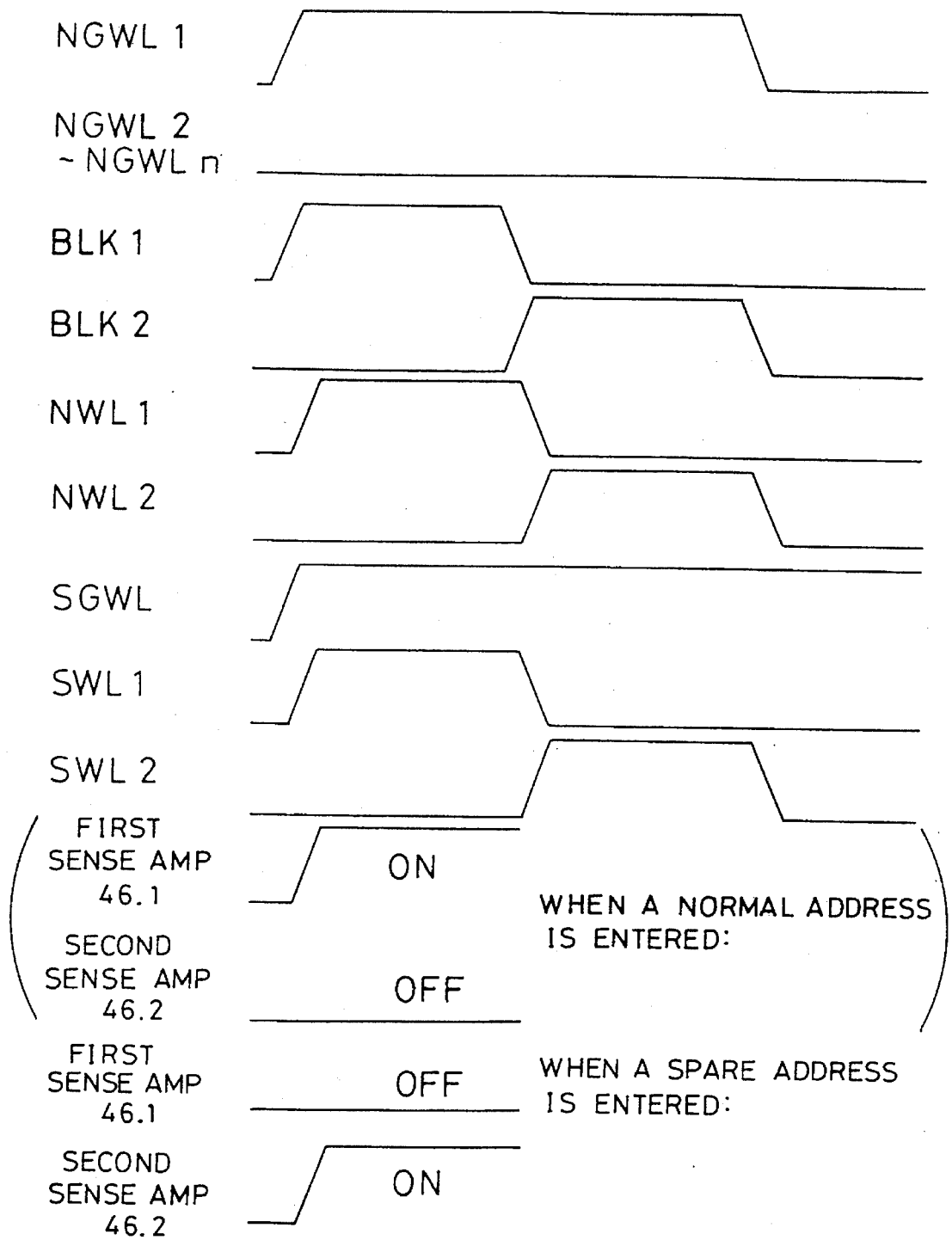
FIG. 16 is a diagram of operational waveforms of the reading circuit portion of the SRAM in FIG. 15.

FIG. 14 is a block diagram illustrating the arrangement of data bus portions of a microprocessor serving as a semiconductor integrate circuit according to a fifth embodiment of the present invention. This microprocessor is adapted such that a control signal for switching data buses is transmitted based on a difference in current.

In FIG. 14, there are shown first to third modules (A, B, C) 201 to 203 respectively having specific functions, and first to third data buses 211 to 213. A data bus changeover circuit 215 is a circuit block arranged such that data can be transmitted between the first module 201 and the third module 203 by connecting the first data bus 211 to the third data bus 213, or data can be transmitted between the second module 202 and the third module 203 by connecting the second data bus 212 to the third data bus 213. A control circuit 216 is adapted to supply control signals DB, /DB for switching data buses, to the data bus changeover circuit 215 through two complementary-signal transmitting lines 217. The control circuit 216 has the circuit arrangement shown in FIG. 6 or 8, and the data bus changeover circuit 215 has the circuit arrangement shown in FIG. 7.

According to the fifth embodiment, even though the wiring lengths of the complementary-signal transmitting lines 217 for transmitting the control signals DB, /DB to the data bus changeover circuit 215 in the microprocessor, are lengthened to increase the wiring capacitance, the control circuit 216 generates a difference in output impedance between the complementary-signal transmitting lines 217, enabling the control signals DB, /DB to be transmitted at a high speed with a small current.

(Sixth Embodiment)

Figure 17:
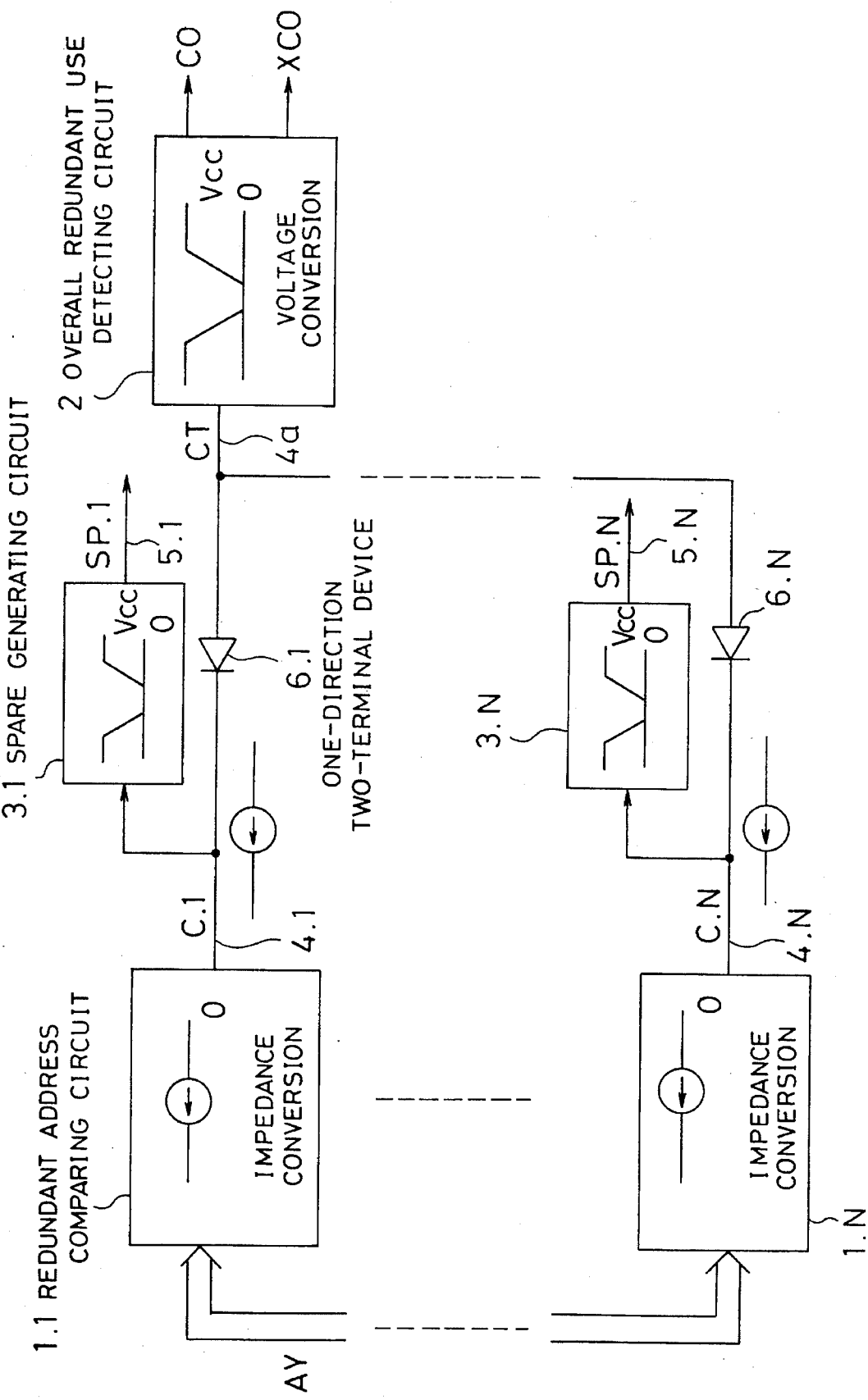
FIG. 17 is a conceptual view showing the structure of a redundancy Judging circuit in a DRAM serving as a semiconductor integrated circuit according to a sixth embodiment of the present invention.

A DRAM serving as a semiconductor integrated circuit according to a sixth embodiment of the present invention comprises a redundancy detecting circuit constituted as shown in FIG. 17. In the drawing are shown redundant address comparing circuits 1.1 to 1.N, an overall redundant use detecting circuit 2, spare generating circuits 3.1 to 3.N, individual redundant address comparing lines 4.1 to 4.N, one-direction two-terminal devices (diodes) 6.1 to 6.N, an integrated redundant address comparing line 4a, and spare lines 5.1 to 5.N. The individual redundant address comparing lines 4.1 to 4.N are individually connected to the input terminals of the spare generating circuits 3.1 to 3.N. The individual redundant address comparing lines 4.1 to 4.N are also individually connected to the cathode terminals of the diodes 6.1 to 6.N. The anode terminals of the diodes 6.1 to 6.N are connected In common to the integrated redundant address comparing line 4a, which is connected to the input terminal of the overall redundant use detecting circuit 2.

For example, if the structure of FIG. 17 is adopted in the redundancy judging circuit 143 in FIG. 13 instead, the spare lines 5.1 to 5.N correspond to the spare column selecting lines 136.1, 136.2, . . . . Here, the correspondence between FIG. 17 and FIG. 2 will be described: The N-piece redundant address comparing circuits 1.1 to 1.N correspond to the spare address comparing circuits 50, the N-piece spare generating circuits 3.1 to 3.N correspond to the SGWL output circuit 55, and the overall redundant use detecting circuit 2 and diodes 6.1 to 6.N correspond to the OR circuit 58.

Below, the structures and functions of the redundant address comparing circuits 1.1 to 1.N, diodes 6.1 to 6.N, overall redundant use detecting circuit 2, and spare generating circuits 3.1 to 3.N in FIG. 17 will be described in detail in this order.

Figure 18A:
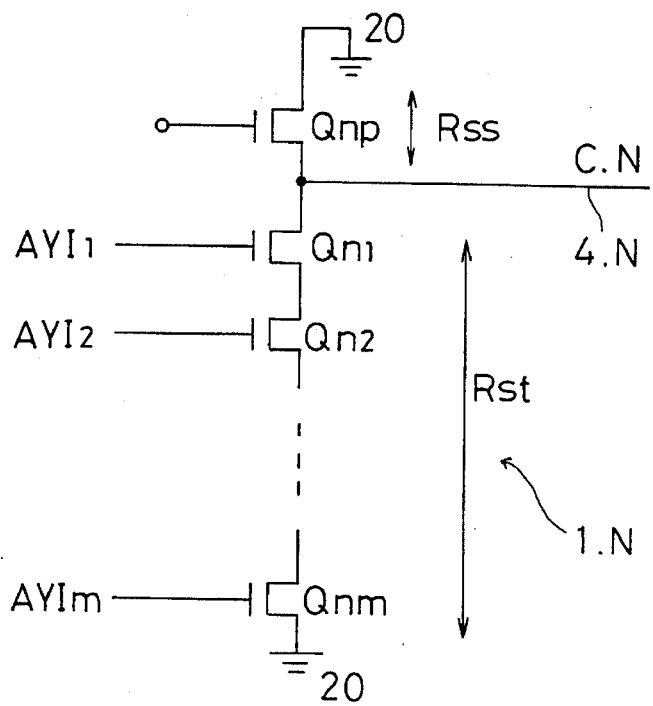
FIG. 18A is a circuit diagram of the output stage of the redundant address comparing circuit in FIGS. 17 and 18B is a circuit diagram of the input stage thereof.
Figure 18B:
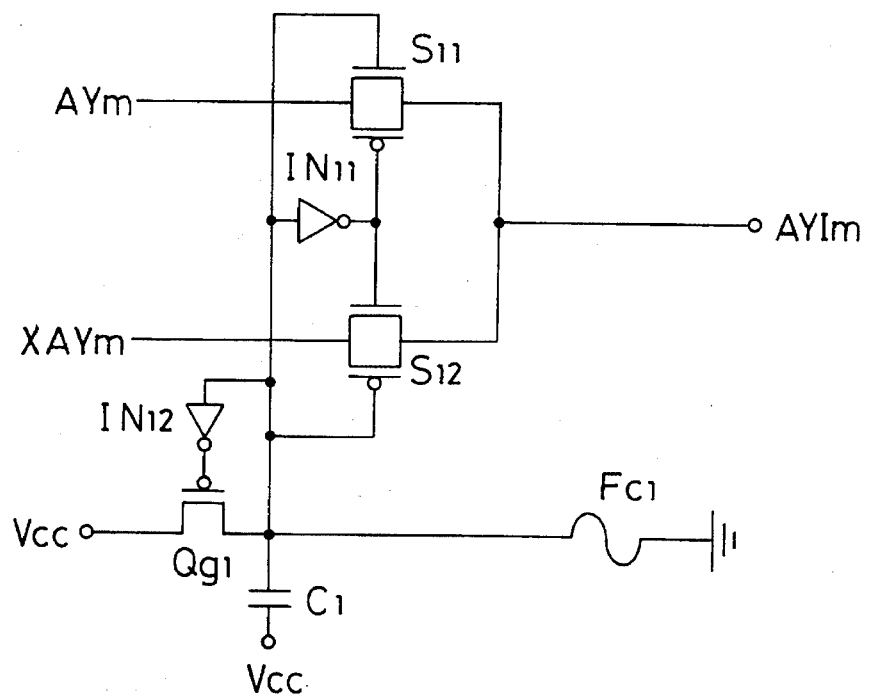

The redundant address comparing circuits 1.1 to 1.N have the same structure. For example, the output stage of the redundant address comparing circuit 1.N (stage for switching the output impedance depending on the matching or mismatching of an m-bit input address and an m-bit spare address) is constituted as shown in FIG. 18A, while the input stage thereof (stage for comparing the input address AY and spare address bit by bit) is constituted as shown in FIG. 18B. The m-piece circuits in FIG. 18B are connected to the circuits in FIG. 18A.

FIG. 18A shows N-channel MOSFETs Qn1 to Qnm and Qnp. The output node C.N. i.e., the individual address comparing line 4.N is connected to a power supply 20 (ground power supply) via the Qnp, while it is connected to the same power supply 20 via the Qn1 to Qnm connected in series. The Qnp is supplied with a gate signal so that it is constantly in the conductive state and presents an impedance Rss in the conductive state. The Qn1 to Qnm connected in series present a series combined impedance Rst when each of gate signals AYI1 to AYIm becomes H and each of the Qn1 to Qnm is in the conductive state.

FIG. 18B shows switches S11 and S12, inverters IN11 and iN12, a P-channel MOSFET QK1, a capacitor C1, and a fuse Fc1, if the H or L state of the AYm, XAYm in the m-th bit of the input address AY matches the disconnected state of the fuse Fc1, the output AYIm becomes H. Conversely, if there is a mismatch therebetween, the output AYIm becomes L.

The method of differentiating impedances will be described more specifically. In such a circuit as shown in FIG. 18A and FIG. 18B, if the input address AY (AY1 to AYm, XAY1 to XAYm) matches the spare address programmed in the fuse (on inputting the spare address), each of the AYI1 to AYIm becomes H, while each of the Qn1 to Qnm is turned on. As a result, the individual redundant address comparing line 4.N is connected to the power supply 20 via the series combined impedance Rst of the Qn1 to Qnm. Conversely, if the input address AY does not match the spare address programmed in the fuse (on inputting the normal address), any of the Qn1 to Qnm is turned off, so that the series combined impedance of the Qn1 to Qnm becomes extremely large (open state).

The Qnp is designed to have an impedance Rss much larger than the series combined impedance Rst of the Qn1 to Qnm. Specifically, the Rss can be controlled by changing the setting of the gate voltage or channel width of the Qnp. In the case of using the circuit shown in FIG. 18A, an output impedance Rss*Rst/(Rss+Rst) on inputting the spare address approximates to the Rst. The output impedance on inputting the normal address becomes substantially equal to the Rss.

As described above, if the input address AY matches the spare address, the output node C.N of the redundant address comparing circuit 1.N, i.e., the individual redundant address comparing line 4.N is connected to the power supply 20 with the first impedance interposed therebetween, which is comparatively low. Conversely, if the input address does not match the spare address, the output node C.N is connected to the power supply 20 with the second impedance interposed therebetween, which is comparatively high. In this case, the potential of the node C.N is substantially fixed to the ground potential. Consequently, a high-speed signal transmission independent of a parasitism capacitance added to the individual redundant address comparing line 4.N can be realized.

Information on the impedances is not only inputted to the spare generating circuits 3.1 to 3.N, but also transmitted to the overall redundant use detecting circuit 2 via the diodes 6.1 to 6.N, as shown in FIG. 17.

Figure 19:
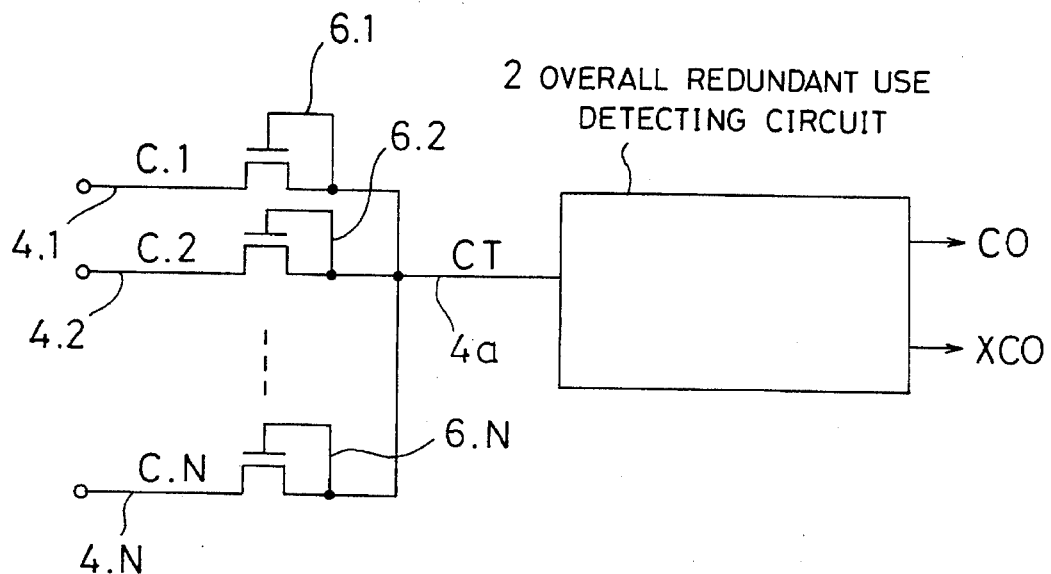
FIG. 19A is a circuit diagram showing the connection between the individual redundant address comparing line and overall redundant use detecting circuit in FIG. 17
FIG. 19B is a circuit diagram of the input impedance differential amplifier, which shows the internal structure of the overall redundant use detecting circuit in FIG. 17.
Figure 19:
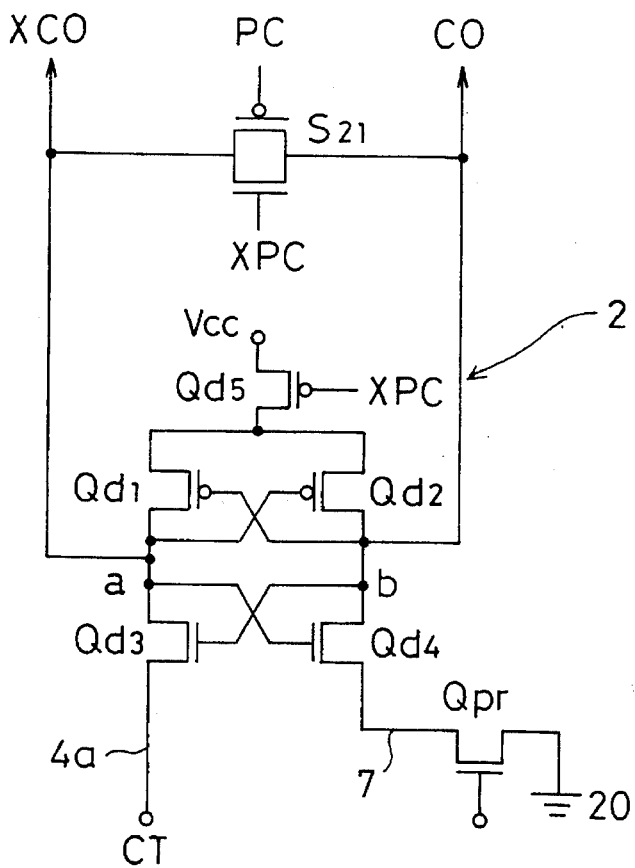

Although the diodes 6.1 to 6.N used here are composed of N-channel MOSFETs, as shown in FIG. 19A, they may also be composed of semiconductor p-n junctions. The function of the diodes 6.1 to 6.N is to electrically disconnect the individual nodes C.1 to C.N of the redundant address comparing circuits 1.1 to 1.N, while electrically connecting the nodes C.1 to C.N in terms of the overall redundant use detecting circuit 2.

The overall redundant use detecting circuit 2 is for detecting the magnitude of the impedance between the combined output node CT of the diodes 6.1 to 6.N, i.e., the integrated redundant address comparing line 4a and the power supply 20. Here, CO, XCO are a pair of complementary output signals indicating whether or not a plurality of spare addresses include one that is identical with the input address.

On inputting the spare address, the input impedance of the overall redundant use detecting circuit 2 becomes 1/(1/RSt+N/Rss). On inputting the normal address, on the other hand, the input impedance becomes Rss/N. Here, N represents the number of the redundant address comparing circuits 1.1 to 1.N, and the value of the Rss is determined to satisfy Rst<Rss/N. Based on the above premise, it will be appreciated that the input impedance 1/(1/Rst+N/Rss) on inputting the-foregoing spare address becomes substantially equal to the-Rst, which is lower than the Rss/N.

FIG. 19B shows the structure of an input impedance differential amplifier constituting the overall redundant use detecting circuit 2. In FIG. 19B are shown a switch S21, P-channel MOSFETs Qd1, Qd2, and Qd5, N-channel MOSFETs Qd3, Qd4, and Qpr, and a reference line 7. The Qd1 to Qd4 constitute a cross-coupled amplifier. The source electrode of the Qd3 is connected to the integrated redundant address comparing line 4a. The source electrode of the Qd4 is connected to the reference line 7 having an appropriate impedance (impedance when the Qpr is in the conductive state) as a reference value. It is proper to set the impedance of the reference line 7 to a substantially intermediate value between the $1/(1/Rst+N/Rss)$ and $(Rss/N)$. Although the resistance value (Rdo) of the diode is not considered in this case, if it is to be considered, it may be set to a substantially intermediate value between $\{(Rdo/N+1/(1/(1/Rst+N/Rss))\}$ and $\{Rdo/N+Rss/N\}$.

The outputs CO, XC0 of the overall redundant use detecting circuit 2 constituted as shown in FIG. 19B are temporarily equalized by signals PC, XPC to be precharged. If the equalization is ceased, one of the C0, XCO becomes H, while the other becomes L, due to the difference in input impedance. Specifically, if the impedance of the node CT is lower than the impedance of the reference line 7, the potential at the point a lowers before the potential at the point b does, so that the output CO becomes H and the output XCO becomes L.

Figure 20:
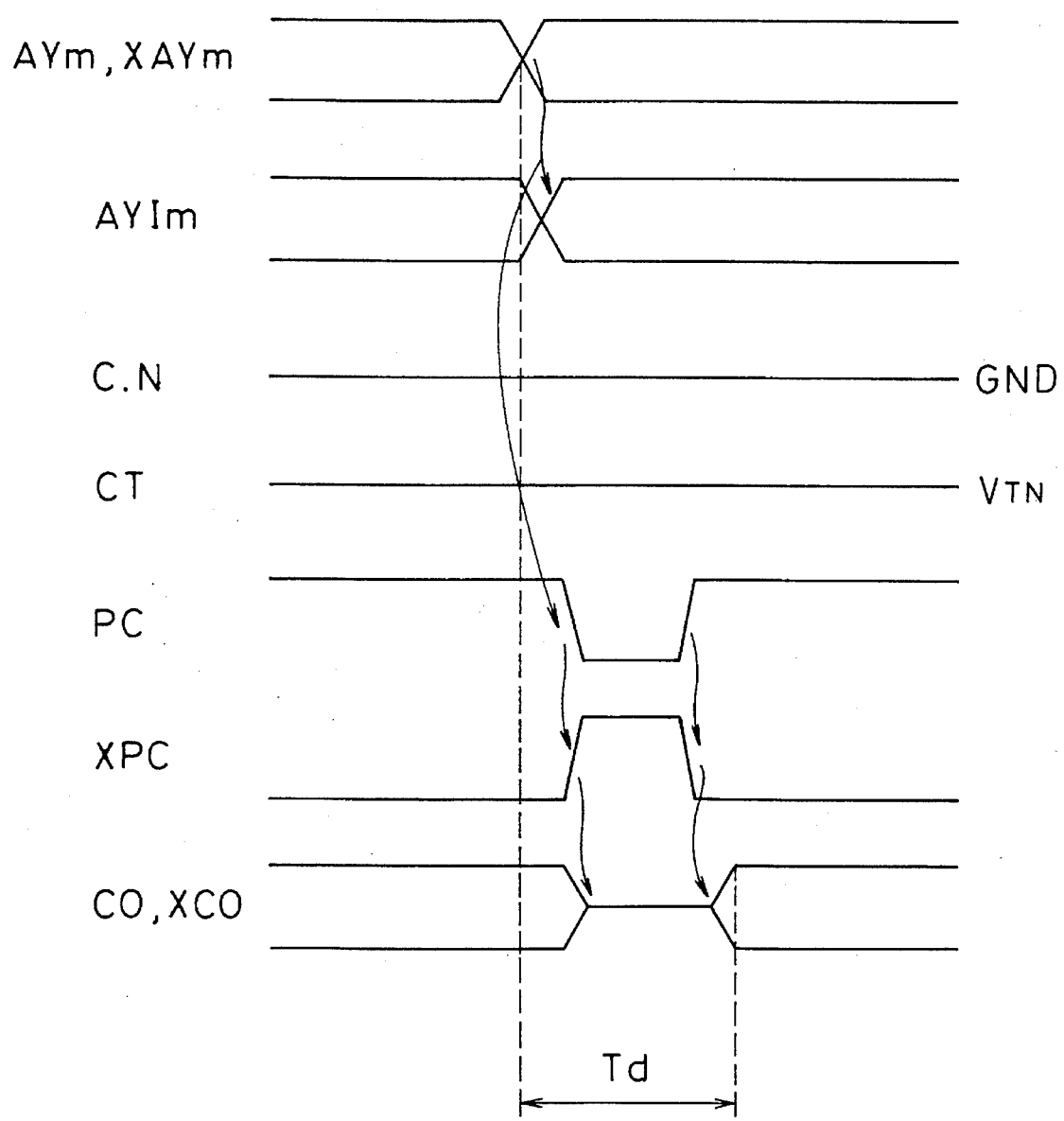
FIG. 20 is an operational waveform chart of the redundancy judging circuit in FIG. 17.

FIG. 20 is an operational waveform chart of the redundancy judging circuit of FIG. 17. Description will now be given to the case in which the input address AY changes from a normal address to the address identical with the spare address programmed in the redundant address comparing circuit 1.N. At this time, the impedance of the node C.N changes, and the impedance of the node CT also changes simultaneously. However, the potentials of the node C.N and node CT are maintained substantially equal to the ground potential (GND) and VTN, respectively. The VTN is the threshold voltage of the N-channel MOSFETs constituting the diodes 6.1 to 6.N. The voltage levels of the C0, XC0 are determined immediately after the equalization by the signals PC, XPC is ceased.

Figure 21:
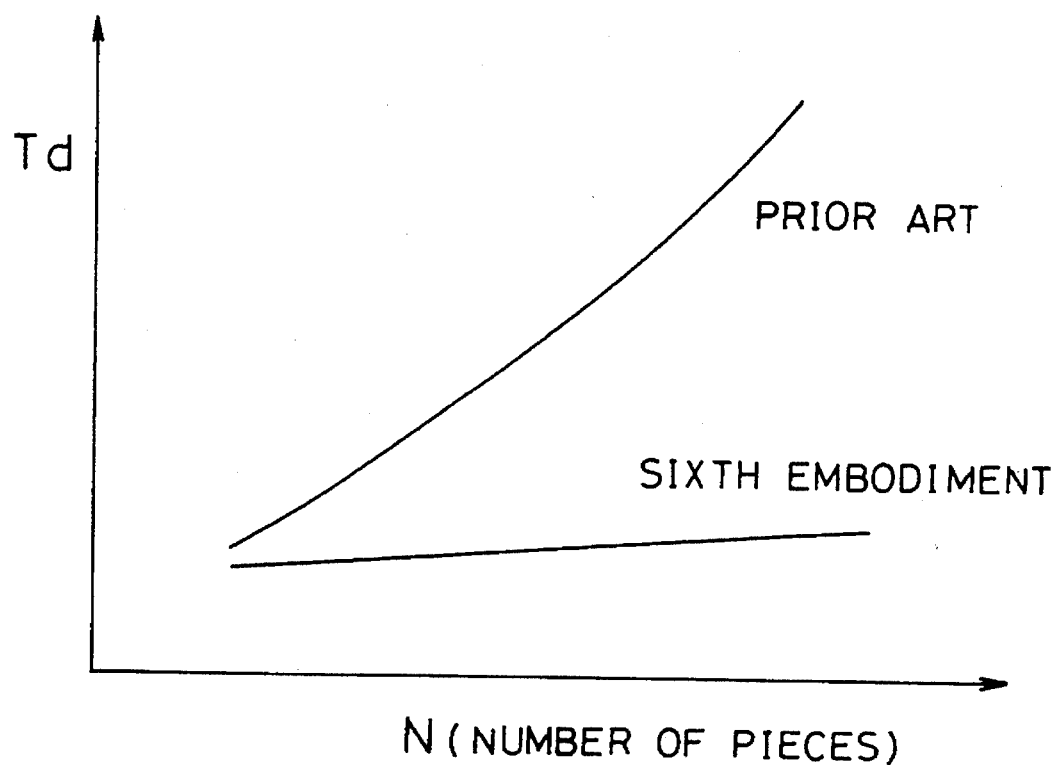
FIG. 21 is a view showing an improvement in operational delay of the redundancy judging circuit according to the sixth embodiment of the present invention.

Here, operational delay time represented by Td in FIG. 20 will be considered. In the present embodiment, even though the floating capacitances of the nodes C.1 to C.N and CT are increased as the number N of the redundant address comparing circuits 1.1 to 1.N is increased, the voltage of each node is not changed, so that time for charging or discharging is not required. As a result, the operational delay time Td is substantially independent of the N, as shown in FIG. 21.

Here, the pulse widths of the signals PC, XPC (FIG. 20) are set smaller by several ns than the pulse width of a signal ATD. This is because the load capacitance to be equalized of the signals PC, XPC are smaller than that of the signal ATD, so that the time required for equalization is shorter accordingly. This advances the time for activating the input impedance differential amplifier constituting the overall redundant use detecting circuit 2, so that a higher-speed operation can be expected.

Figure 22:
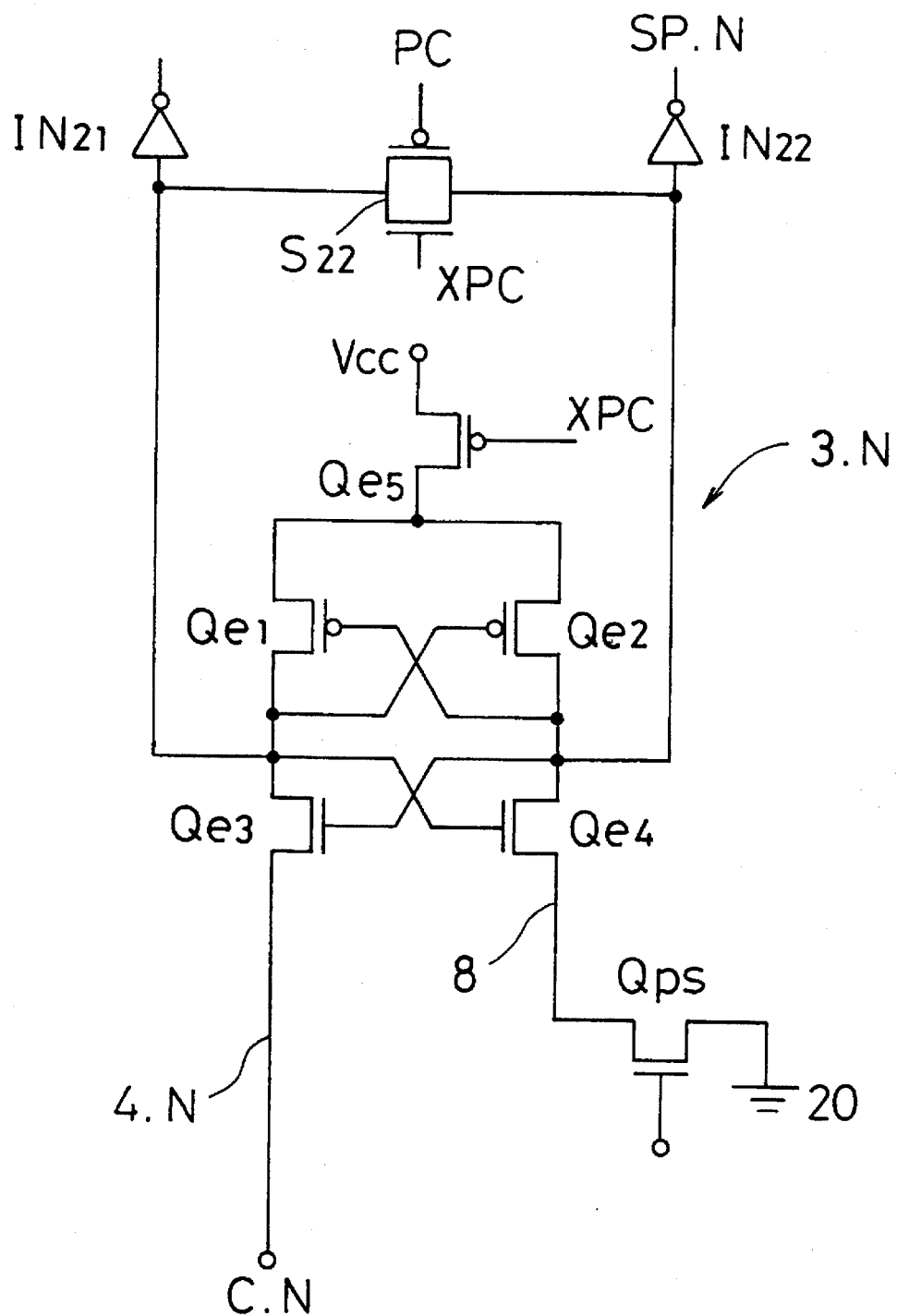
FIG. 22 is a circuit diagram of the input impedance differential amplifier showing the internal structure of the spare generating circuit in FIG. 17.

FIG. 22 shows the structure of the input impedance differential amplifier constituting the spare generating circuit 3.N. In the drawing are shown a switch S22, P-channel MOSFETs Qe1, Qe2, and Qe5, N-channel MOSFETs Qe3, Qe4, and Qps, a reference line 8, and inverters IN21 and IN22. The structure of the input impedance differential amplifier is the same as that of the overall redundant use detecting circuit of FIG. 19B. It is proper to set the impedance of the reference line 8 to a substantially intermediate value between the Rst and Rss. Each of the outputs SP.1 to SP.N of the N-piece spare generating circuits 3.1 to 8.N is used for selecting one spare cell.

(Seventh Embodiment)

Figure 28:
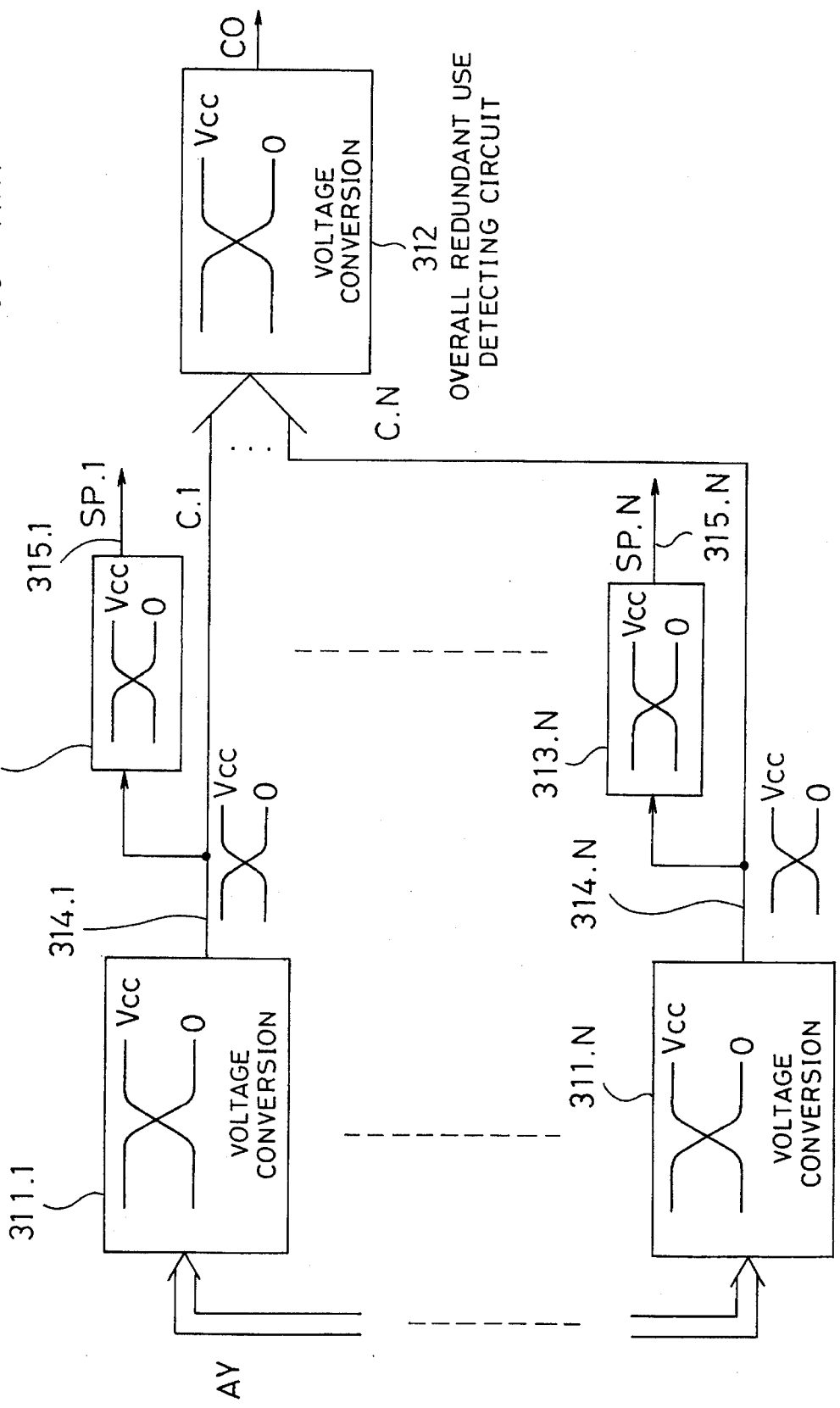
FIG. 28 is a conceptual view of a redundancy detecting circuit of a conventional DRAM.
Figure 29:
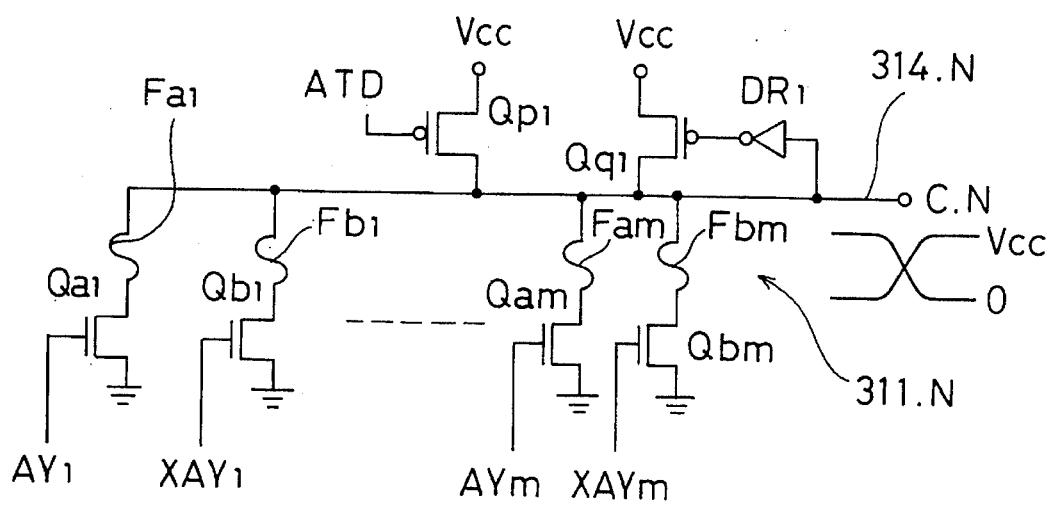
FIG. 29A is a circuit diagram of the redundant address comparing circuit in FIG. 28.
FIG. 29B is a circuit diagram of the overall redundant use detecting circuit in FIG. 28.
FIG. 29C is a circuit diagram of the spare generating circuit in FIG. 28.
Figure 29:
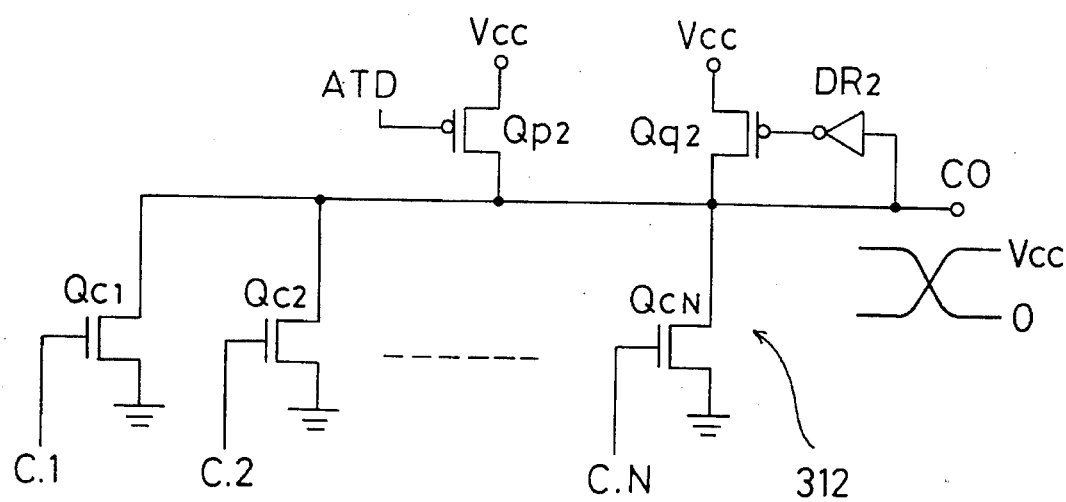
Figure 29:
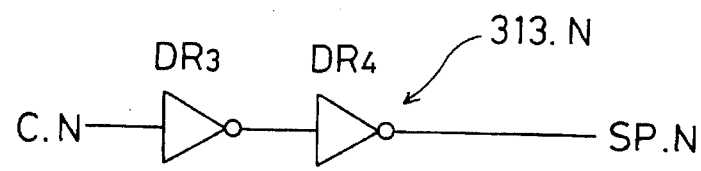
Figure 30:
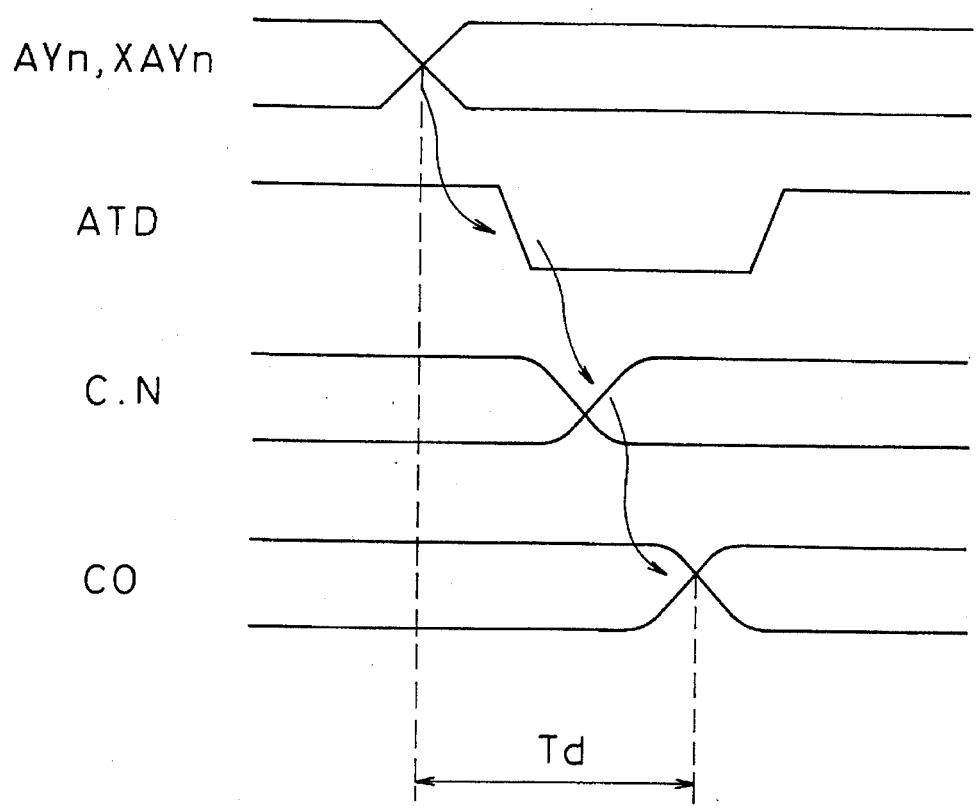
FIG. 30A is an operational waveform chart of the redundancy judging circuit in FIG. 28
FIG. 30B is a view showing the relationship between the operational delay time of the redundancy detecting circuit in FIG. 28 and the number of the redundant address comparing circuits.
Figure 30:
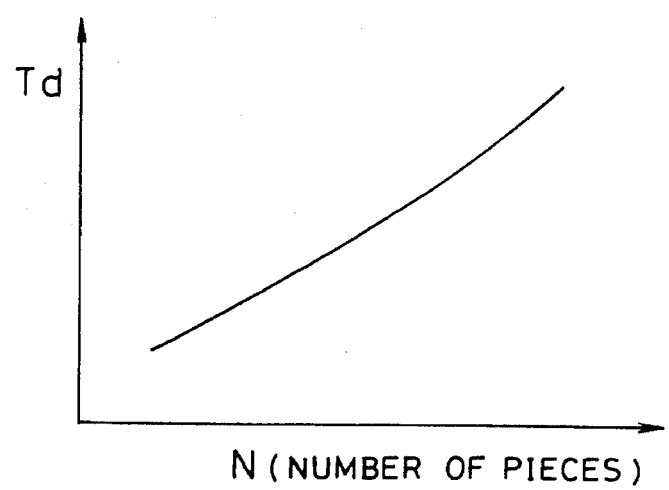
Figure 31:
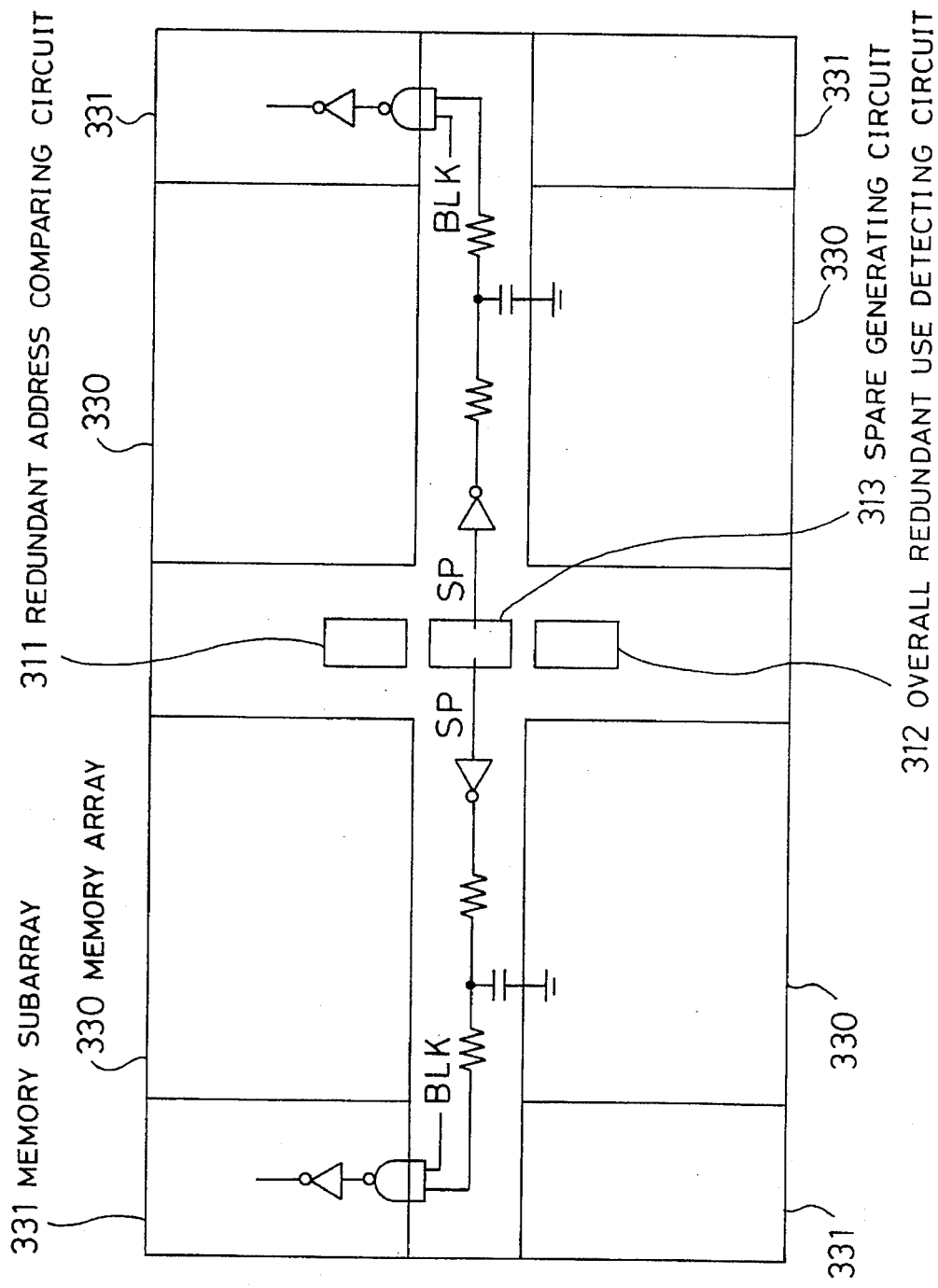
FIG. 31 is an on-chip wiring diagram of a redundancy detecting circuit in the conventional DRAM.

A DRAM serving as a semiconductor integrated circuit according to a seventh embodiment of the present invention employs a circuit arrangement shown in FIG. 28 as a modification of the overall redundant use detecting circuit 2 in FIG. 17.

As shown in FIG. 23, the overall redundant use detecting circuit 2 according to the present embodiment is obtained by adding four P-channel MOSFETs Qpp1 to Qpp4 to the structure of FIG. 19B. That is, the Qpp1 and Qpp2 are connected in series, the gate of the Qpp1 is controlled by a signal PC, and the gate and drain of the Qpp2 are connected to the node CT. On the other hand, the Qpp3 and Qpp4 are connected in series, the gate of the Qpp3 is controlled by the signal PC, and the gate and drain of the Qpp4 are connected to the drain of Qpr for generating the reference impedance.

With the above structure, the potential at the point a in FIG. 28 increases by the amount represented by V1 while the signal PC is L, based on the ratio of the impedance of the node CT to the series combined impedance of the Qpp1 and Qpp2. Similarly, the potential at the point b increases by the amount represented by V2, based on the ratio of the impedance of the Qpr to the series synthesized impedance of the Qpp3 and Qpp4. The difference between the increments (V1 −V2) is as large as several 100 mV, which leads to the stable and high-speed operation of the cross-coupled amplifiers Qd1 to Qd4 of CMOS type.

Thus, according to the present embodiment, the potential difference between the source electrodes of the pair of N-channel MOSFETs Qd3 and Qd4 constituting the n-type cross-coupled amplifier can be set large, thereby enabling a high-speed operation. Although the present embodiment has described the modification of the overall redundant use detecting circuit 2, the spare generating circuits 3.1 to 3.N can also be modified in the same manner.

(Eighth Embodiment)

Figure 25:
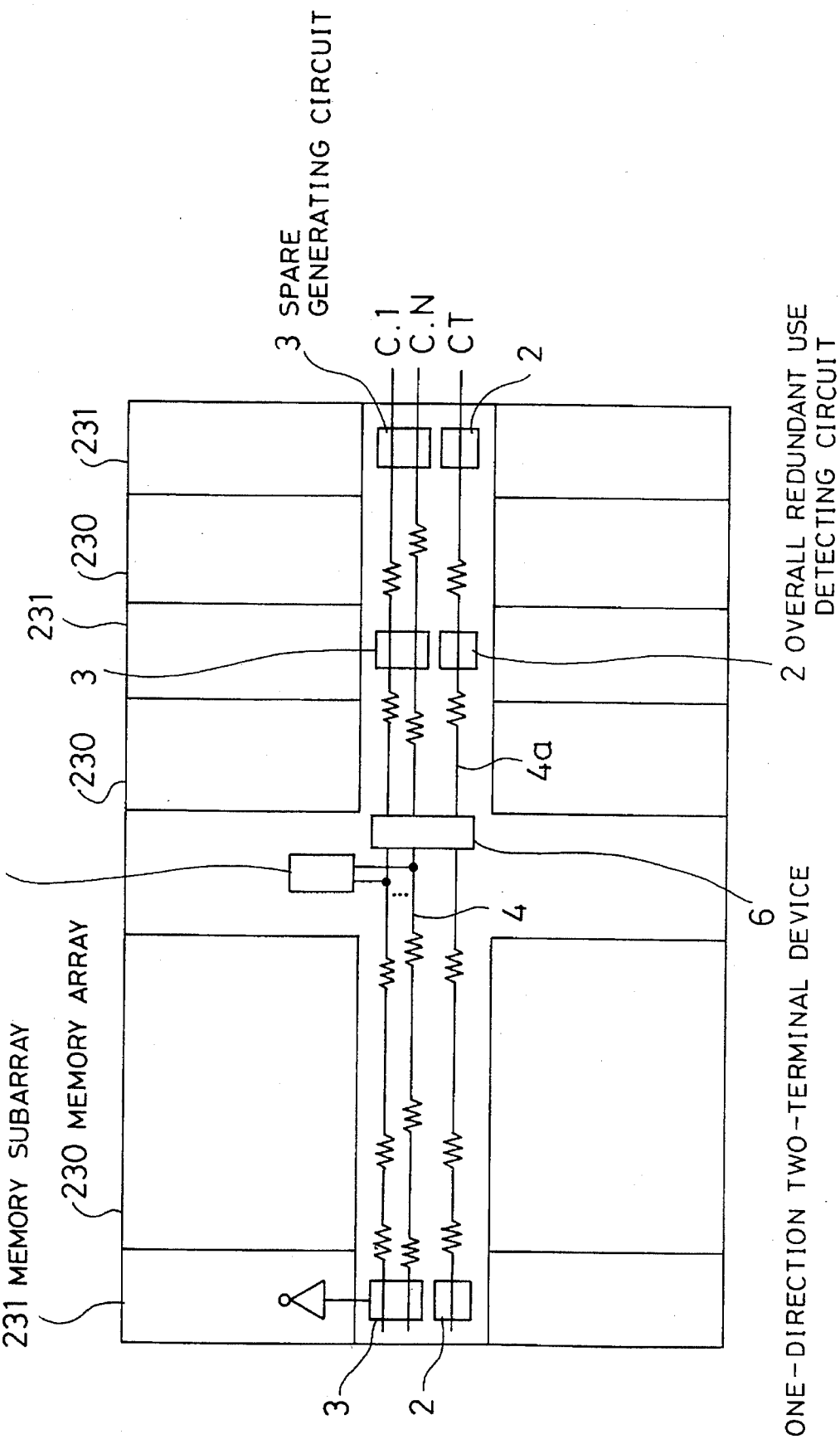
FIG. 25 is an on-chip wiring diagram of a redundancy judging circuit in a DRAM serving as a semiconductor integrated circuit according to an eighth embodiment of the present invention.
Figure 26:
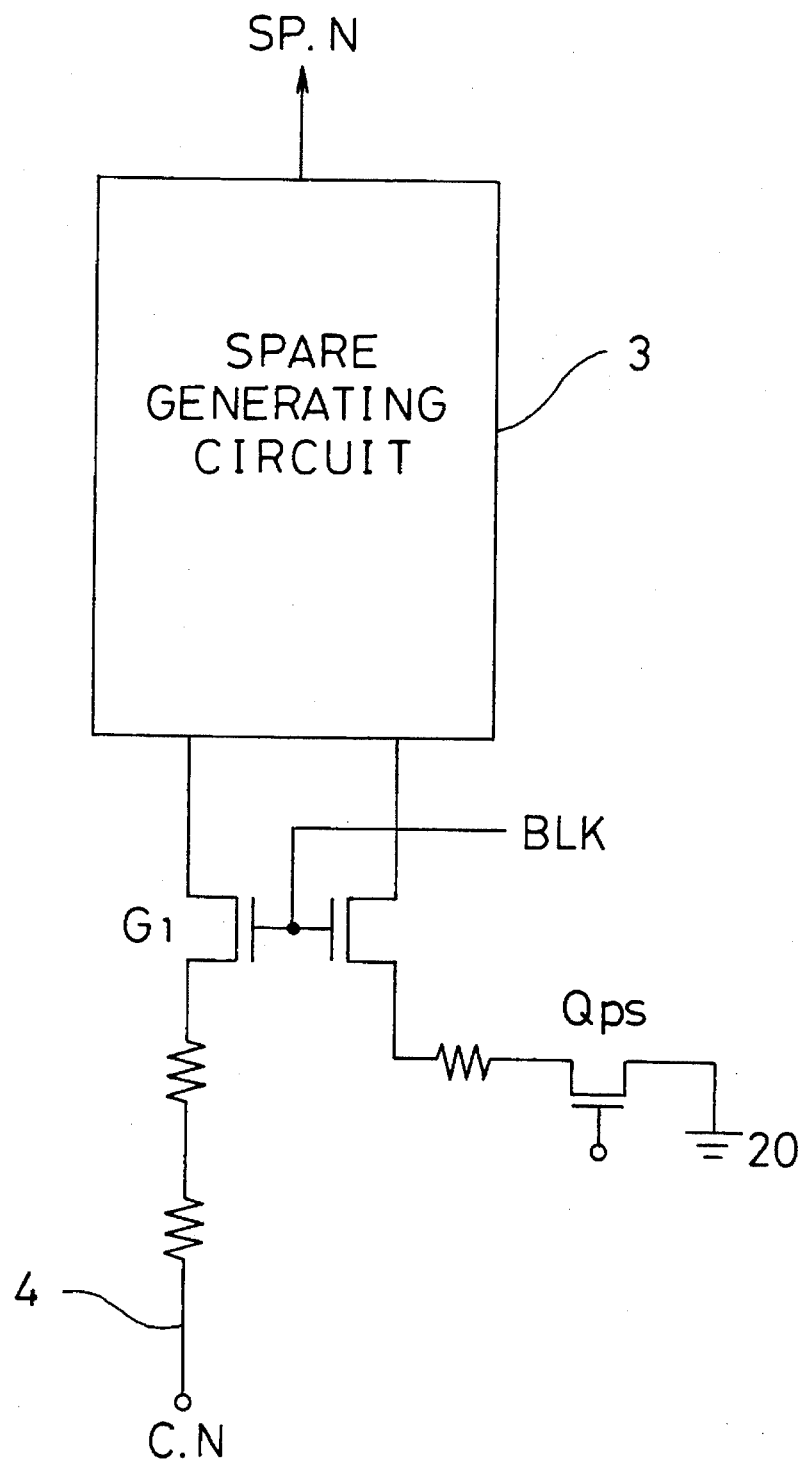
FIG. 26 is a circuit diagram showing the connection of the input of the spare generating circuit in FIG. 25.
Figure 27:
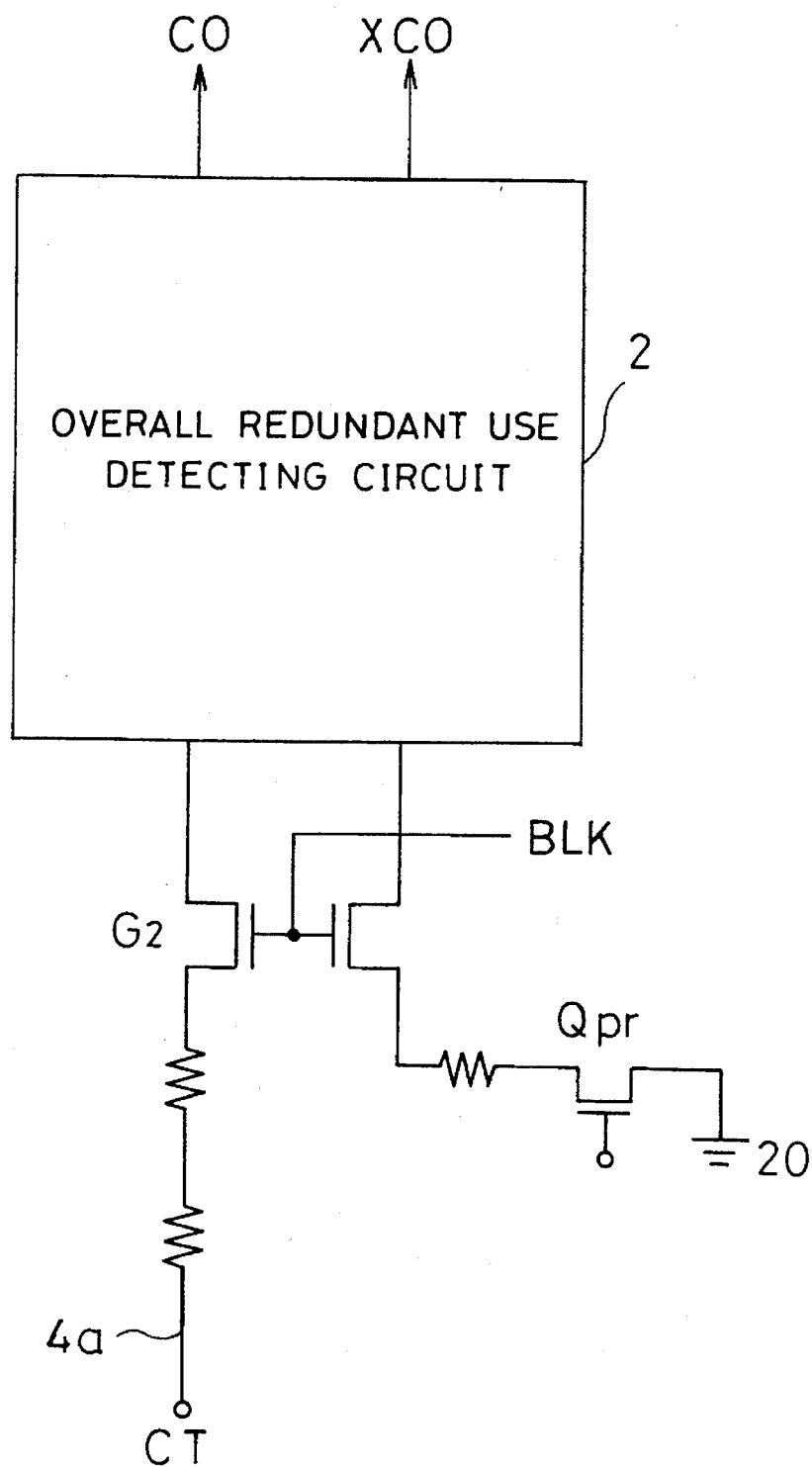
FIG. 27 is a circuit diagram showing the connection of the input of the overall redundant use detecting circuit in FIG. 25.

FIGS. 25 to 27 are views showing the structure of a DRAM serving as a semiconductor integrated circuit according to an eighth embodiment of the present invention.

As shown in FIG. 25, the memory cells on the chip are divided into a plurality of blocks. Each block comprises a memory array 230 in which the memory cells are arranged and a memory subarray 231 for controlling an access to the memory array 230. A redundant address comparing circuit 1 (representative of the N-piece redundant address comparing circuits 1.1 to 1.N) and a diode 6 (representative of the N-piece diodes 6.1 to 6.N) are disposed in the center of the memory chip. The signal line for the outputs C.1 to C.N and CT of the redundant address comparing circuit 1 and diode 6, i. e., the individual redundant address comparing line 4 (representative of the N-piece individual redundant address comparing lines 4.1 to 4.N) and integrated redundant address comparing line 4a extend from the center of the chip to the memory subarrays 231 at the ends of the chip. The input impedance differential amplifier used in each of the spare generating circuit 3 (representative of the N-piece spare generating circuits 3.1 to 3.N) and the overall redundant use generating circuit 2 is disposed in the vicinity of every memory subarray 231.

As detailed in FIG. 26, the node C.N and the spare generating circuit 3 are connected to each other via a transfer gate G1 controlled by a block select signal BLK. As also detailed in FIG. 27, the node CT and the overall redundant use detecting circuit 2 are connected to each other via a transfer gate G2 similarly controlled by the block select signal BLK.

With the above structure, even when the signal path exceeds 12 mm with the increase of memory capacity, which is for a 64 Mb DRAM or its equivalent, the potentials of its signal lines such as the nodes C.1 to C.N and CT are fixed around the ground level, so that there is no voltage change on the level of the power-supply voltage. In other words, the wiring capacitance of the order of several tens of pF is seldom charged or discharged, so that there is no delay time, resulting in a higher operation.

(Ninth Embodiment)

Figure 32:
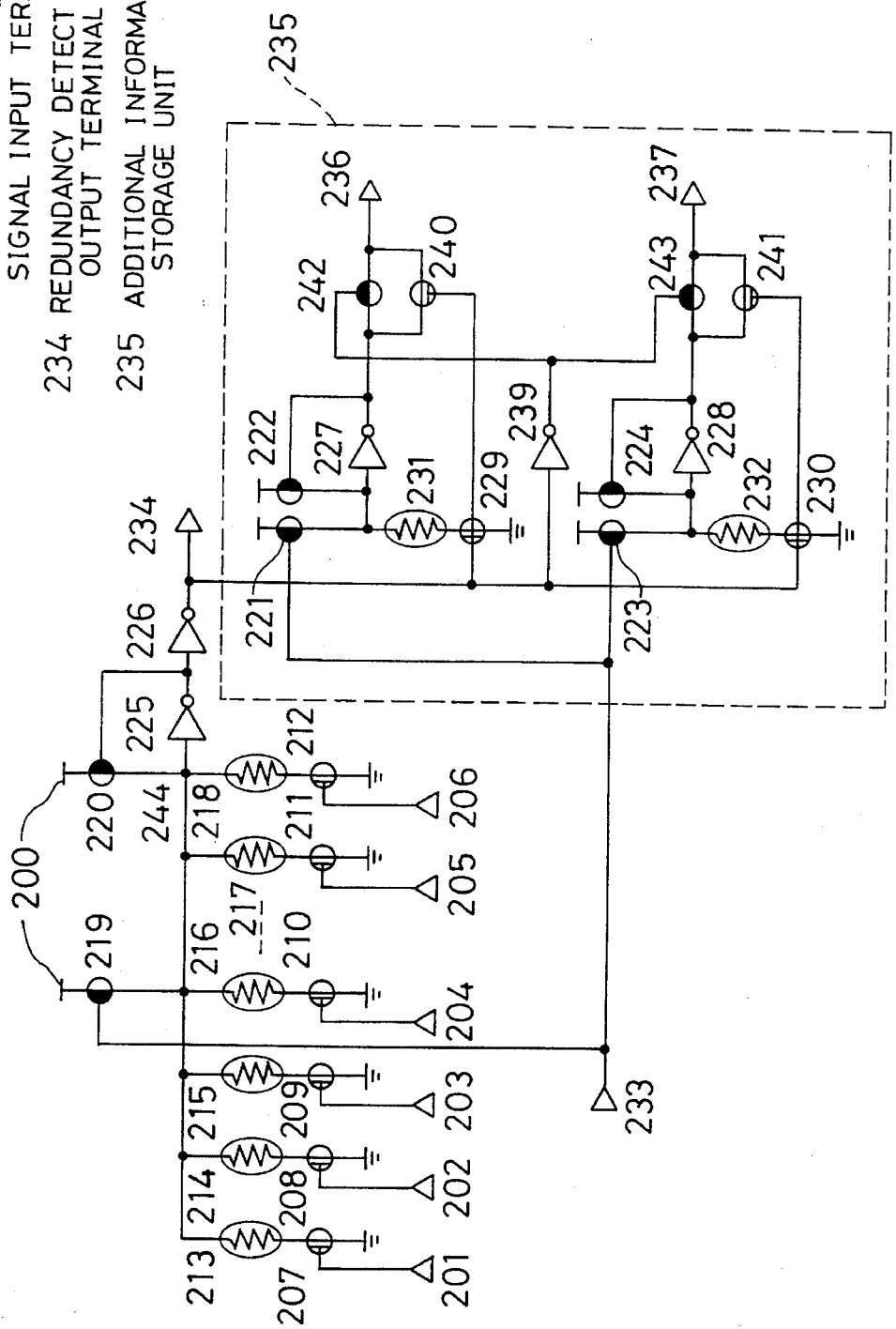
FIG. 32 is a circuit diagram of a redundant fuse circuit for a DRAM according to a ninth embodiment of the present invention.

FIG. 32 is a circuit diagram of a redundant fuse circuit for a semiconductor memory according to a ninth embodiment of the present invention. The Figure shows a first power supply 200, address input terminals 201 to 206, N-channel MOSFETs 207 to 212,229,230, 240, and 241, fuse elements 213 to 218, 231, and 232, P-channel MOSFETs 219 to 224, 242, and 243, inverters 225 to 228 and 239, a redundant fuse precharge signal input terminal 233, a redundancy detect signal output terminal 234, an additional information storage unit 235 for outputting specific information stored therein in response to an output of the redundancy detect signal 234, output terminals 236 and 237 of the additional information storage unit 235, and an internal node 244.

Figure 43:
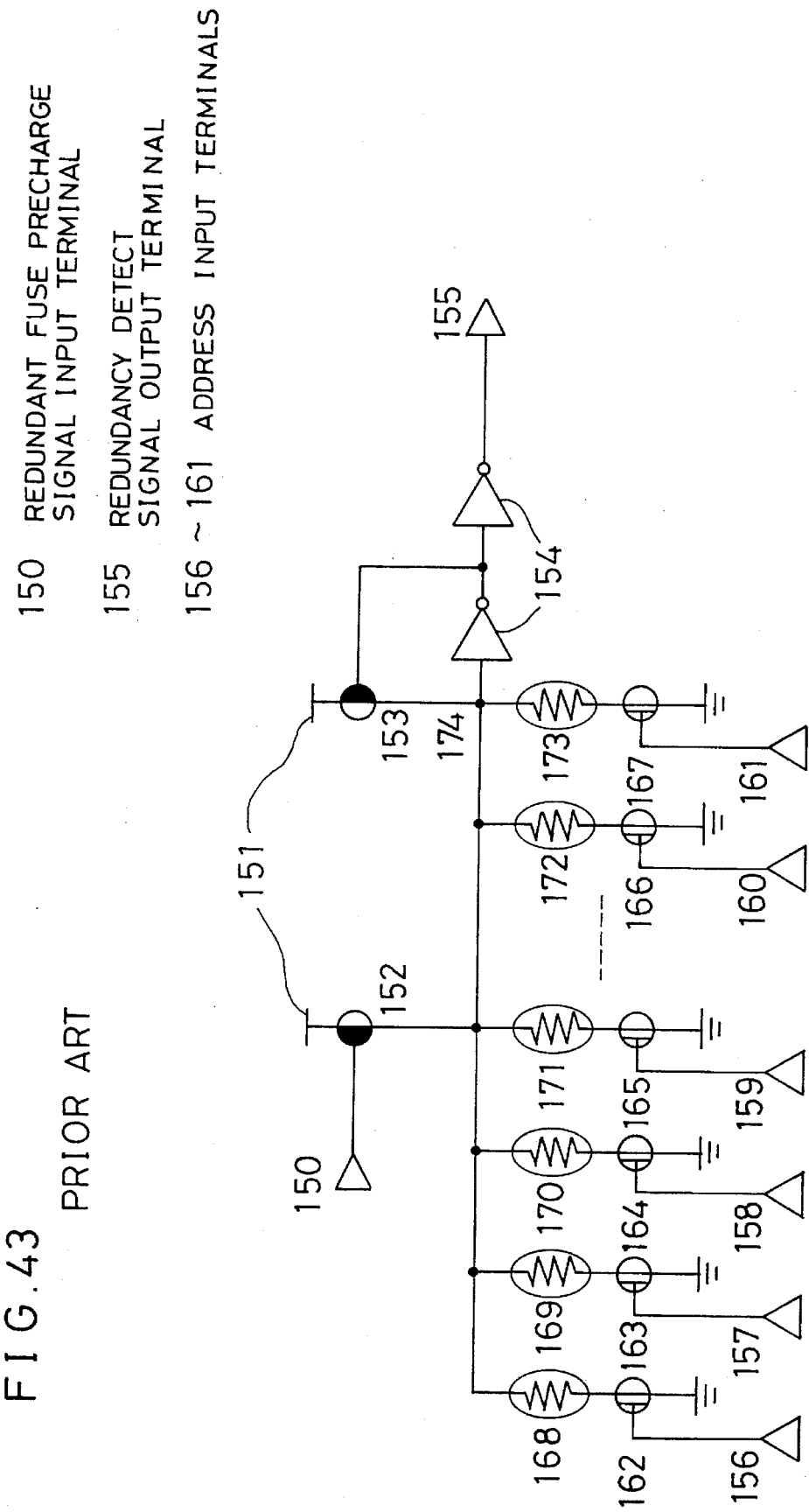
FIG. 43 is a circuit diagram of the redundant fuse circuit in FIG. 41.
Figure 44:
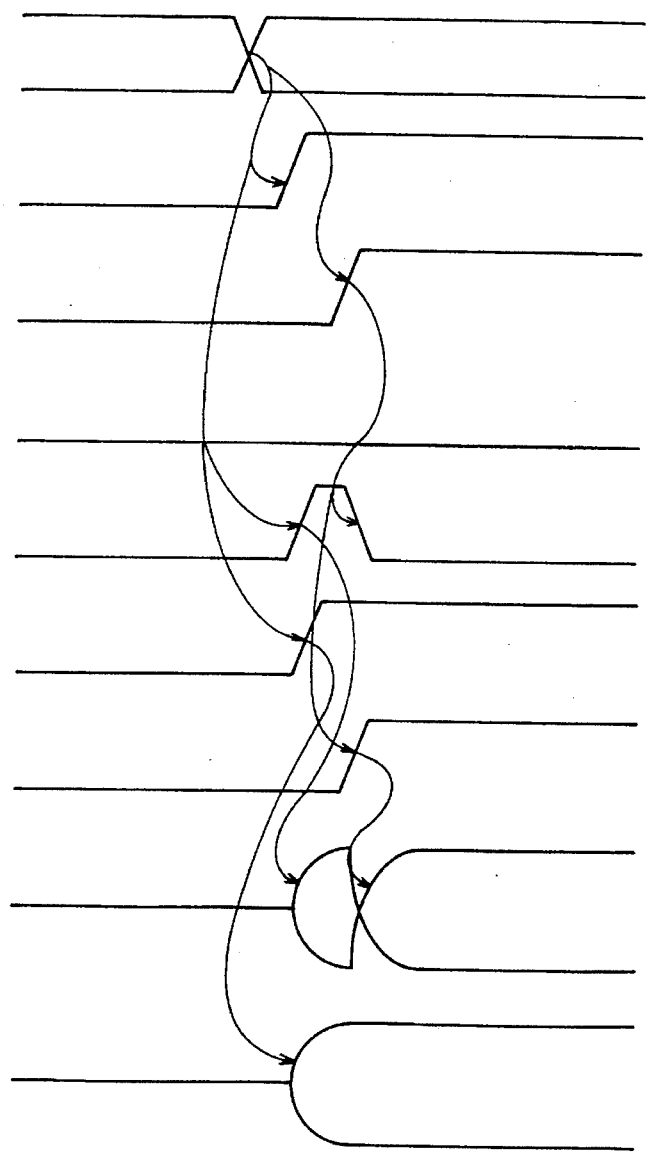
FIG. 44 is an operational waveform chart of the DRAM in FIG. 41.

The redundant fuse circuit of the present embodiment is formed by adding the additional information storage unit 235 to the conventional fuse circuit shown in FIG. 43. In the present embodiment, if the address inputted from the address input terminals 201 to 206 matches the address programmed in the fuse elements 213 to 218 (the state in) which the fuse is disconnected and hence the charge of the node 244 is not removed by the ground), the output 234 of the circuit generates H, which serves as a redundant address detect signal indicating that the inputted address is a redundant address. Thus far, the redundant fuse circuit of the present embodiment has been the same as the conventional redundant fuse circuit. However, since the additional information storage unit 235 has the function of outputting specific information stored therein in response to an output of the redundant detect signal 234, the redundant fuse circuit can be operated not only for simply judging the redundant address but also for other purposes using the result of judgment. For example, if the redundant fuse circuit is applied to the DRAM of 4-bit configuration described in the conventional embodiment, the column address in which the lower two bits degenerate (an address for distinguishing I/O0 to I/O3 is never given to the DRAM at the time of the read/write operation) can be stored in the additional information storage unit. Consequently, it is possible to generate a column address in which the lower two bits are restored using the upper bits of the inputted address, thereby distinguishing the I/O0 to I/O3.

Although the degenerate column address is stored in the additional information storage unit in the present embodiment, it is also possible to store various other information, such as information on a signal for setting the operational mode or on a signal for changing the operational timing, in the additional information storage unit.

Although the output of the additional information storage unit is allowed to output only when the redundancy detect signal is outputted, and otherwise, it is set in the state of high impedance, the circuit arrangement is not limited thereto. It is also possible to use a circuit in which the output of the additional information storage unit is not set in the state of high impedance. Although the additional information storage unit of the present embodiment is also composed of a fuse element, it may be composed of a storage device such as a SRAM.

(Tenth Embodiment)

Figure 33:
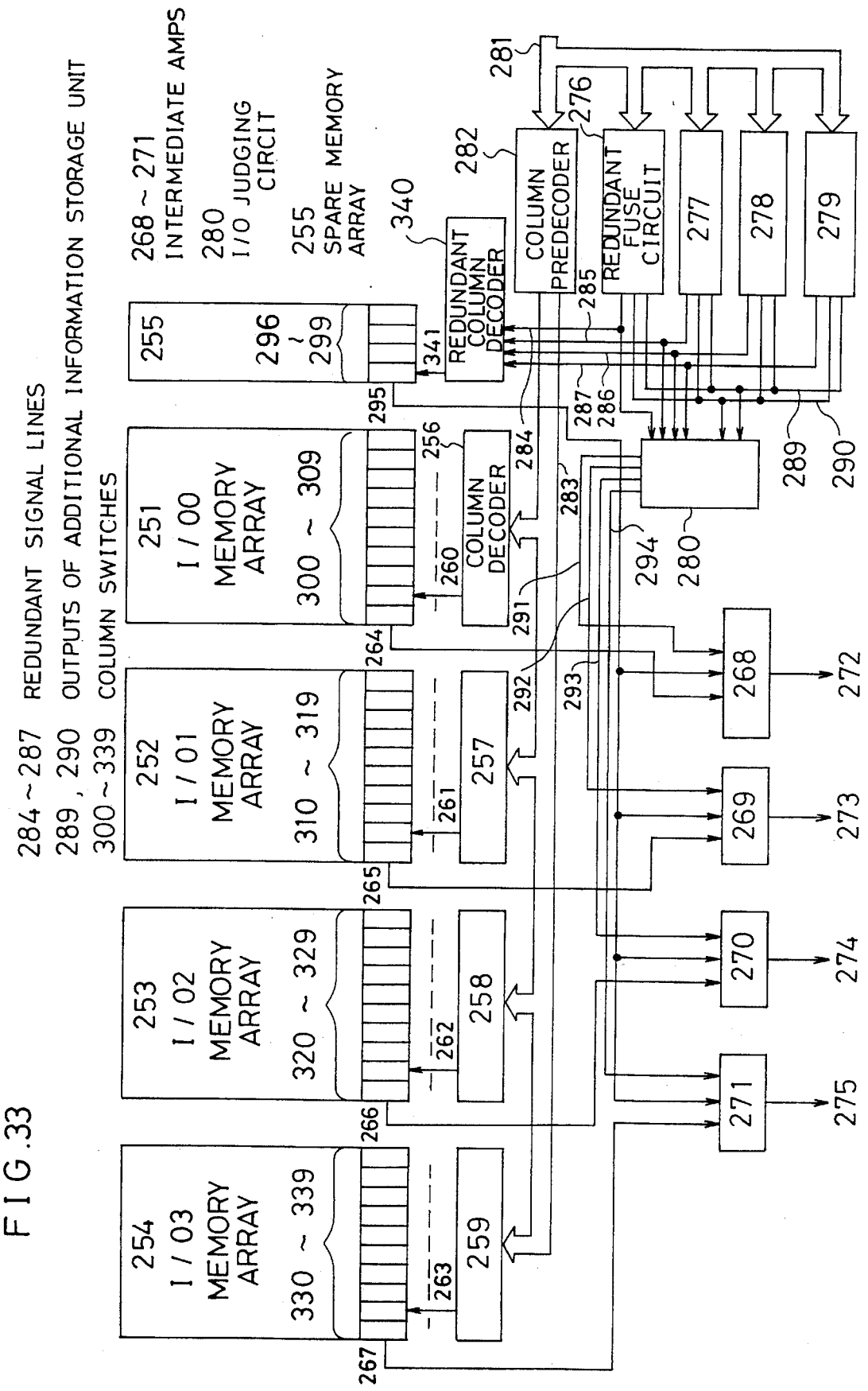
FIG. 33 is a schematic view of a DRAM of 4-bit configuration according to a tenth embodiment of the present invention.

FIG. 33 is a schematic view of a DRAM of 4-bit configuration according to a tenth embodiment of the present invention. In the drawing are shown a memory cell array 251 for I/O0, a memory cell array 252 for I/O1, a memory cell array 253 for I/O2, a memory cell array 254 for I/O3, a common redundant cell array for I/O0 to I/O3, a column predecoder 282, a column address bus 281, a column predecode signal bus 283, column decoders 256 to 259, column decode signals 260 to 263, redundant fuse circuits 276 to 279 for column addresses composed of the redundant fuse circuits equipped with the additional information storage units described in the ninth embodiment, redundant signal lines 284 to 287, an intermediate amp 268 for I/O0, an intermediate amp 269 for I/O1, an intermediate amp 270 for I/O2, an intermediate amp 271 for I/O3, pairs of data lines 264 to 267 from the memory cell arrays to the intermediate amps in the O's, pairs of data lines 272 to 275 from the intermediate amps to the output circuits (not shown) in the I/O's, column switches 300 to 339, a pair of data lines 295 from the redundant cell array to the intermediate amps 268 to 271, column switches 296 to 299 for the redundant cell array, outputs 289 and 290 of the additional information unit of the redundant fuse circuits 276 to 279 (degenerate address for decoding I/O0 to I/O3), an I/O detecting circuit 280 for decoding the outputs 289 and 290 of the additional information unit and judging the I/O0 to I/O3, output signals 291 to 294 of the I/O detecting circuits 280 (indicating whether or not redundant relief should be performed), a redundant column decoder 340, and a redundant column decode signal 341.

Figure 42:
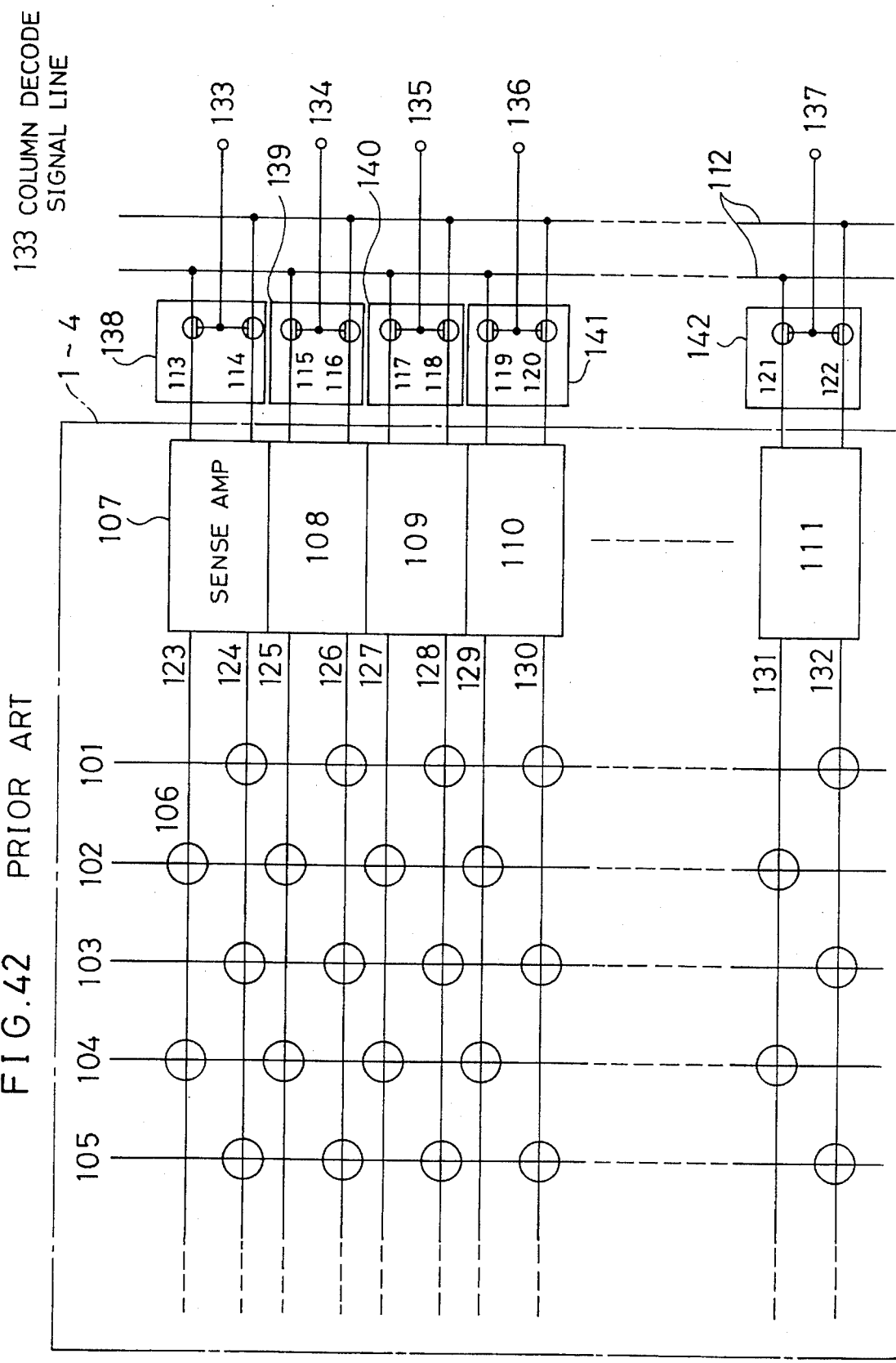
FIG. 42 is an internal schematic view of the memory cell array in FIG. 41.

Below, the operation of the DRAM of 4-bit configuration in the present embodiment of FIG. 33 will be described. The internal structure of the memory cell array 251 to 254 shown in FIG. 33 is the same as that of the conventional embodiment shown in FIG. 42, so that the description thereof will be omitted here. In FIG. 38, the memory cell arrays 251 to 254 are first activated so that data is read out of the memory cell to be amplified. The amplified data is read out onto the pairs of data lines 264 to 267 via the column switches 300 to 339 in each I/O, further amplified by the intermediate amps 268 to 271, and then transferred to the output circuit along the pair of data lines 272 to 275. At this stage, one out of the column switches 300 to 339 is selected in each I/O in response to one of the column decode signals 260 to 263 driven by the column decoders 256 to 259, respectively. As shown in FIG. 42, the column switches are individually connected to bit lines so that the data on the bit line of the selected column address is read out onto the pair of data lines. The selection with the column address is carried out by predecoding the column address inputted via the column address bus 281 in the predecode circuit 282 and transferring its output signal to the column decoders 256 to 259 via the column predecode signal bus 283.

Figure 34:
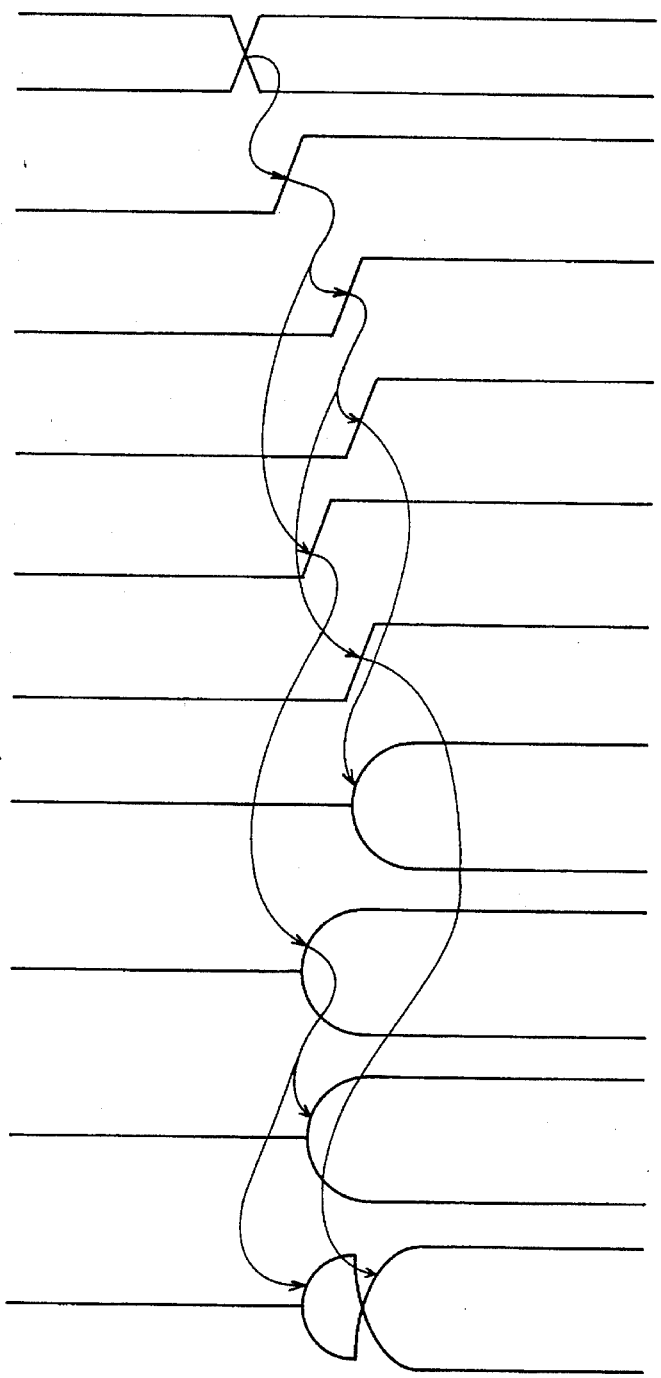
FIG. 34 is an operational waveform chart of the DRAM in FIG. 33.

If the inputted address is under redundant relief, any of the redundant fuse circuits 276 to 279 judges that the inputted address is a redundant address, so that a redundant signal is outputted onto any of the redundant signal lines 284 to 287. If it is assumed that the address which is programmed to be relieved in the redundant fuse circuit 276 is inputted, the redundant address detect signal is outputted onto the redundant signal line 284. Moreover, if it is assumed that the address for decoding the I/O0 (degenerate address for the memory chip) is stored in the additional information storage unit of the redundant fuse circuit 276, upon the outputting of the redundant address detect signal onto the redundant signal line 284, the address for decoding the I/O0 is outputted from the outputs 289 and 290 of the additional information storage unit. Subsequently, the outputs 289 and 290 of the additional information storage unit are decoded in the I/O judging circuit 280 for judging the I/O0 to I/O3, which then generates the output signal 291 indicating that the I/O0 is the I/O to be subjected to redundant relief. The redundant address detect signal outputted onto the redundant signal line 284 is inputted to the redundant column decoder 340, so that the redundant column decode signal 3411 is outputted. The redundant column decode signal 341 selects one from among the redundant column switches 296 to 299, so that the memory cell array, which was activated simultaneously with the normal memory cell arrays, is read out onto the pair of redundant data lines 295 and transferred to the input portions of the intermediate amps 268 to 271. With the memory chip of the present embodiment, data of the memory cell arrays is always read out to the intermediate amps 268 to 271, either in the normal state or in the state of redundant relief. In time of redundant relief, data of the pair of redundant data lines 295 only in the I/O to be relieved is amplified by the intermediate amp to be outputted, while the intermediate amps in the other I/O's are normally operated. In the present embodiment, therefore, only the I/O0 is subjected to redundant relief. The foregoing operation is shown in the timing chart of FIG. 34.

FIG. 35 shows an example of the programs stored in the additional information storage units of the redundant fuse circuits 276 to 279 in the present embodiment. As will be apparent from FIG. 35, the output of the additional information storage unit in the present embodiment is composed of two bits with which four states can be represented, thus distinguishing the I/O0 to I/O3.

Figure 36:
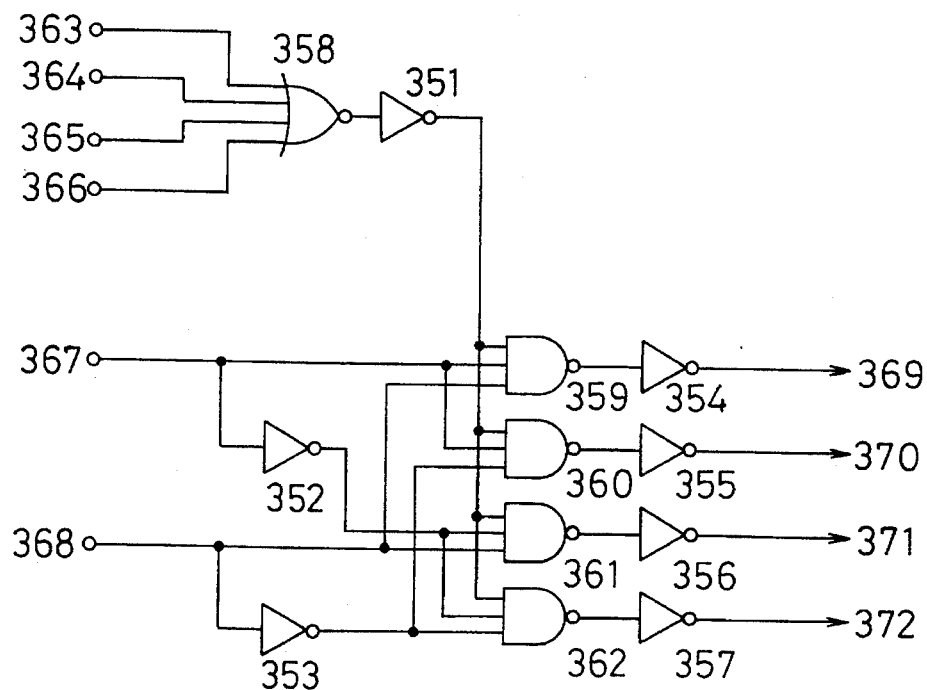
FIG. 36 is a circuit diagram of the I/O detecting circuit in FIG. 33.

FIG. 36 is a specific circuit diagram of the I/O judging circuit 280 in FIG. 33. In the drawing are shown inverter circuits 351 to 357, a 4-input NOR circuit 358, 3-input NAND circuits 359 to 362, a terminal 363 for inputting the redundant signal line 284 of the redundant fuse circuit 276 in FIG. 33 to the I/O judging circuit, a terminal 364 for inputting the redundant signal line 285 of the redundant fuse circuit 277 in FIG. 33 to the I/O judging circuit, a terminal 365 for inputting the redundant signal line 286 of the redundant fuse circuit 278 in FIG. 33 to the I/O judging circuit, a terminal 366 for inputting the redundant signal line 287 of the redundant fuse circuit 279 in FIG. 33 to the I/O judging circuit, a terminal 367 for inputting the outputs 289 of the additional information storage units of the redundant fuse circuits 276 to 279 in FIG. 33 to the I/O judging circuit, a terminal 368 for inputting the output 290 of the additional information storage units of the redundant fuse circuits 276 to 279 in FIG. 33 to the I/O judging circuit, an output terminal 369 for the output signal 291 (indicating that the I/O0 is subjected to redundant relief) of the I/O judging circuit 280 in FIG. 33, an output terminal 370 for the output signal 292 (indicating that the I/O1 performs redundant relief) of the I/O judging circuit 280 in FIG. 33, an output terminal 371 for the output signal 293 (indicating that the I/O2 is subjected to redundant relief) of the I/O judging circuit 280 in FIG. 33, and an output terminal 372 for the output signal 294 (indicating that the I/O3 is subjected to redundant relief) of the I/O judging circuit 280 in FIG. 33.

The operation of the circuit shown in FIG. 36 is as follows: If the redundant address detect signal is inputted to any of the redundant signal lines to be inputted to the input terminals 363 to 366, the I/O judging circuit is activated, and if not, it is not operated. When the I/O judging circuit is active, it operates in the manner described with reference to FIG. 33 and generates an output as shown in FIG. 35. The I/O judging circuit is controlled by the redundant address detect signal because the output of the circuit controls a changeover to and from redundancy and non-redundancy by means of intermediate amps, which will be described below. In other words, if the I/O judging circuit is constantly operated, it follows that data from the pair of data lines is always amplified in any of the I/O's before it is outputted, which is disadvantageous.

Figure 37:
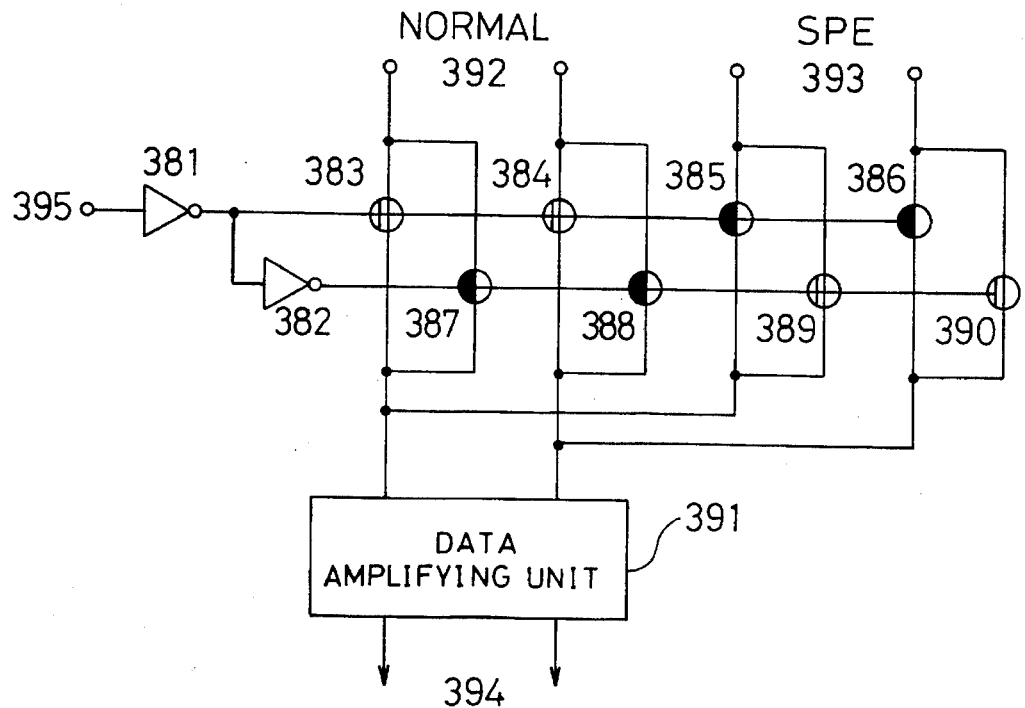
FIG. 37 is a circuit diagram of the intermediate amplifier in FIG. 33.

FIG. 37 is a specific circuit diagram of the intermediate amps 268 to 271 shown in FIG. 33. In the drawing are shown inverters 381 and 382, N-channel MOSFETs 383. 384, 389, and 390, P-channel MOSFETs 385 to 388, a data amplifying portion 391, input terminals 392 of the pair of normal lines, input terminals 393 of the pair of redundant data lines, output terminals 394 of the intermediate amp, and an input terminal 395 of the output signal of the I/O judging circuit 280 in FIG. 33.

The operation of the circuit shown in FIG. 37, which was roughly described with reference to FIG. 33, is controlled by the output signal of the I/O judging circuit 280 in FIG. 33. In the case where the signal is not transmitted (when the I/O to which the intermediate amp belongs to does not need redundant relief), data on the pair of normal lines 392 is amplified to be outputted. Conversely, if the output signal of the I/O judging circuit is transmitted, data on the pair of redundant data lines is amplified to be outputted.

As shown in the present embodiment, if the redundant fuse circuit having a unit for storing additional information of the ninth embodiment is used for constituting a memory chip of multi-bit configuration, a redundant circuit which is highly efficient can be obtained. That is, in the structure using the conventional redundant fuse circuit, it was impossible for the different I/O's to use the redundant fuse circuit and redundant memory cell array in common, for the I/O's could not be distinguished from each other (due to the degenerate addresses). Therefore, each I/O should have a necessary redundant fuse circuit and redundant memory cell array of its own. However, by using the redundant fuse circuit having a unit for storing additional information, information for identifying the I/O to be relieved can be stored in the address inputted as the additional information (the degenerate address can be associated). Consequently, it becomes possible for the different I/O's to use the redundant fuse circuit and redundant memory cell array in common, so that the redundant circuit which is highly efficient can be obtained. The table in FIG. 38 shows the effect.

FIG. 38 shows the number of relievable faults per I/O with respect to the total number of redundant fuses per chip in each of the prior art and present invention. If a conventional memory of 16-bit configuration having sixteen redundant fuses is compared with a memory of 16-bit configuration having sixteen redundant fuses of the present invention, only one fault can be relieved in each I/O of the conventional memory, while sixteen faults at most can be relieved in each I/O of the memory of the present invention. However, the total number of relievable faults per chip is 16, since the chip has the sixteen fuses in all. This indicates that the redundant circuit of the present invention has extremely high efficiency compared with the redundant circuit of the prior art. Moreover, it is apparent from FIG. 38 that the circuit of the present embodiment exerts a larger effect as the circuit of the present embodiment is configured with a larger number of bits.

Although the present embodiment has described the DRAM of multi-bit configuration as an example of the address degenerate memory, the present invention is also applicable to other types of address degenerate memories such as a memory provided with a S/P (serial to parallel) converting circuit or with a P/S (parallel to serial) converting circuit.

(Eleventh Embodiment)

Figure 39:
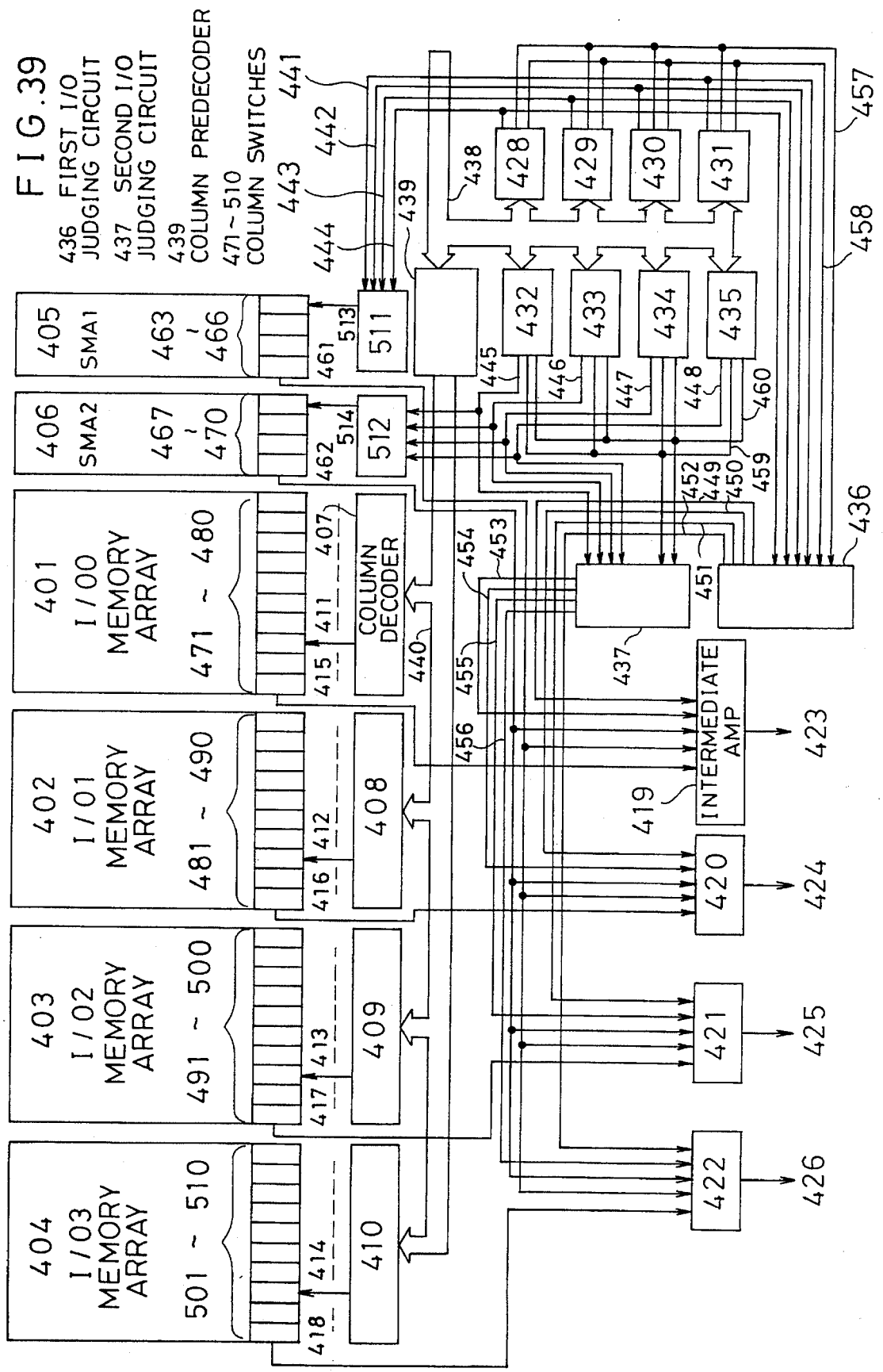
FIG. 39 is a schematic view of a DRAM of 4-bit configuration according to an eleventh embodiment of the present invention.

FIG. 39 is a schematic view of a DRAM of 4-bit configuration serving as an eleventh embodiment of the present invention. In the drawing are shown a memory cell array 401 for I/O0, a memory cell array 402 for I/O1, a memory cell array 403 for I/O2, a memory cell array 404 for I/O3, a first common redundant cell array 405 for I/O0 to I/O3, a second common redundant cell array 406 for I/O0 to I/O3, a column predecoder 439, a column address bus 438, a column predecode signal bus 440, column decoders 407 to 410, column decode signals 411 to 414, redundant fuse circuits 428 to 435 for column addresses having additional information storage units described in the ninth embodiment, redundant signal lines 441 to 448, an intermediate amp 419 for I/O0, an intermediate amp 420 for I/O1, an intermediate amp 421 for I/O2, an intermediate amp 422 for I/O3, pairs of data lines 415 to 418 from the memory cell arrays to the intermediate amps in the I/O's, pairs of data lines 423 to 426 from the memory cell arrays to the output circuits (not shown) in the I/O's, column switches 471 to 510, a pair of data lines 461 from the first redundant cell array to the intermediate amps 419 to 422, a pair of data lines 462 from the second redundant cell array to the intermediate amps 419 to 422, column switches 463 to 470 for the redundant cell array, outputs 457 and 458 of the additional information units of the redundant fuse circuits 428 to 431 (degenerate address for decoding the I/O0 to I/O3), outputs 459 and 460 of the additional information units of the redundant fuse circuits 432 to 435 (degenerate address for decoding the I/O0 to I/O3), a first I/O Judging circuit 436 for decoding the outputs 457 and 458 of the additional information units and judging the I/O0 to I/O3, a second I/O judging circuit 437 for decoding the outputs 459 and 460 of the additional information units and judging the I/O0 to I/O3, output signals 449 to 452 of the first I/O judging circuit 436 (indicating which I/O, among the I/O0 to I/O3, is subjected to redundant relief), output signals 453 to 456 of the second I/O judging circuit 437, a column decoder 511 for the first redundant cell array, a column decoder 512 for the second redundant cell array, a column decode signal 513 for the first redundant cell array, and a column decode signal 514 for the second redundant cell array.

The DRAM of 4-bit configuration thus constituted in the present embodiment will be described below. The present embodiment is obtained by further adding an independent redundant memory array to the DRAM in the tenth embodiment. The DRAM in the tenth embodiment has only one pair of data lines extending from the redundant array, so that, if two I/O's suffer faults simultaneously with respect to the inputted address, it is impossible to relieve them. In view of the foregoing, the present embodiment presents a semiconductor memory in which redundant relief can be achieved even when two I/O's suffer faults simultaneously. As described above, since the present embodiment has each redundant-type circuit in two systems (including the redundant memory cell array, redundant fuse circuit, pair of redundant data lines, column decoder for a redundant memory cell array, and I/O judging circuit), redundant relief can be achieved with respect to faults lying at different I/O's at the same address by executing the program stored in the redundant fuse circuit so that the redundant address detect signal is generated with respect to the same address and by storing a degenerate address designating different I/O's in the additional information storage units, respectively. The circuit structure of the present embodiment is substantially the same as that of the tenth embodiment, except for the intermediate amps.

Figure 40:
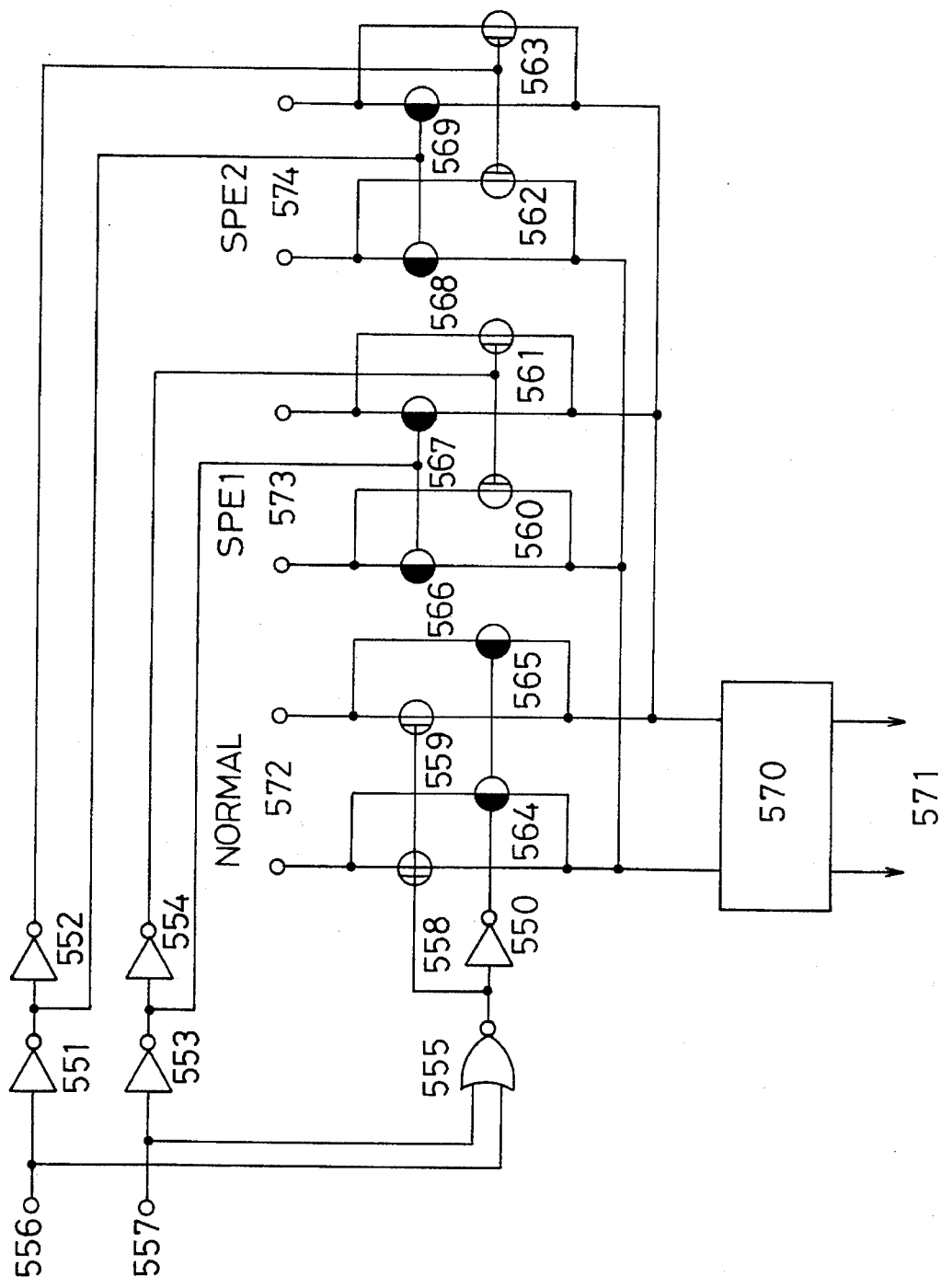
FIG. 40 is a circuit diagram of the intermediate amplifier in FIG. 39.
Figure 41:
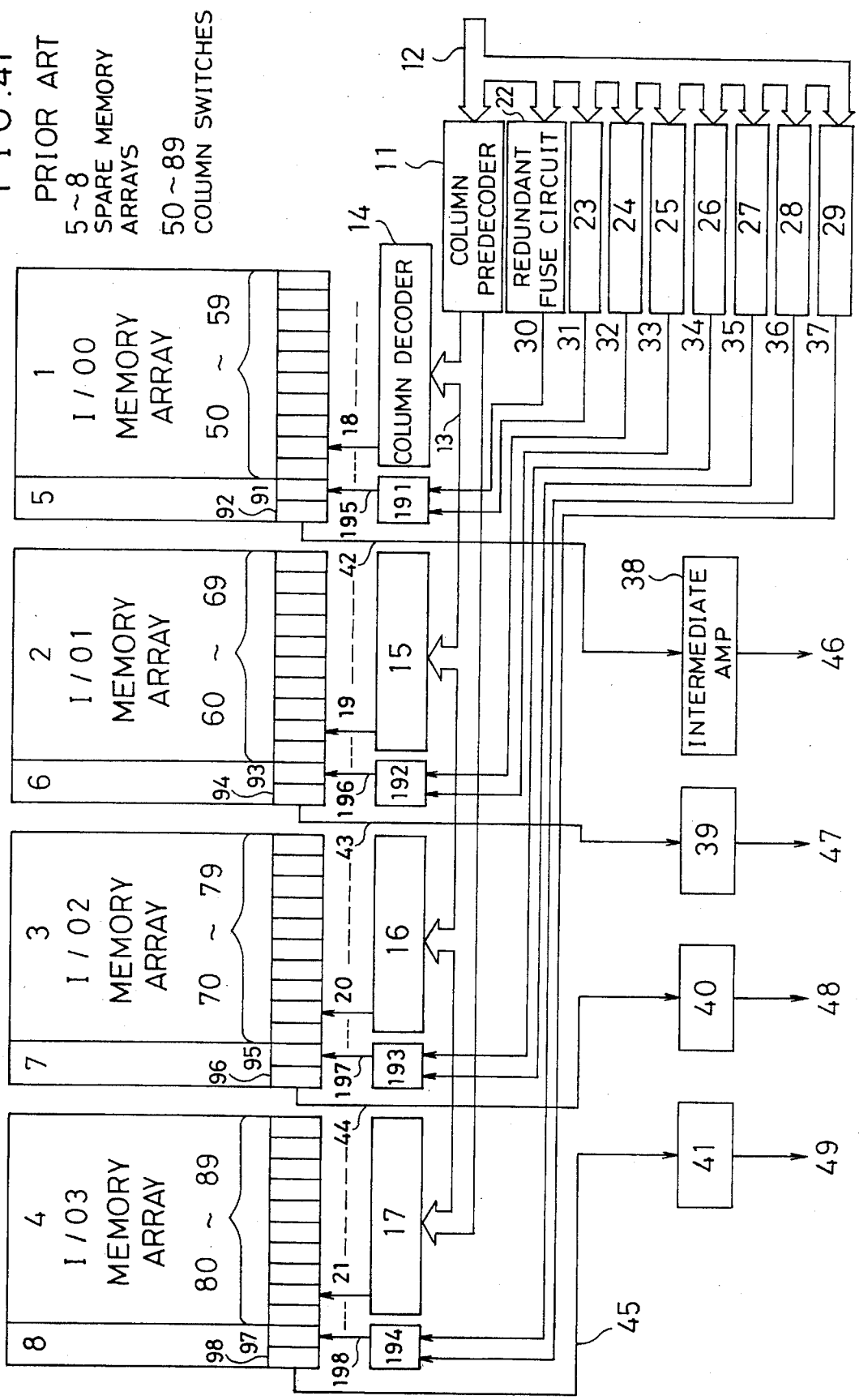
FIG. 41 is a schematic view of a conventional DRAM of 4-bit configuration.

FIG. 40 shows a specific circuit diagram of the intermediate amps 419 to 422 shown in FIG. 39. In FIG. 40 are shown inverters 550 to 554, a 2-input NOR circuit 555, N-channel MOSFETs 558 to 563, P-channel MOSFETs 564 to 569, a data amplifying unit 570, input terminals 572 of a pair of normal data lines, input terminals 573 of a pair of data lines for a first redundant memory cell array, input terminals 574 of a pair of data lines for a second redundant memory cell array, output terminals 571 of the intermediate amp, an input terminal 556 for the output signal of the first I/O judging circuit 436 in FIG. 39, and an input terminal 557 for the output signal of the second I/O judging circuit 437 in FIG. 39.

The operation of the circuit shown in FIG. 40 is roughly the same as the operation described with reference to FIG. 37, except that the operation of the circuit shown in FIG. 40 is controlled by two control signals, which are the output signal of the first I/O judging circuit 436 and the output signal of the second I/O judging circuit 437 in FIG. 39. In the case where either of the output signals is not transmitted (when the I/O to which the intermediate amp belongs to does not need redundant relief), data from the pair of normal lines 572 is amplified to be outputted. Conversely, if the output signal is transmitted from either of the two I/O judging circuits, either data on the pair of data lines 573 from the first redundant memory cell or data on the pair of data lines 574 from the second redundant memory cell is amplified by the data amplifying unit 570, so as to be outputted.

With the foregoing structure, it becomes possible to achieve redundant relief even when two I/O's suffer faults simultaneously. To relieve three or four I/O's suffering from faults simultaneously at the same address, it is sufficient to add more independent redundant circuits in the same manner as shown in the present embodiment.

Although the present embodiment has described the DRAM of 4-bit configuration, similar effects can be obtained from a memory configurated with a larger number of bits by providing the same structure therein.

(Twelfth Embodiment)

Figure 45:
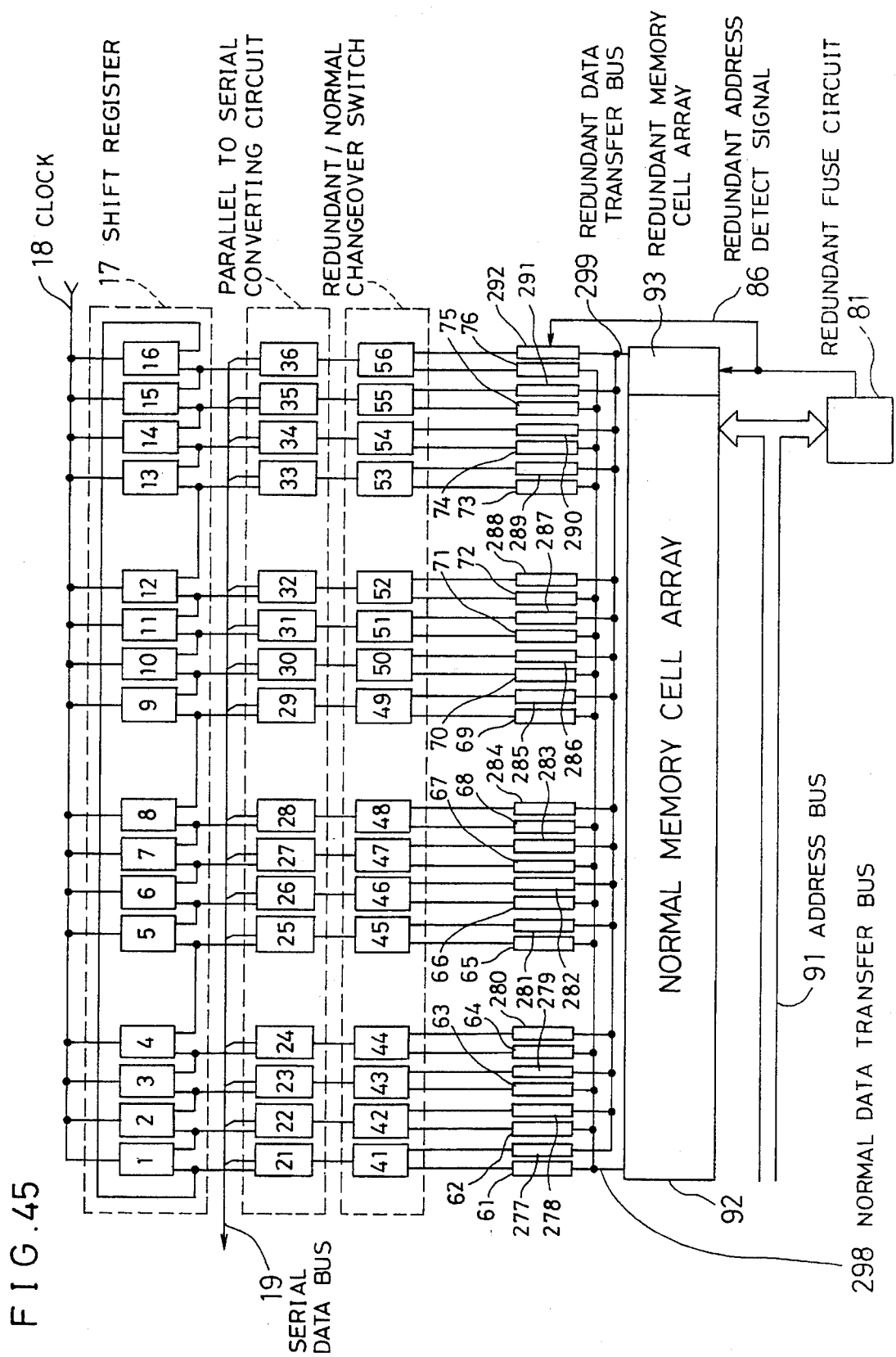
FIG. 45 is a schematic view of a memory having a serial port according to a twelfth embodiment of the present invention.

FIG. 45 is a schematic view of a memory having a serial port in a twelfth embodiment of the present invention. In the drawing are shown a shift register 17, individual stages 1 to 16 of the shift register 17, a clock 18 for controlling the shift register 17, a serial data bus 19, P/S converting circuits 21 to 36, redundant/normal changeover switches 41 to 56, amplifier circuits 61 to 76 for normal data, amplifier circuits 277 to 292 for redundant data, a redundant memory cell array 93, a normal memory cell array 92, a redundant fuse circuit 81, a redundant address detect signal 86, an address bus 91, a normal data transfer bus 298, and a redundant data transfer bus 299.

Figure 46:
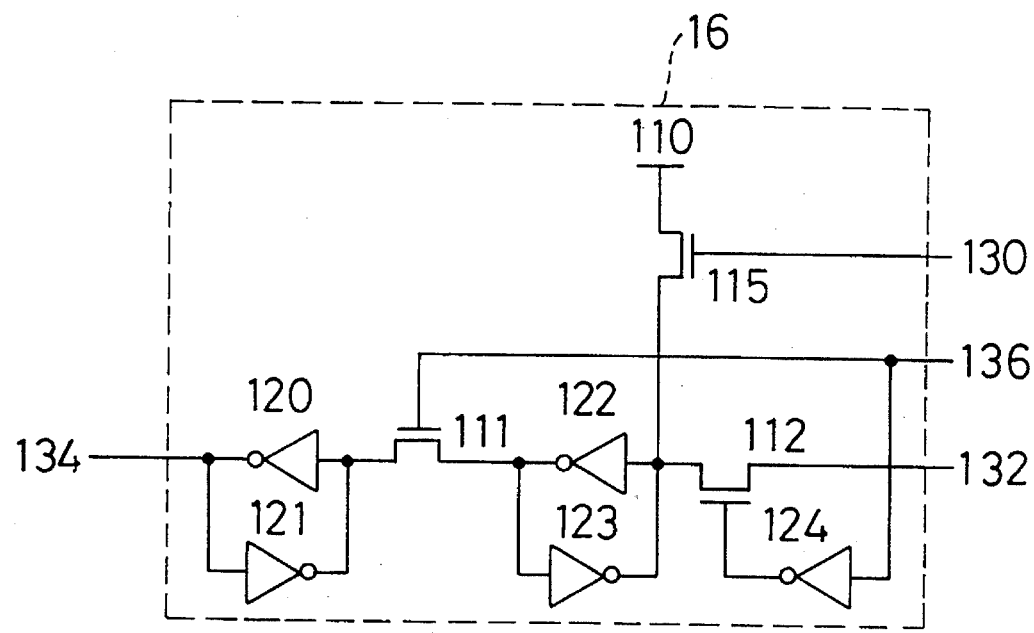
FIGS. 46A and 46B are circuit diagrams showing different stages of the shift register in FIG. 45.
Figure 46:
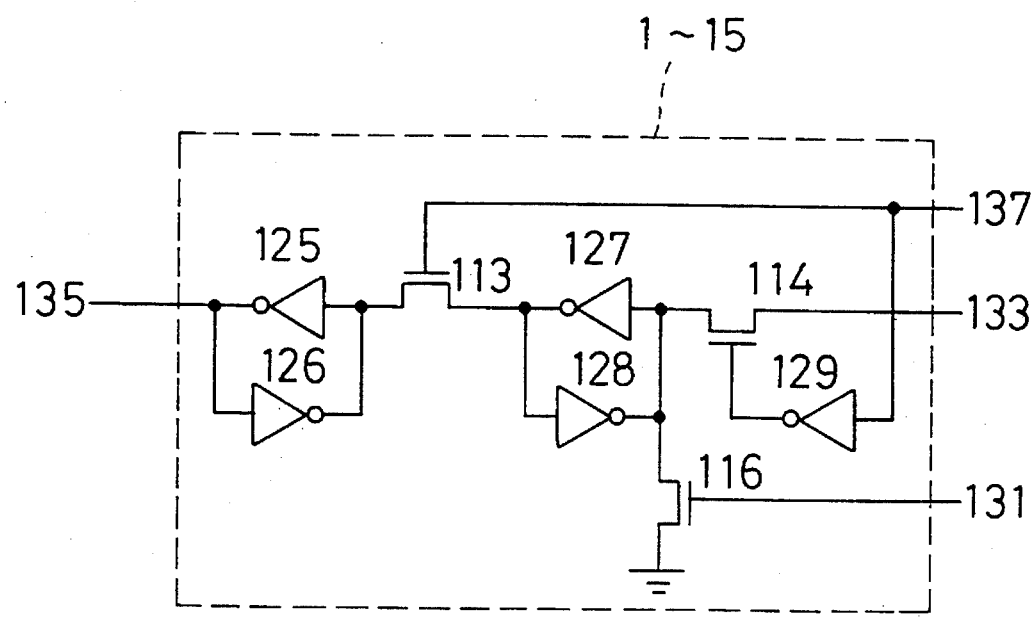
Figure 47:
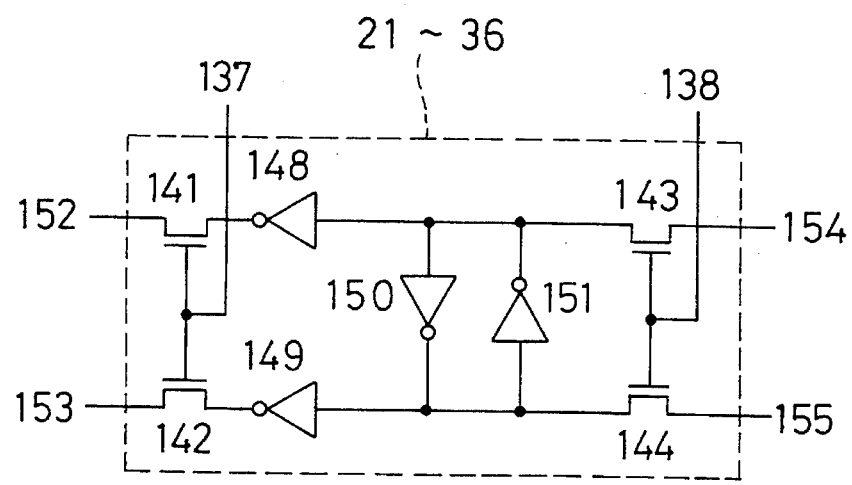
FIG. 47 is a circuit diagram of the parallel to serial converting circuit in FIG. 45.
Figure 48:
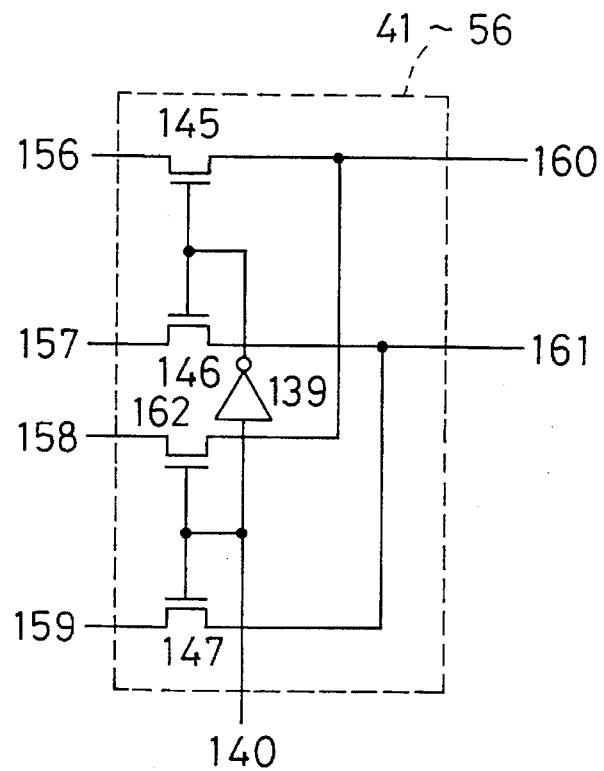
FIG. 48 is a circuit diagram of the redundant/normal changeover circuit in FIG. 45.

FIG. 46B shows a circuit diagram of the fifteen stages 1 to 15 of the shift register 17 and FIG. 46B shows a circuit diagram of the remaining one stage 16 of the shift register 17. FIG. 47 shows a circuit diagram of the P/S converting circuits 21 to 36 and FIG. 48 shows a circuit diagram of the changeover switches 41 to 56. In the drawing are shown a first power supply 110, N-channel MOSFETs 111 to 116 and 141 to 147, inverters 120 to 129, 139, and 148 to 151, reset signals 130 and 131, input terminals 132 and 133, output terminals 134 and 135, a latch signal 138, output control signals 136 and 137, input terminals 154 and 155, output terminals 152 and 153, a redundant address detect signal 140, input terminals from a normal memory cell array 156 and 157, input terminals from a redundant memory cell array 158 and 159, and output terminals 160 and 161.

Below, the operation of the memory having a serial port thus constituted will be described with reference to FIG. 45. Data of the memory cell selected by the address inputted from the address bus 91 is read out of the normal cell array 92, so as to be amplified by the amplifier circuits 81 to 78 for normal data. After that, the amplified data is transferred to the P/S converting circuits 21 to 36, where it is subjected to a P/S conversion. The resulting data is then transferred to an output circuit (not shown) via the serial data bus 19. If the inputted address contains a failed memory cell, the redundant address detect signal 86 is outputted from the redundant fuse circuit 81. Under the control of the signal, correct data is read out of the redundant memory cell array 93 so as to be amplified by the amplifier circuits 277 to 292 for redundant data. Thereafter, the redundant/normal changeover switches 41 to 56 replace the data read out of the normal memory cell array 92 with the amplified correct data, which is then transferred to the P/S converting circuits 21 to 36, so that the correct data is transferred to the output circuit.

Figure 49:
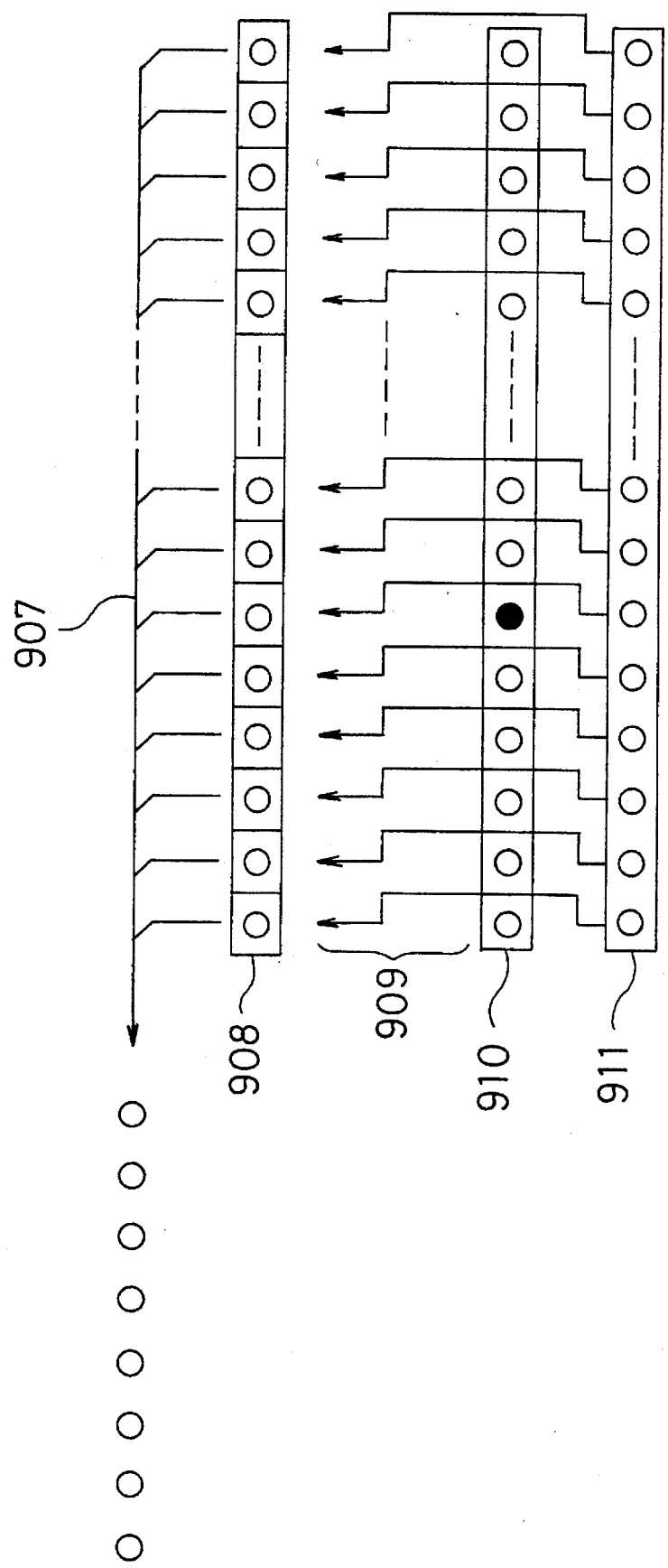
FIG. 49 is a view diagrammatically showing the operation of the memory in FIG. 45.

FIG. 49 is a view diagrammatically showing the foregoing operation. In the drawing are shown a redundant memory cell 911, a serial data bus 907, a P/S circuit 908, a parallel data bus 909, and a normal memory cell 910. Here, ○ and ● designate normal data and faulty data, respectively. In FIG. 49, it is assumed that faulty data exists in the normal memory cell 910 (the faulty data is the sixth one from left). In this case, data is read out of the redundant memory cell 911 to the P/S circuit 908 via the parallel data bus 909, since the redundant memory cell 911 has no faulty data. By sequentially reading data onto the serial data bus 907 thereafter, a P/S conversion is performed, so that data is read out at a high speed.

As described above, the changeover to redundant data is performed on the parallel data bus which transfers data at a low speed. Consequently, the memory can operate properly in the case of serial output at a high speed. Hence, it can be concluded that the redundant structure is appropriate for the memory having a serial port.

(Thirteenth Embodiment 13)

In the structure of the twelfth embodiment, if 16-bit parallel data includes at least 1-bit faulty data, all the 16-bit data must be replaced with data from the redundant memory cell array. Although the parallel data obtained in the twelfth embodiment consists of 16 bits, it may consist of 32 bits or 64 bits in other cases. As the number of bits constituting the data increases, the number of memory cells relieved uselessly also increases, so that relief efficiency is reduced. Consequently, the area occupied by the redundant memory cell array is increased and hence the chip size becomes larger. If the chip area is increased, the number of chips obtained from one wafer is reduced accordingly, resulting in a lower production yield, which renders the provision of the redundant circuit ineffective. The thirteenth embodiment has been achieved to overcome the problem.

Figure 50:
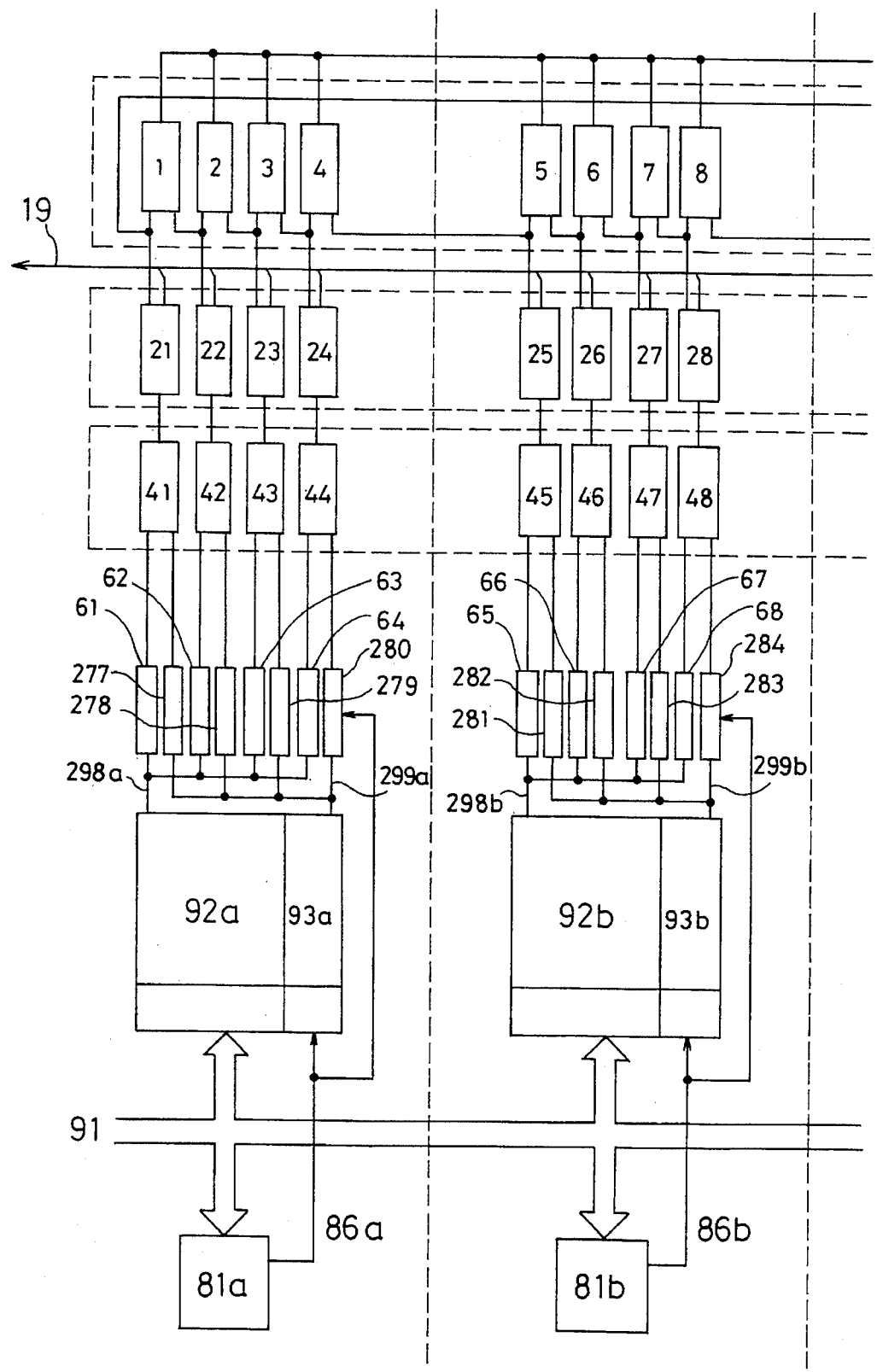
FIGS. 50A and 50B are schematic views of a memory having a serial port according to a thirteenth embodiment of the present invention.
Figure 50:
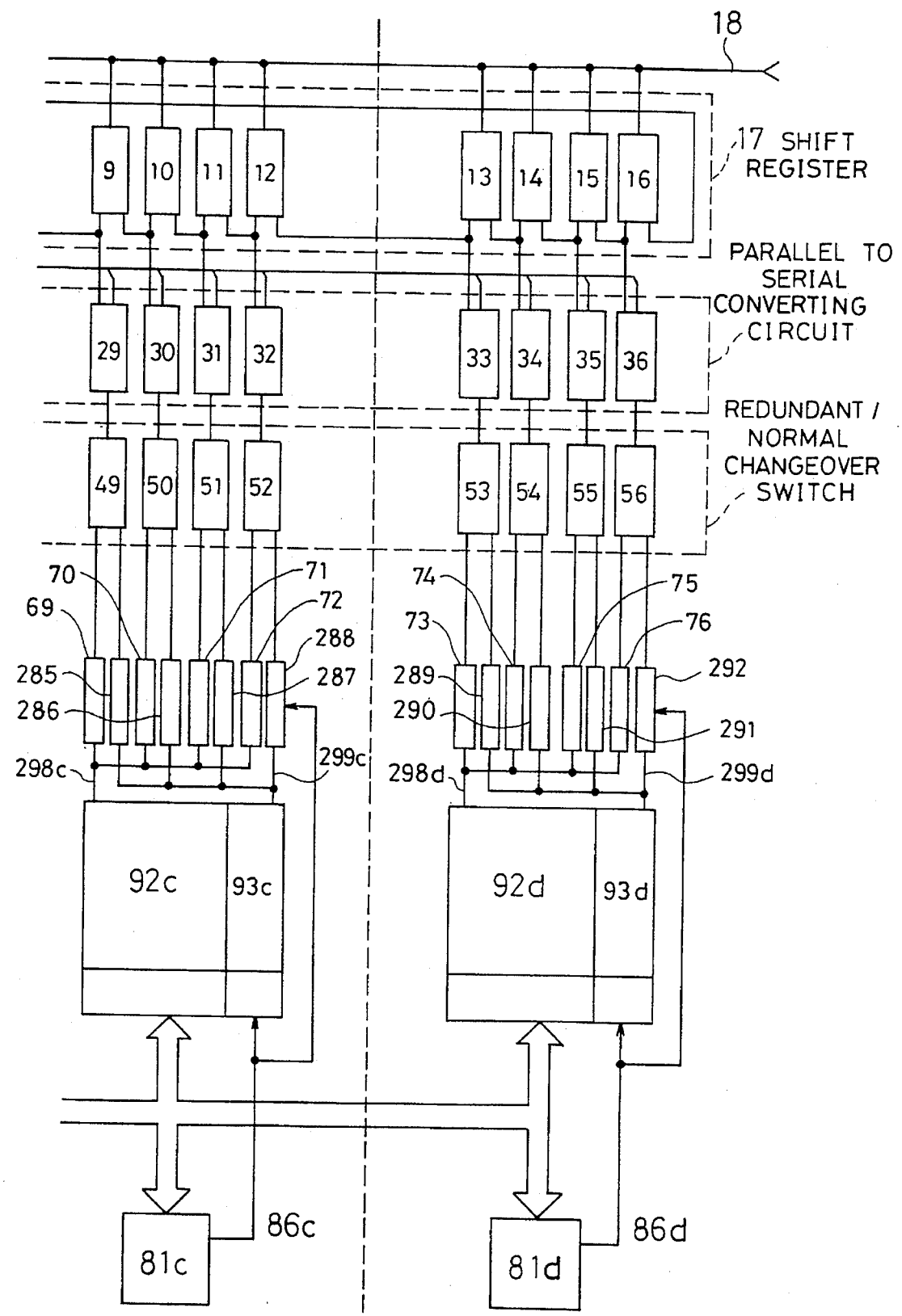

FIGS. 50A and 50B are schematic views of a memory having a serial port in the thirteenth embodiment of the present invention. In the drawing, the detailed description of components having the same functions as in FIG. 45 will be omitted by providing the same reference numerals. In FIGS. 50A and 50B, the P/S circuits divided into four clusters and the memory cell array similarly divided into four sections form four groups. Each group comprises a fuse circuit, so that redundant relief can be executed independently of other groups.

The operation of the memory having a serial port thus constituted in the present embodiment will be described below.

In each of the groups constituted by the P/S circuits divided into four clusters and the memory cell array similarly divided into four sections, data of the memory cell selected by the address inputted from the address bus 91 is read out of the normal memory cell arrays 92a to 92d, so as to be amplified by the amplifier circuits 61 to 76 for normal data. After that, the amplified data is transferred to the P/S circuits 21 to 36, where it is subjected to a P/S conversion, so as to be transferred to the output circuits via the serial data bus 19. If the inputted address contains a failed memory cell, any or all of the redundant fuse circuits 81a to 81d output any or all of the redundant address detect signals 86a to 86d. Under the control of the signal or signals, correct data is read out of any or all of the redundant memory cell arrays 93a to 93d, so as to be amplified by any or all of the amplifier circuits 277 to 292 for redundant data. Thereafter, any or all of the redundant/normal changeover switches 41 to 56 replace the data read out of the normal memory cell arrays 92a to 92d with the amplified correct data, which is then transferred to the P/S converting circuits 21 to 36, so that the correct data is transferred to the output circuits.

Figure 51:
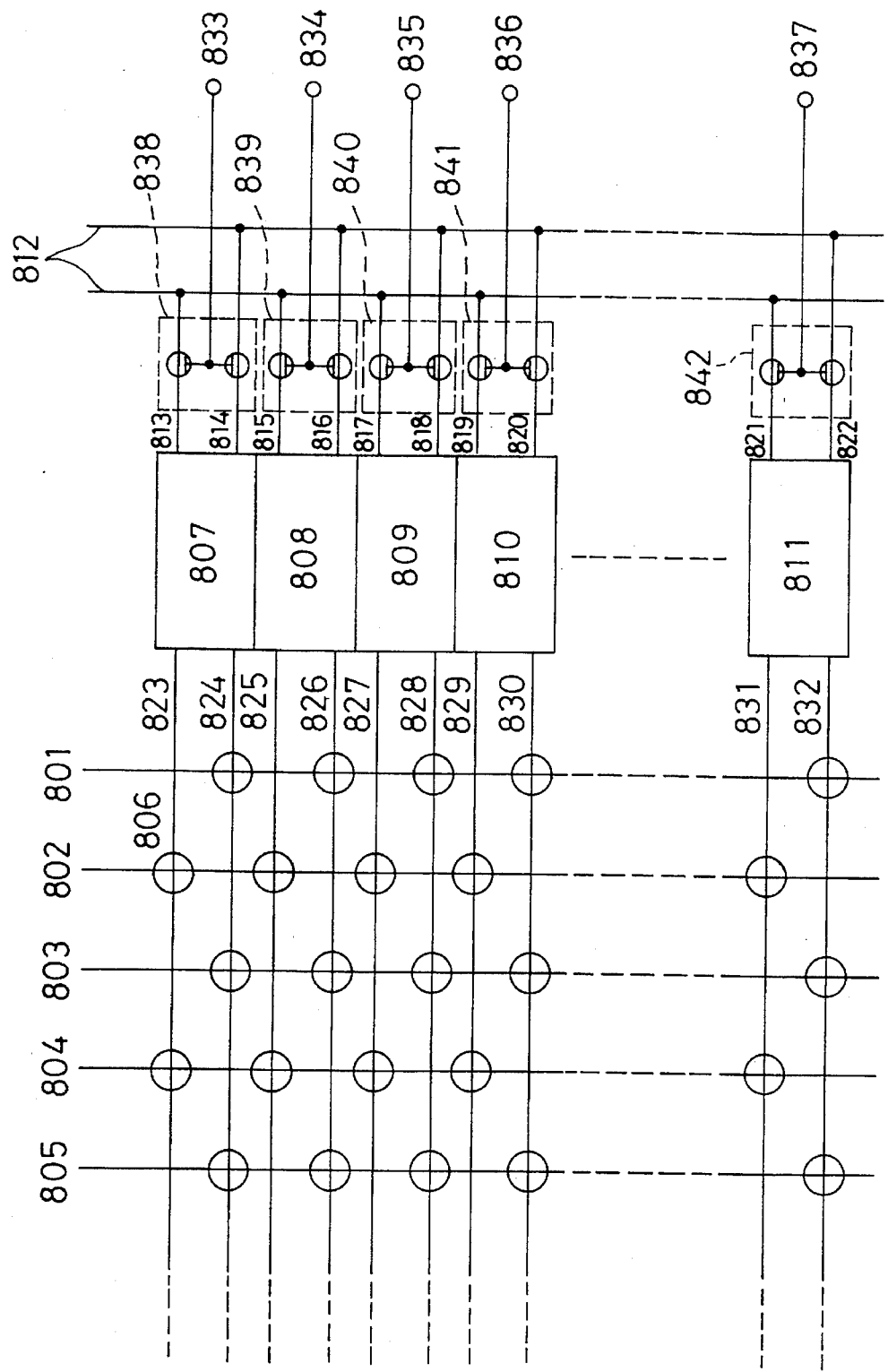
FIG. 51 is a schematic view of the inside of the memory array in FIGS. 50A and 50B.

The memory cell array 92a to 92d are illustrated in detail in FIG. 51. As for its operation, one out of column switches 838 to 842 constituted by N-channel MOSFETs 813 to 822 is selected in each memory cell array in response to one of column decode signals 833 to 837 which are individually driven by column decoders (not shown) in the respective memory cell arrays. The column switches are connected to bit lines 823 to 832 individually, so that data of the bit line of the selected column address (one of the plurality of sets of data obtained by initially activating one of the word lines 801 to 805 so that data transmitted from a plurality of memory cells 806 connected to the word lines via bit lines 823 to 832 is amplified by sense amps 807 to 811) is read out onto the a pair of data lines 812. The pair of data lines shown in FIG. 51 correspond to the data buses 298 and 299 in FIGS. 50A and 50B. Since the groups shown in FIGS. 50A and 50B cannot be distinguished from each other by their column address, the column decode signal operate similarly in each group. However, since they have different fuses, the column decode signal in the redundant memory cell array operates independently in each group.

Figure 52:
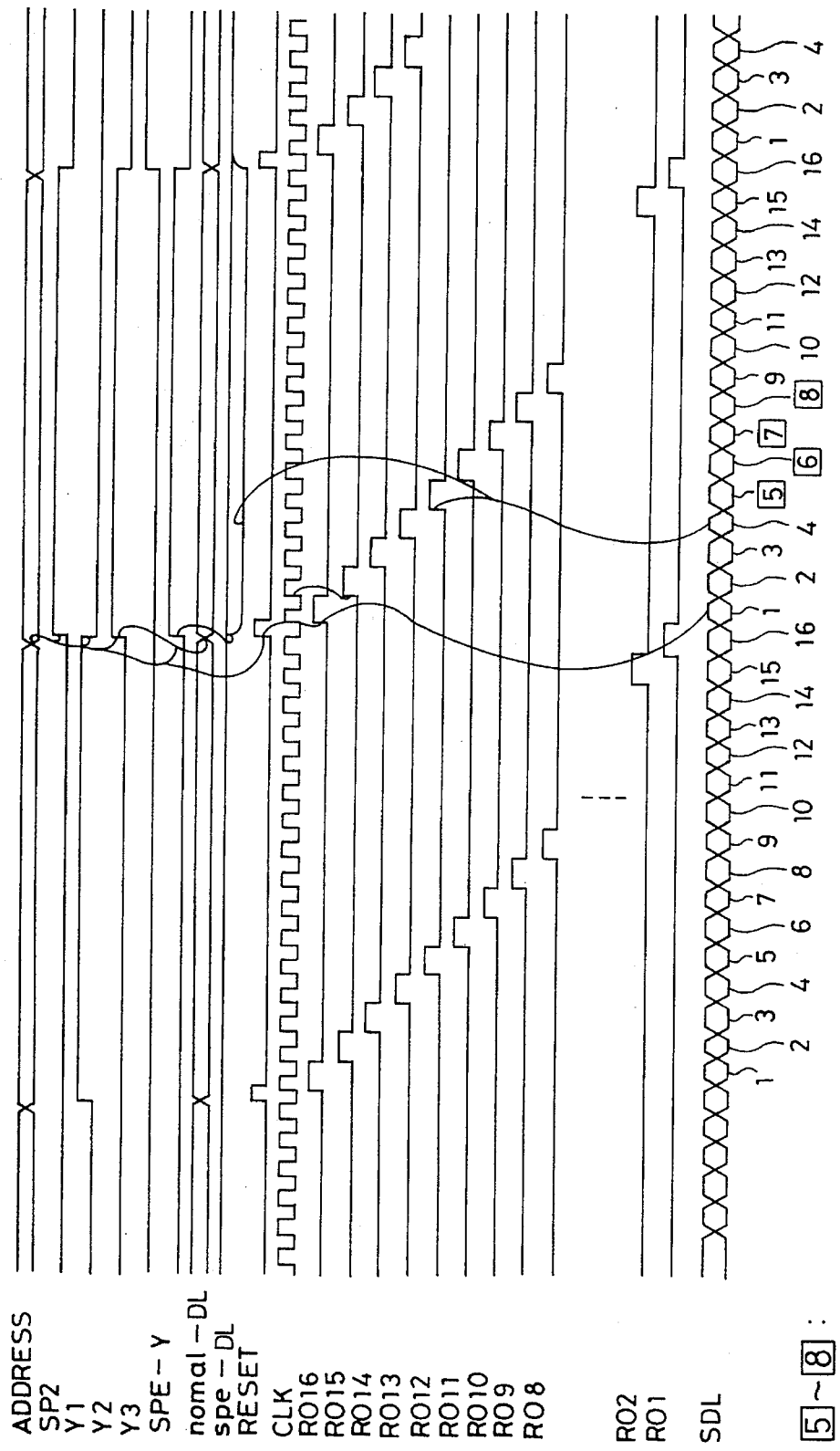
FIG. 52 is an operational waveform chart of the memory in FIGS. 50A and 50B.

FIG. 52 is a timing chart showing the foregoing operation. In the drawing are shown ADDRESS indicating the operation of the address bus 91 in FIGS. 50A and 50B, SP2 indicating the redundant address detect signal 86 in FIGS. 50A and 50B, and Y1, Y2, Y3, and SPE-Y which correspond to the column decode signals 833 to 837 in FIG. 51. However, the Y1, Y2, and Y3 designate the column decode signals in the normal memory cell array, while the SPE-Y designates the column decode signal in the redundant memory cell array. Likewise, normal-DL designates the pair of data lines 812 in the normal memory cell array, while spe-DL designates the pair of data lines 812 in the redundant memory cell array. In addition, RESET designates a reset signal for the shift register 17, CLK designates the clock 18 for controlling the shift register 17, RO1 to RO16 designate the outputs of the different stages 1 to 16 of the shift register 17, respectively, and SDL shows the operation of the serial data bus 19.

FIG. 52 shows the case in which a faulty bit exists in the normal memory cell array 92c so that correct data is read out of the redundant memory cell array 93c, thus accomplishing a changeover. It can be seen from the drawing that, when the address has changed, the redundant address is detected and data of the normal memory cell array 92c is solely replaced with data of the redundant cell array.

Figure 53:
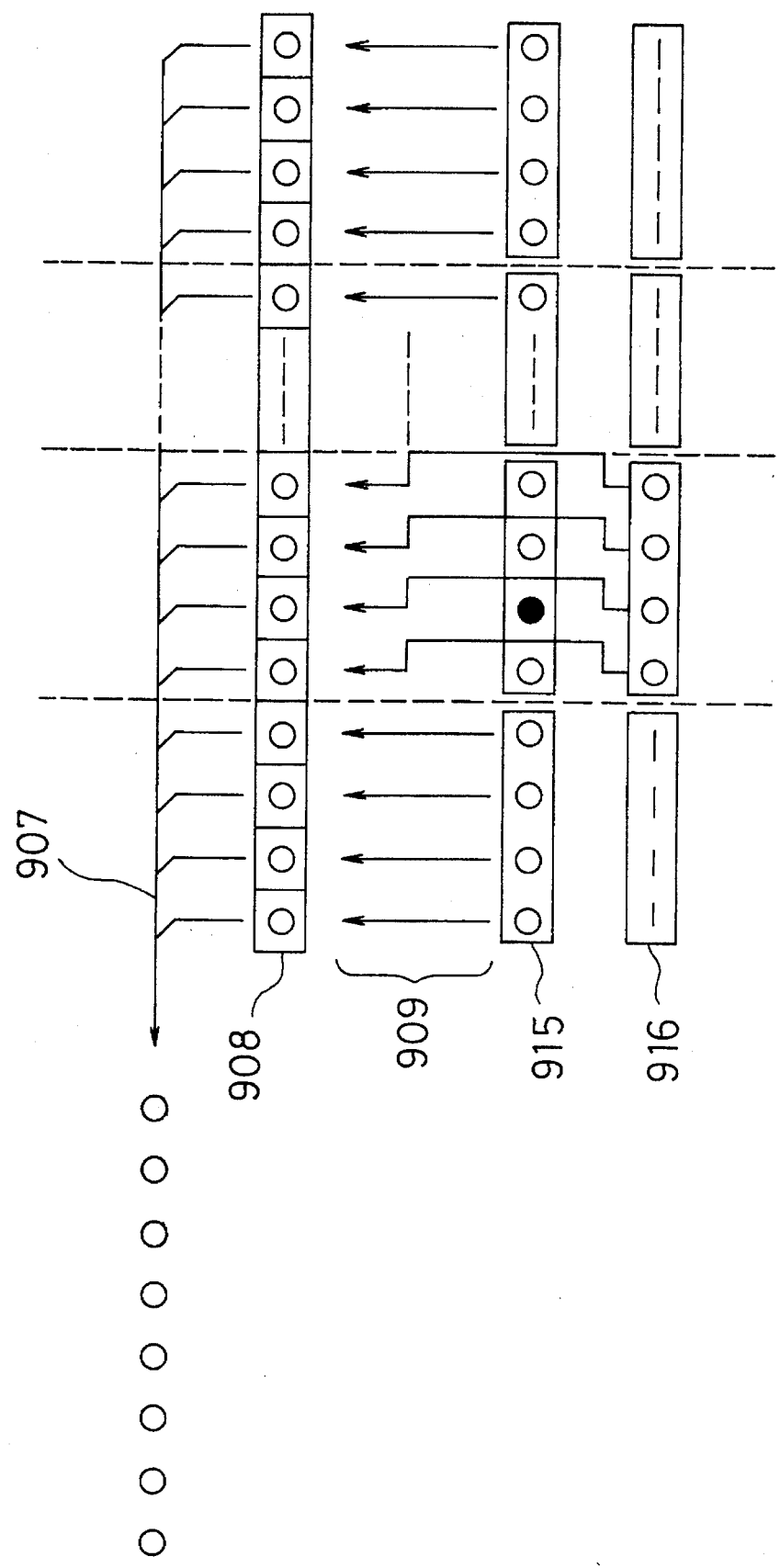
FIG. 53 is a view diagrammatically showing the operation of the memory in FIGS. 50A and 50B.

FIG. 53 is a view diagrammatically showing the foregoing operation. The description of components having the same functions as those in FIG. 49 will be omitted by providing the same reference numerals. In the drawing are shown a redundant memory cell 916 and a normal memory cell 915. Here, o and ● designate normal data and faulty data, respectively.

In FIG. 53, it is assumed that faulty data exists in the normal memory cell 915 (the faulty data is the sixth one from left). In this case, data is read out of the redundant memory cell 916 having no faulty data to the P/S circuit 908 via a parallel data bus 914. However, among four groups constituted by the divided P/S circuit 908, divided normal memory cell 915, and divided redundant memory cell 916, only a group having faulty data is subjected to redundant relief. In other groups, data is read out of the normal memory cell 915, as shown in FIG. 53. By sequentially reading data onto the serial data bus 907 thereafter, similarly to the twelfth embodiment, a P/S conversion is performed, so that data is read out at a high speed.

As described above in the present embodiment, the P/S converting circuits are divided into four clusters and the memory cell array is divided into four sections correspondingly, so that each section of the memory cell array is subjected to redundant relief independently. Consequently, redundant relief can be achieved by a unit smaller than that of a P/S conversion with no distinction by the address, resulting in higher relief efficiency. Compared with the twelfth embodiment in which sixteen bits are relieved together, the present embodiment has improved in that sixteen bits are divided into four groups so that four bits in each group are subjected to simultaneous relief. Consequently, the number of memory cells wasted in redundant relief can be reduced.

(Fourteenth Embodiment)

Below, a fourteenth embodiment of the present invention will be described with reference to the drawings.

Figure 54:
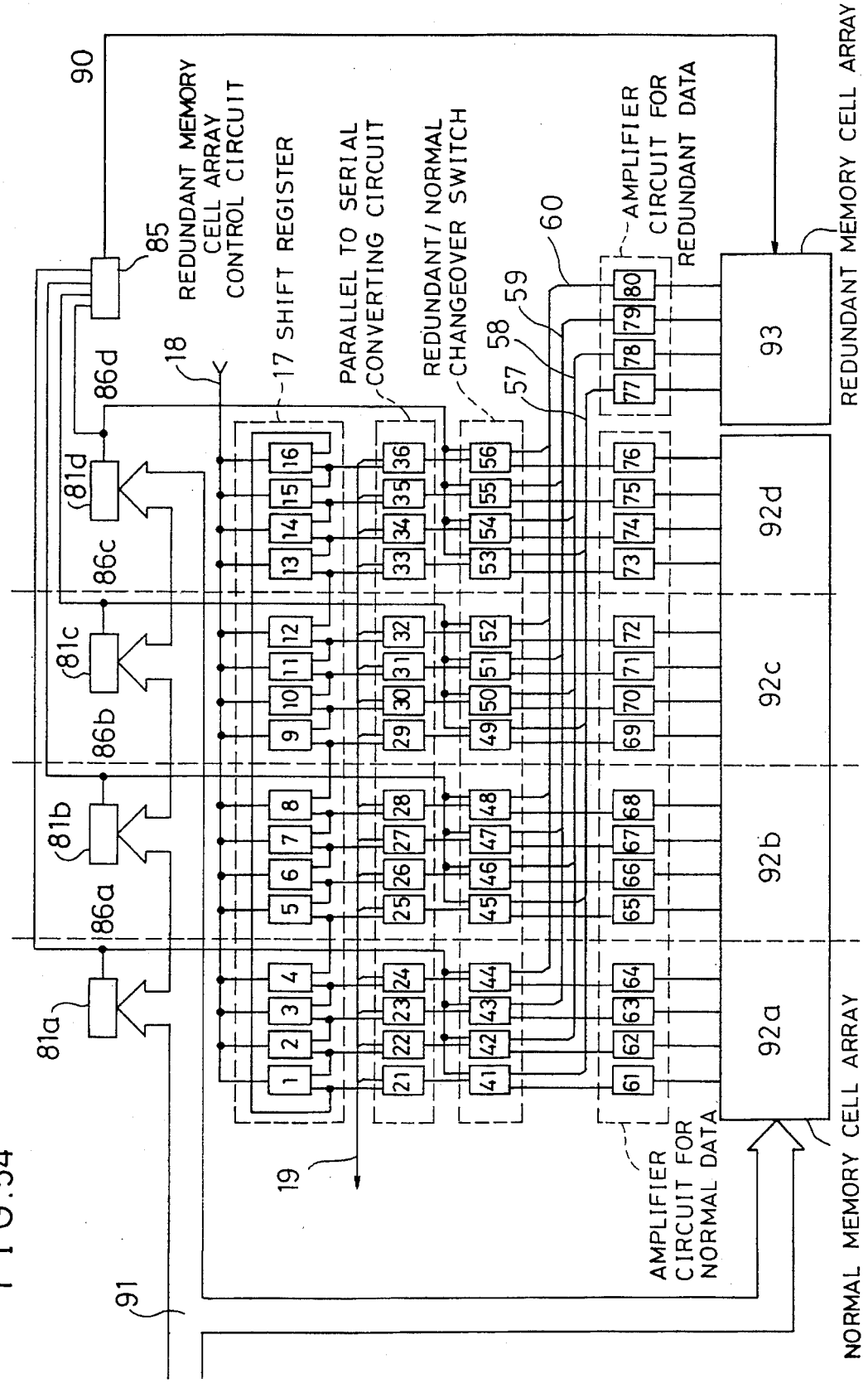
FIG. 54 is a schematic view of a memory having a serial port according to a fourteenth embodiment of the present invention.

FIG. 54 is a schematic view of a memory having a serial port in the fourteenth embodiment of the present invention. In FIG. 54, the description of components having the same functions as in FIG. 45 will be omitted by providing the same reference numerals. In FIG. 54 are shown the amplifier circuits 77 to 80 for redundant data, the redundant memory cell array 93, the normal memory cell arrays 92a to 92d, the redundant fuse circuits 81a to 81d, a redundant memory cell array control circuit 85, the redundant address detect signals 86a to 86d, and redundant data transfer buses 57 to 60. The memory cell arrays 92a to 92d are illustrated in detail in FIG. 51.

As shown in FIG. 54, the P/S converting circuits 21 to 36 are divided into four clusters in the present embodiment. The four memory cell arrays 92a to 92d are obtained by dividing the memory cell array 92 into four sections, similarly to the P/S converting circuits 21 to 36, resulting in the formation of four groups. The groups have the fuse circuits 81a to 81d individually so that each group is independently subjected to redundant relief. The groups use the redundant memory cell array 93 in common. The groups are connected to the redundant memory cell array 93 via the redundant array data transfer buses 57 to 60. Data of the redundant memory cell array 93 is transferred only to the group to be relieved via the redundant/normal changeover switches 41 to 56, so that a P/S conversion is achieved.

Below, the operation of the memory having a serial port thus constituted in the present embodiment will be described with reference to FIG. 54.

In each of the groups constituted by the P/S converting circuits 21 to 36 divided into four and the memory cell array 92 similarly divided into four, data of the memory cell selected by the address inputted from the address bus 91 is read out of the normal memory cell array 92, so as to be amplified by the amplifier circuits 61 to 76. The amplified data is then transferred to the P/S converting circuits 21 to 36, where it is subjected to a P/S conversion. The resulting data is transferred to output circuits via the serial data bus 19. If the inputted address contains a failed memory cell, any of the redundant :fuse circuits 81a to 81d outputs any of the redundant address detect signals 86a to 86d. Under the control of the signal, correct data is read out of the redundant memory cell array 93, so as to be amplified by the amplifier circuits 77 to 80 for redundant data. Thereafter, any of the redundant/normal changeover switches 41 to 56 replaces the data read out of the normal memory cell array 92 onto the redundant data transfer buses 57 to 60 with the amplified correct data, which is then transferred to the P/S converting circuits 21 to 36, so that the correct data is transferred to the output circuit.

Figure 55:
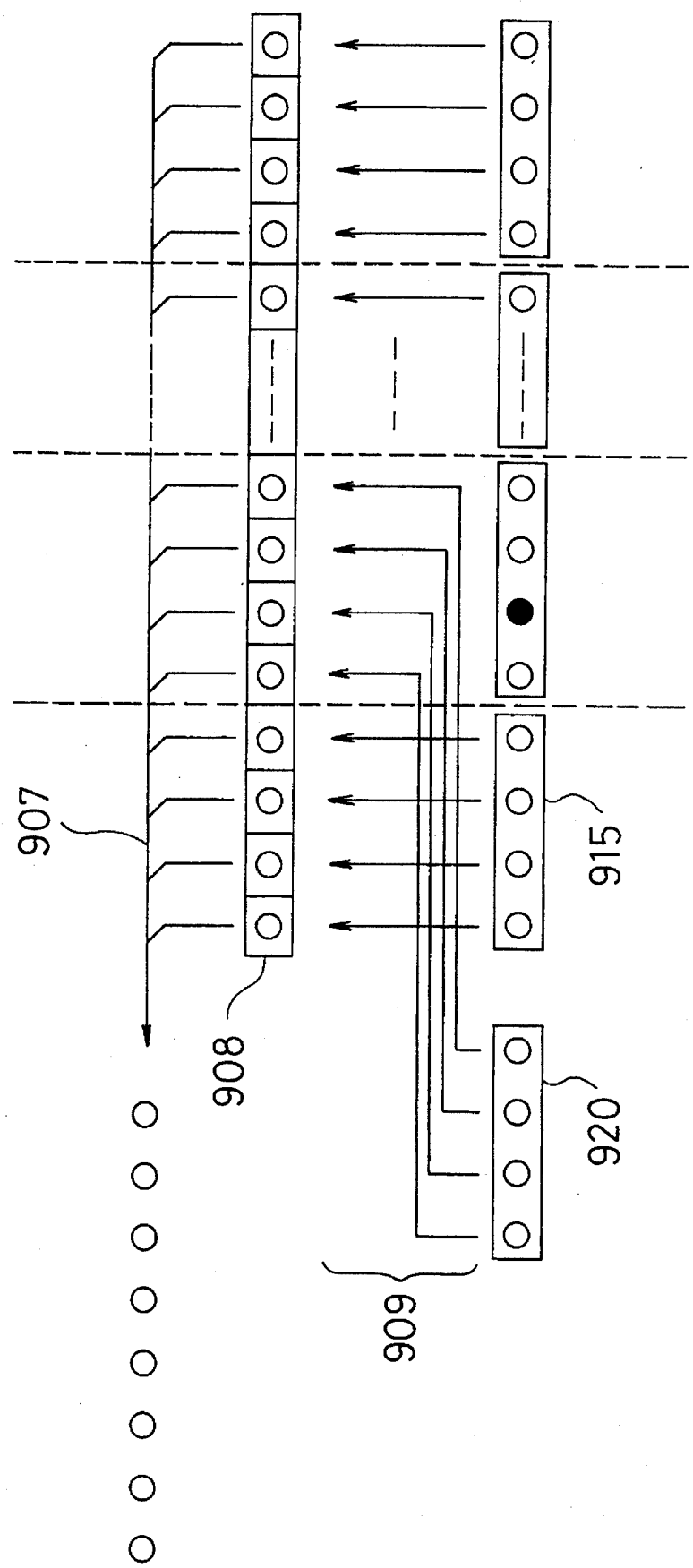
FIG. 55 is a view diagrammatically showing the operation of the memory in FIG. 54.

FIG. 55 is a view diagrammatically showing the foregoing operation. The description of components having the same functions as in FIG. 49 will be omitted by providing the same reference numerals. In the drawing is shown a redundant memory cell 920, and o and ● designate normal data and faulty data, respectively.

In FIG. 55, it is assumed that faulty data exists in the normal memory cell 915 (the faulty data is the sixth one from left). In this case, data is read out of the redundant memory cell 920 having no faulty data to the P/S circuit 908 via the parallel data bus 909. However, among four groups constituted by the divided P/S circuit 908 and divided normal memory cell 915, only a group having faulty data is subjected to redundant relief, as shown in FIG. 55. In other groups, data is read out of the normal memory cell 915. By sequentially reading data onto the serial data bus 907 thereafter, similarly to the twelfth embodiment, a P/S conversion is achieved, so that data is read out at a high speed.

Figure 56:
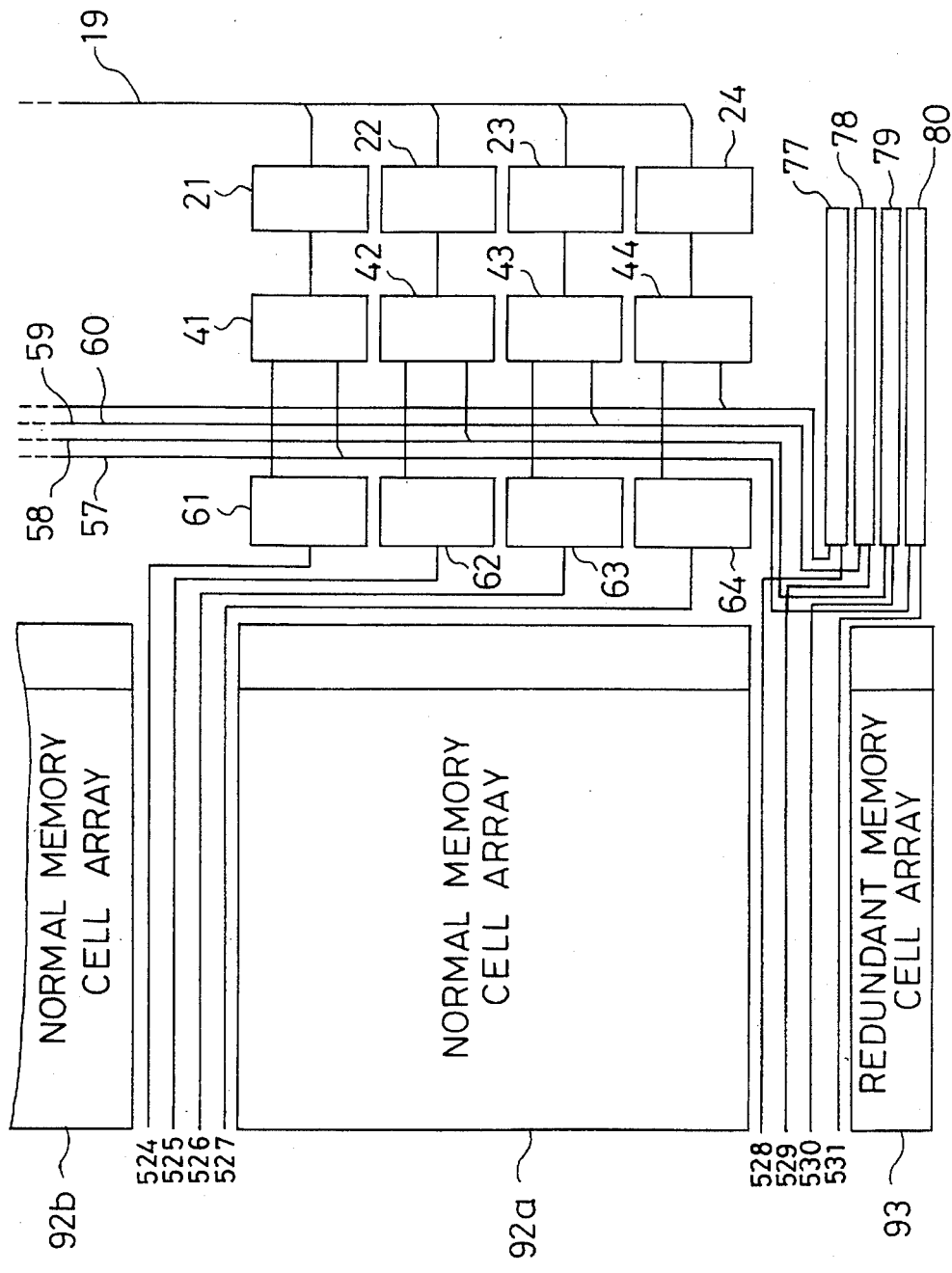
FIG. 56 is a schematic view of the layout of the memory in FIG. 54.

FIG. 56 is a circuit layout of the memory having a serial port in the present embodiment. The description of components having the same functions as in FIG. 54 will be omitted by providing the same reference numerals. In FIG. 56 are shown normal cell array data transfer buses 524 to 527 and redundant cell array data transfer buses 528 to 531.

In the present embodiment, as shown in FIG. 56, the amplifier circuits 77 to 80 are laid out in accordance with the width of the area in which the amplifier circuits 61 to 64, redundant/normal changeover switches 41 to 44, and P/S circuits 21 to 24 were previously laid out. The width of the amplifier circuits 77 to 80 in the layout is thereby reduced, resulting in a smaller width of the redundant memory cell array. The present embodiment has shown the case in which the width of the memory cell array is relatively small compared with the width of the layout of its matching circuits. In such a case, the layout shown in the present embodiment is particularly effective.

As described above in the present embodiment, the parallel to serial converting circuits are divided into four clusters and the memory cell array is divided into four sections correspondingly, so that each section of the memory cell array is independently subjected to redundant relief. Moreover, the redundant memory cell array is used in common by the memory cell arrays. Consequently, redundant relief can be achieved by a unit smaller than that of a P/S conversion with no distinction by the address, resulting in higher relief efficiency. Compared with the twelfth embodiment in which sixteen bits are relieved together as shown in FIG. 45, the present embodiment has improved in that sixteen bits are divided into four groups so that every four bits in each group are subjected to simultaneous relief. Consequently, in addition to the advantage of fewer memory cells wasted in redundant relief of the thirteenth embodiment, the present embodiment has another advantage of the reduced chip area, for it is no more necessary for four sections of the memory cell array to have their own redundant cell arrays. Although the wire lengths of the redundant data transfer buses 57 to 60 and the parasitism capacitances thereof are increased, because the redundant data transfer buses 57 to 60 are used in common by the groups, there arises no problem associated with speed, for the changeover to redundancy is carried out in the portion operating at a lower speed prior to a P/S conversion.

In the thirteenth and fourteenth embodiments, the circuit form is not limited thereto. Any circuit form may be used as long as it has the same function. In particular, although each of the groups resulting from the division has a redundant fuse circuit of its own in the thirteenth and fourteenth embodiments, if the redundant fuse circuit of the ninth embodiment (FIG. 32) (a common redundant fuse circuit used by the groups which is provided with the function of distinguishing the groups without the inputting of the address) is used in combination, the redundant fuse circuit can be used in common by the group units, resulting in a redundant circuit with high efficiency.

(Fifteenth Embodiment)

Figure 57:
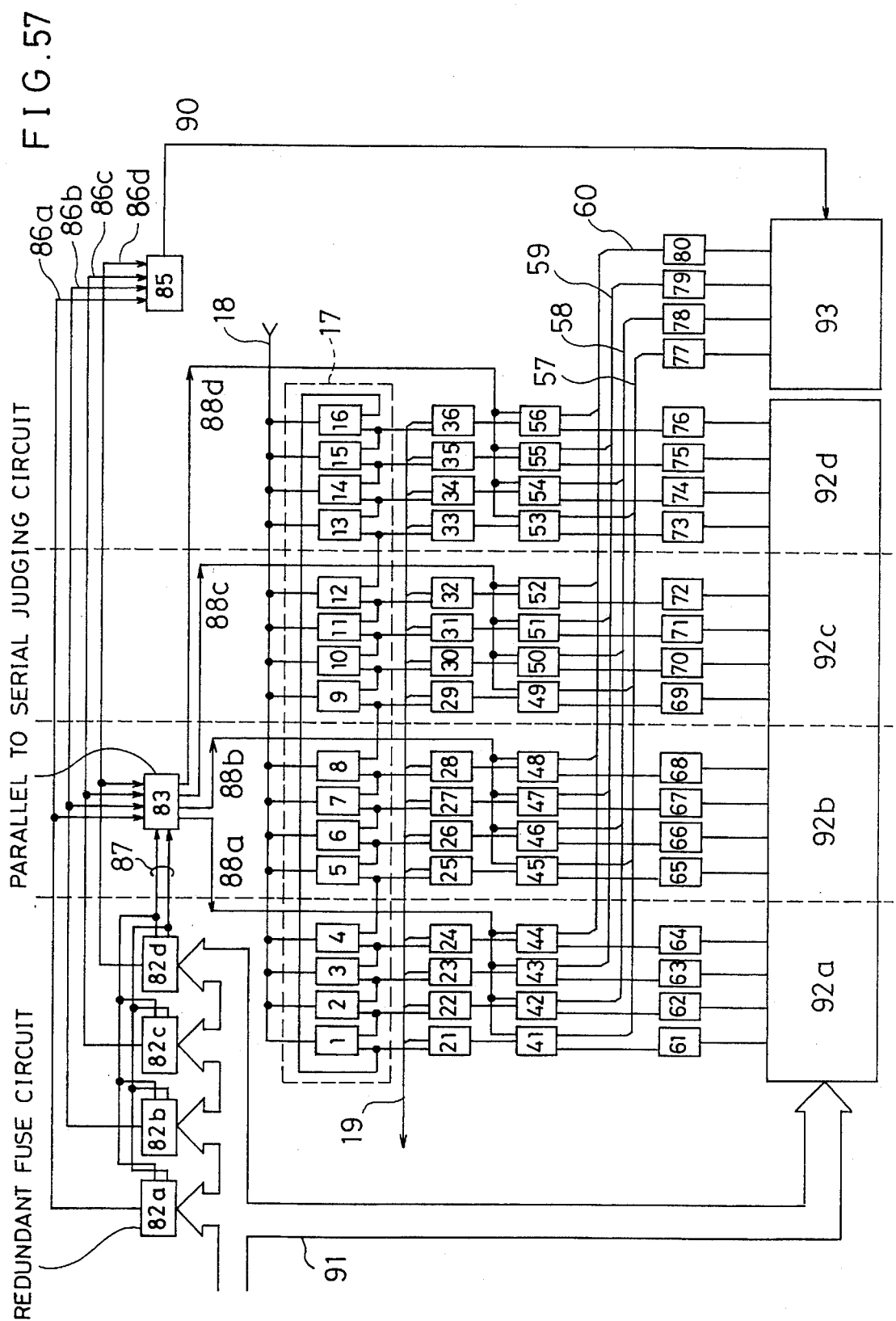
FIG. 57 is a schematic view of a memory having a serial port according to a fifteenth embodiment of the present invention.

FIG. 57 shows a fifteenth embodiment of the present invention, which is a combination of the ninth and fourteenth embodiments. In the drawing are shown redundant fuse circuits 82a to 82d of the structure shown in FIG. 32, P/S judging circuit 83 of the structure similar to that of the I/O judging circuit of FIG. 36, redundant address detect signals 86a to 86d, degenerate address 87 outputted from the additional information storage unit of the redundant fuse circuit, and changeover signals 88a to 88d to the redundant/normal changeover switches 41 to 56.

In the additional information storage units of the redundant fuse circuits 82a to 82d is stored information on the memory cell arrays corresponding to the four units of a P/S conversion resulting from the division, instead of information for identifying the I/O's.

Upon receiving the output 87 from the additional information storage unit of the redundant fuse circuits 82a to 82d, the P/S judging circuit 83 identifies the P/S unit and then outputs any of the changeover signals 88a to 88d on the inputting of the address to be relieved.

With the above structure, it becomes possible for the memory cell arrays of the units of a P/S conversion to use the redundant fuse circuits 82a to 82d in common, resulting in increased redundant relief efficiency. This effect is also applicable to a chip having a degenerate address due to a P/S conversion.

(Sixteenth Embodiment)

Figure 58:
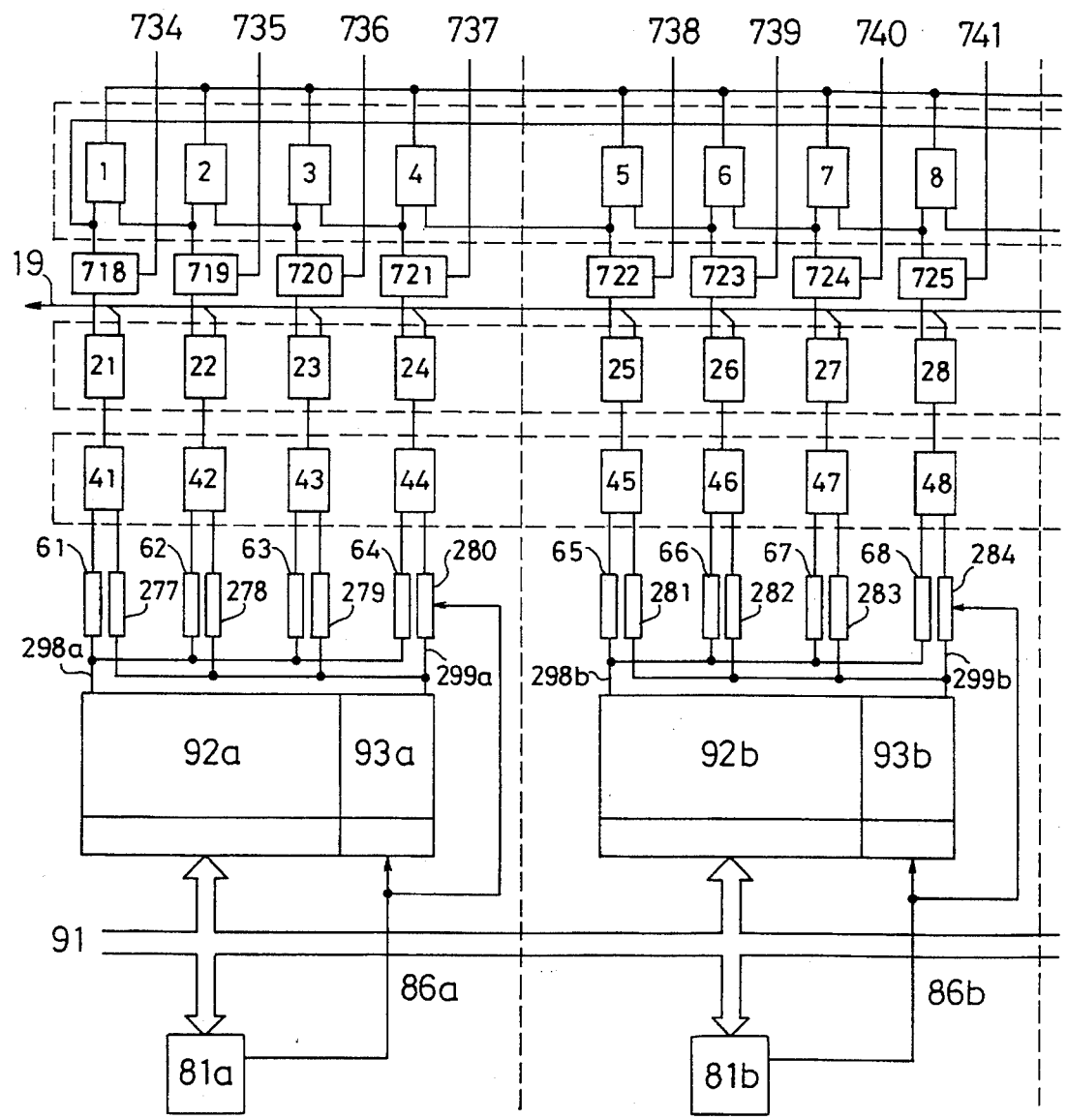
FIGS. 58A and 58B are schematic views of a memory having a serial port according to a sixteenth embodiment of the present invention.
Figure 58:
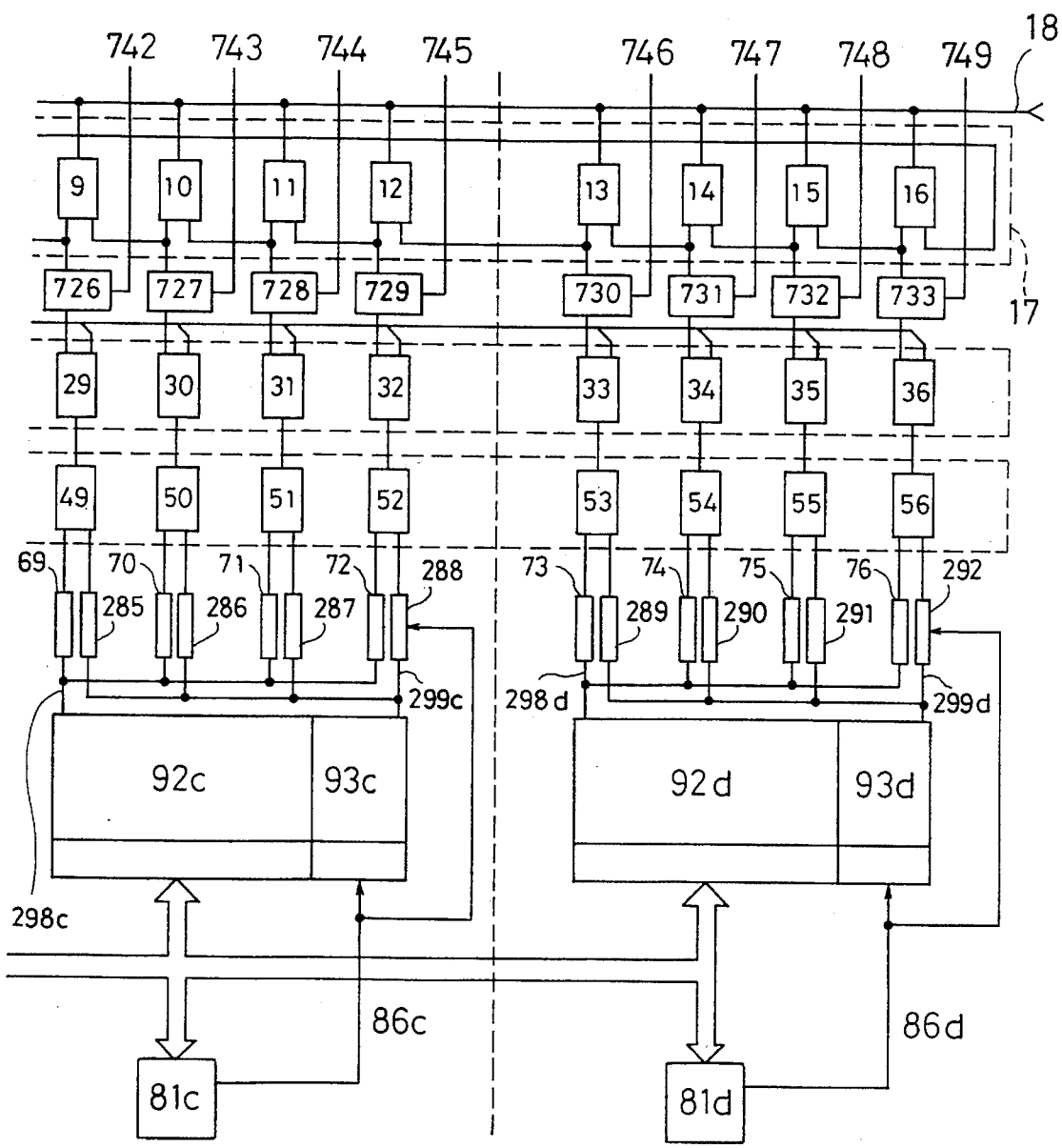

FIGS. 58A and 58B show a sixteenth embodiment of the present invention.

In FIGS. 58A and 58B, the description of components having the same functions as in FIG. 45 or in FIGS. 50A and 50B will be omitted by providing the same reference numerals. In the drawing are shown serial/random control changeover circuits 718 to 733 and address signals 734 to 749.

The present embodiment is obtained by adding, to the memory having a serial port in the thirteenth embodiment, the circuits 718 to 733 for generating, in a switching manner, either of the output of the shift register 17 for controlling the P/S converting circuits 21 to 36 and the address signals 734 to 749 inputted from the outside of the chip in accordance with the operational mode, so that the parallel portions of the P/S converting circuits 21 to 36 can be selected at random.

Figure 59:
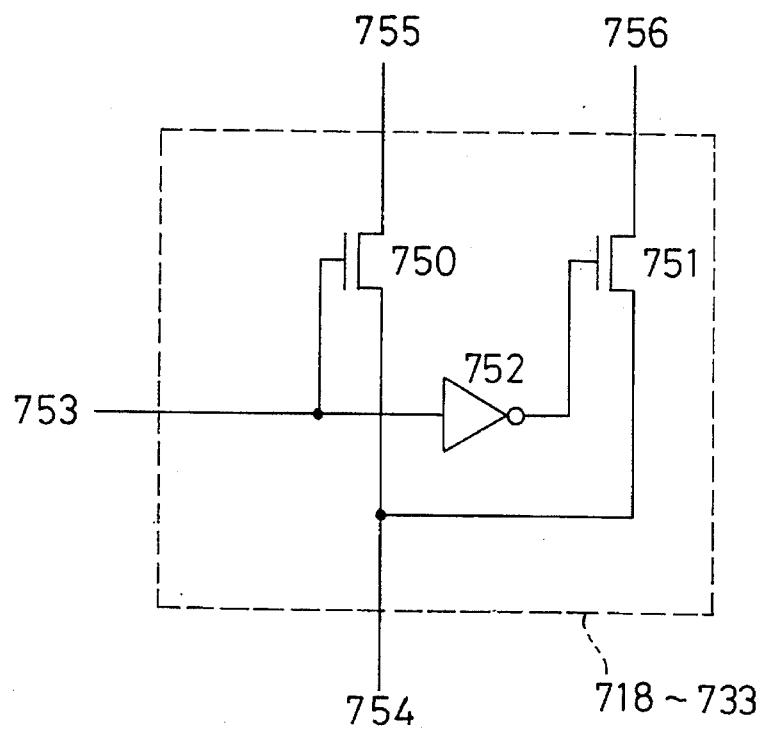
FIG. 59 is a circuit diagram of the serial/random control changeover circuit in FIGS. 58A and 58B.
Figure 60:
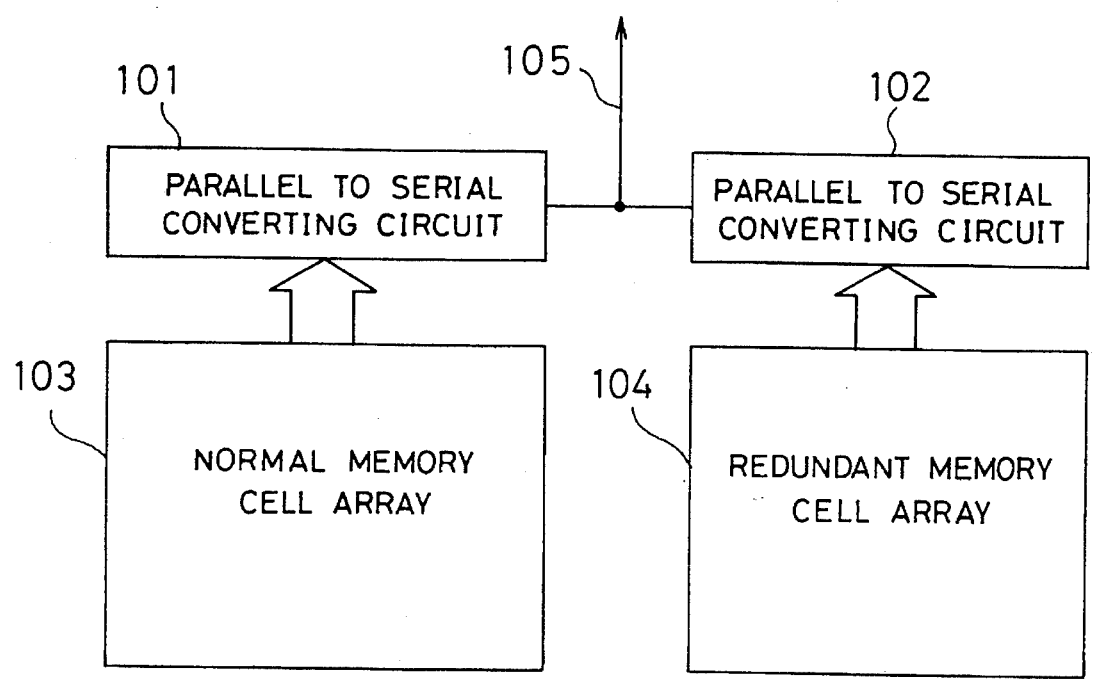
FIG. 60 is a schematic view of a conventional memory having a serial port.
Figure 61:
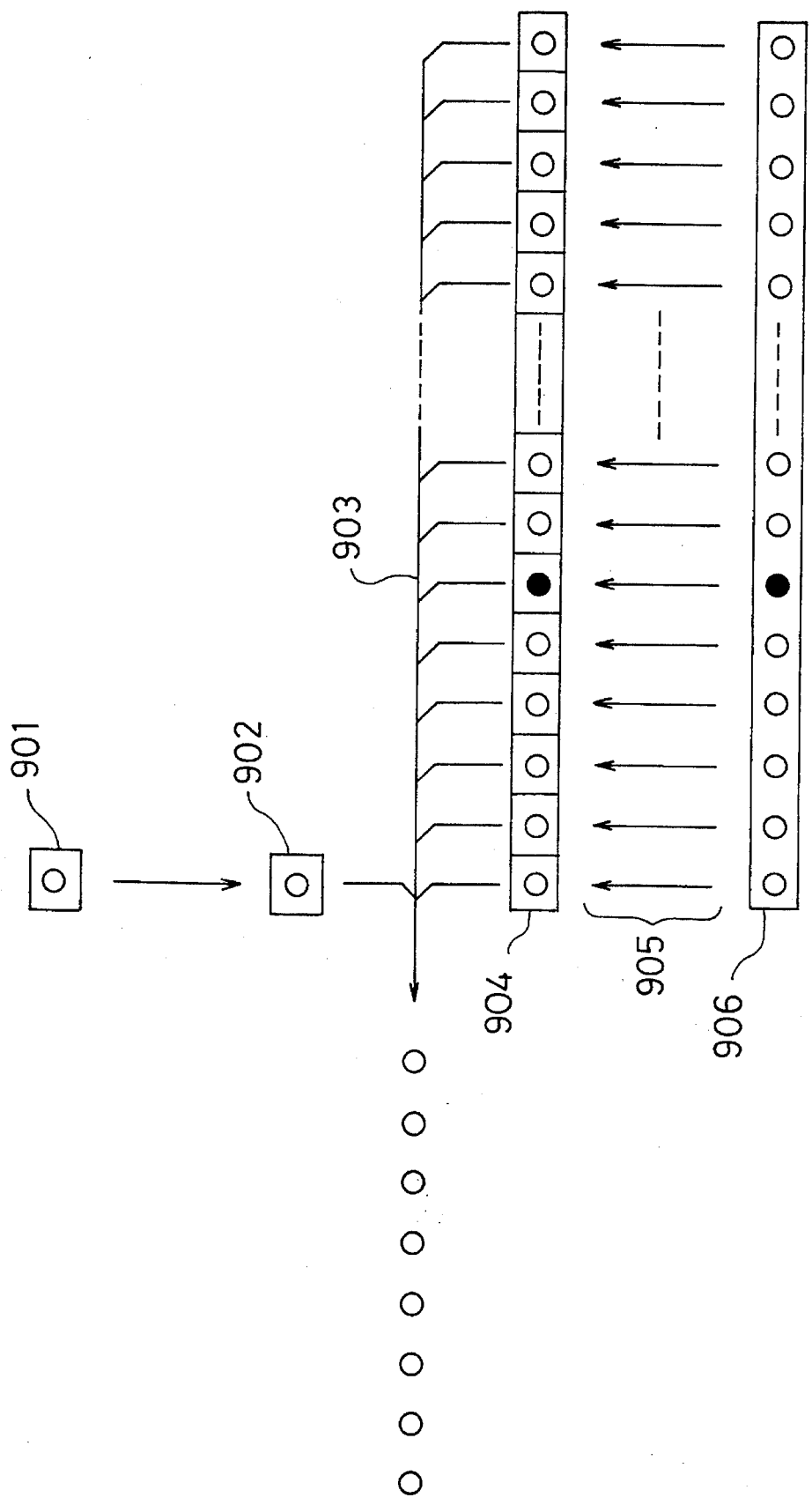
FIG. 61 is a view diagrammatically showing the operation of the memory in FIG. 60.

FIG. 59 shows the serial/random control changeover circuit 718 to 733. In the drawing are shown N-channel MOSFETs 750 and 751, an inverter 752, a mode changeover signal 753, an output terminal 754, an address input terminal 755, and an input terminal for the output of the shift register. As can be seen from FIG. 59, the circuits can output either the address or the output of the shift register to the serial data bus 19 in accordance with the state of the mode changeover signal 753.

In the structure of the present embodiment, the parallel portion (input portion) of the P/S converting circuit can be selected at random with respect to the memory having the P/S converting memory, so that redundancy judgment or a characteristic test on the memory cell array portion can easily be performed.

We claim:

1. A redundancy judging circuit for a semiconductor memory, comprising:

a plurality of redundant address comparing circuits, each for interposing a first impedance between a power supply and an individual redundant address comparing line if an input address matches a spare address and interposing a second impedance having a different value from that of said first impedance between said power supply and said individual redundant address comparing line if said input address does not match said spare address;

a plurality of spare generating circuits having their input terminals individually connected to redundant address comparing lines of said plurality of redundant address comparing circuits;

a plurality of one-direction two-terminal devices having their cathode terminals individually connected to the individual redundant address comparing lines of said plurality of redundant address comparing circuits and having their anode terminals connected in common to an integrated redundant address comparing line; and an overall redundant use detecting circuit having its input terminal connected to said integrated redundant address comparing line, said overall redundant use detecting circuit detecting a magnitude of an impedance between the anode terminals of said plurality of one-direction two-terminal devices, the integrated redundant address comparing line and the power supply.

2. A redundancy judging circuit according to claim 1, wherein:

each of said spare generating circuits has an input impedance differential amplifier;

one input terminal of said input impedance differential amplifier is connected to said individual redundant address comparing line and the other input terminal thereof is connected to a reference line; and said reference line is connected to said power supply with a third impedance interposed therebetween, said third impedance having an intermediate value between the value of said first impedance and the value of said second impedance.

3. A redundancy judging circuit according to claim 2, wherein each of said individual redundant address comparing line and reference line is connected to another power supply via a transistor which can be set in a conductive state in response to a pulse signal.

4. A redundancy judging circuit according to claim 1, wherein:

said overall redundant use detecting circuit has an input impedance differential amplifier;

one input terminal of said input impedance differential amplifier is connected to said integrated redundant address comparing line and the other input terminal thereof is connected to a reference line; and said reference line is connected to said power supply with a third impedance interposed therebetween, said third impedance having an intermediate value between the value of said first impedance and the value of said second impedance.

5. A redundancy judging circuit according to claim 3, wherein each of said integrated redundant address comparing line and reference line is connected to another power supply via a transistor which can be set in a conductive state in response to a pulse signal.

6. A redundancy judging circuit according to claim 1, wherein:

each of said spare generating circuits has an input impedance differential amplifier;

one input terminal of said input impedance differential amplifier is connected to the individual address comparing line, which extends from a central memory block to a marginal memory block on the semiconductor chip, via a transfer gate controlled by a block select signal and the other input terminal thereof is connected to a reference line; and said reference line is connected to said power supply with a third impedance interposed therebetween, said third impedance having an intermediate value between the value of said first impedance and the value of said second impedance.

7. A redundancy judging circuit according to claim 1, wherein:

said overall redundant use detecting circuit has an input impedance differential amplifier;

one input terminal of said input impedance differential amplifier is connected to the integrated redundant address comparing line, which extends from a central memory block to a marginal memory block on the semiconductor chip, via a transfer gate controlled by a block select signal and the other input terminal thereof is connected to a reference line; and said reference line is connected to said power supply with a third impedance interposed therebetween, said third impedance having an intermediate value between the value of said first impedance and the value of said second impedance.

8. A semiconductor memory comprising:

a plurality of redundant fuse circuits each having
a judging circuit which determines whether an input address is defective, and
an additional information storing circuit for generating a degenerate address, wherein a number of judging circuit in said semiconductor memory is equal to a number of additional information storing circuits in said semiconductor memory;

a plurality of address degenerate portions; and a plurality of redundant memory cells, and wherein said plurality of address degenerate portions use said plurality of redundant fuse circuit in common.

9. A semiconductor memory according to claim 8 wherein:

said judging circuit has the function of generating a redundant address detect signal in accordance with said defective input address to be relieved; and said additional information storing circuit has the function of generating said degenerate address in accordance with said redundant address detect signal from said judging circuit.

10. A semiconductor memory according to claim 9, further comprising a decode circuit for decoding said degenerate address when said redundant address detect signal is generated so that said plurality of address degenerate portions are distinguished from each other.

11. A semiconductor memory according to claim 8 wherein said additional information storing circuit is operated only when said judging circuit is making said determination whether said input address is defective.

12. A semiconductor memory according to claim 8, wherein said plurality of address degenerate portions use said plurality of redundant memory cells in common.

13. A semiconductor memory comprising:

a memory cell array for redundant relief;

a normal memory cell array;

a first pair of data lines for reading data out of said memory cell array for redundant relief;

a second pair of data lines for reading data out of said normal memory cell array;

an amplifier circuit for outputting data onto a pair of output data lines; and a connecting portion for inputting data either from said first pair of data lines or from said second pair of data lines into said amplifier circuit, wherein data is read out of each of said memory cell array for redundant relief and said normal memory cell array in time of redundant relief and a changeover to and from redundancy and non-redundancy is carried out by said connecting portion;

a circuit for generating a redundant address detect signal on the inputting of an address to be relieved;

a redundant fuse circuit for generating a degenerate address in accordance with said redundant address detect signal; and a decode circuit for decoding said degenerate address when said redundant address detect signal is generated, wherein said connecting portion carries out a changeover to and from redundancy and non-redundancy depending on the result of decoding by said decode circuit.

14. A semiconductor memory according to claim 13, wherein a plurality of said memory cell arrays for redundant relief are provided.

15. A semiconductor memory comprising:

a normal memory cell array, a redundant memory cell array for relieving a failed cell in said normal memory cell array;

a redundant/normal changeover means for receiving a plurality of sets of data read out of said normal memory cell array and a single set of or a plurality of sets of data read out of said redundant memory cell array and replacing data from the failed cell in said normal memory cell array with data from said redundant memory cell array; and a parallel to serial converting means for performing a parallel to serial conversion with respect to a plurality of sets of data output from said redundant/normal changeover means, wherein a parallel portion of said converting circuit is used to perform redundant relief.

16. A semiconductor memory according to claim 15, wherein:

said normal memory cell array is divided into a plurality of sections, each section of the normal memory cell array having the redundant memory cell array; and said redundant/normal changeover means replaces only data read out of that section of said divided normal memory cell array which contains the failed cell with data from said redundant memory cell array.

17. A semiconductor memory according to claim 16, wherein each section of said divided normal memory cell array comprises a fuse circuit.

18. A semiconductor memory according to claim 16, said semiconductor memory further comprising a single or a plurality of fuse circuits, each fuse circuit being provided with the function of identifying a specific section of said divided normal memory cell array.

19. A semiconductor memory according to claim 15, wherein:

said normal memory cell array is divided into a plurality of sections, the sections of said divided normal memory cell array using the redundant memory cell array in common; and said redundant/normal changeover means replaces only data read out of that section of said divided normal memory cell array which contains the failed cell with data from said redundant memory cell array.

20. A semiconductor memory according to claim 19, wherein each section of said divided normal memory cell array comprises a fuse circuit.

21. A semiconductor memory according to claim 19, said semiconductor memory further comprising a single or a plurality of fuse circuits, each fuse circuit being provided with the function of identifying a specific section of said divided normal memory cell.

22. A semiconductor memory comprising:

a normal memory cell array;

a redundant memory cell array for relieving a failed cell in said normal memory cell array;

a first amplifying means for amplifying data read out of said normal memory cell array;

a second amplifying means for amplifying data read out of said redundant memory cell array;

a redundant/normal changeover means for receiving a plurality of sets of data read out of said normal memory cell array and a single set of or a plurality of sets of data read out of said redundant memory cell array and replacing data from the failed cell in said normal memory cell array with data from said redundant memory cell array; and a parallel to serial converting means for performing a parallel to serial conversion with respect to a plurality of sets of data outputted from said redundant/normal changeover means, wherein said first amplifying means, redundant/normal changeover means, and parallel to serial converting means are disposed on that side of said normal memory cell array on which output signal lines of said parallel to serial converting means are disposed and said second amplifying means is disposed so that the dimension of said second amplifying means in the direction perpendicular to said output signal lines becomes substantially equal to the maximum parallel dimension of the area in which said first amplifying means, redundant/normal changeover means, and parallel to serial converting means are laid out, and further wherein a parallel portion of said parallel to serial converting circuit is used to perform redundant relief.

23. A semiconductor memory according to claim 15, further comprising:

a control means for controlling the parallel to serial converting operation of said parallel to serial converting means; and an operational mode changeover means for outputting, in a switching manner, an output of said control means or an address for selecting the parallel portion of said parallel to serial converting means at random in accordance with the operational mode, wherein the output of said operational mode changeover means is inputted to said parallel to serial converting means.

* * * * *

UNITED STATES PATENT AND TRADEMARK OFFICE
CERTIFICATE OF CORRECTION

PATENT NO. : 5,508,963           Page 1 of 4
DATED     : April 16, 1996
INVENTOR(S) : Sawada et al.

It is certified that error appears in the above-identified patent and that said Letters Patent is hereby corrected as shown below:

Column 1, line 13, change "RIM)," to --RAM),--; and
       line 61, change "In" to --in--.

Column 2, line 34, change "1.2.h" to --12.h--.

Column 3, line 40, change "Judging" to --judging--.

Column 4, line 38, change "red" to --Td--; and
       line 49, change "813.N." to --313.N.--.

Column 5, line 22, change "Judging" to --judging --.

Column 6, line 64, change "Is" to --is--.

Column 7, line 46, change "In" to --in--.

Column 8, line 39, change "it" to --It--.

Column 9, line 7, change "(1)" to --(i)--.

UNITED STATES PATENT AND TRADEMARK OFFICE
CERTIFICATE OF CORRECTION

PATENT NO. : 5,508,963

DATED : April 16, 1996

INVENTOR(S) : Sawada et al.

It is certified that error appears in the above-identified patent and that said Letters Patent is hereby corrected as shown below:

Column 10, line 22, change "Judging" to --judging--.

Column 12, line 46, change "22.3" to --22.j--.

Column 13, line 29, change "In" to --in--; and
 line 38, change "SGWLJ" to --SGWLj--.

Column 16, line 38, change "Judges" to --judges --; and
 line 56, change "Judging" to --judging--.

Column 18, line 65, change "SPA8=0" to --/SPA8=0--.

Column 20, line 2, change "NS." to --N5.--;
 line 14, change "A8" to --/A8--;
 line 17, change "NS" to --N5--;
 line 23, change "88a" to --38a--;
 line 30, change "84,1," to --84.1,--;

UNITED STATES PATENT AND TRADEMARK OFFICE
CERTIFICATE OF CORRECTION

PATENT NO. : 5,508,963

DATED : April 16, 1996

INVENTOR(S) : Sawada et al.

Page 3 of 4

It is certified that error appears in the above-identified patent and that said Letters Patent is hereby corrected as shown below:

Column 20, line 35, change "(/AS" to --(/A8--;
        line 64, change "Input" to --input-- and "In" to --in--; and
        line 67, change "NS" to --N5--.

Column 21, line 38, change "Feedthrough" to --feedthrough--; and
        line 42, change "OR" to --NOR--.

Column 23, line 13, change "In" to --in--;
        line 55, change "iN12," to --IN12,-- and "QK1," to --Qgl,--; and
        line 56, change "Fcl. if" to --Fcl. If--.

Column 25, line 9, change "{Rdo/N+1/(1/(1/Rst+N/Rss)}" to --{Rdo/N+1/(1/Rst+N/Rss)}--; and
        line 62, change "8.N" to --3.N--.

Column 26, line 1, change "28" to --23--; and
        line 15, change "28" to --23--.

Column 27, line 12, change "Figure" to --figure--;
        line 28, change "in)" to --in--; and
        line 44, change "bits" to --bits are--.

UNITED STATES PATENT AND TRADEMARK OFFICE
CERTIFICATE OF CORRECTION

PATENT NO. : 5,508,963
DATED : April 16, 1996
INVENTOR(S) : Sawada et al.

It is certified that error appears in the above-identified patent and that said Letters Patent is hereby corrected as shown below:

Column 28, line 18, change "O's," to --I/O's,--; and
line 38, change "38," to --33,--.

Column 29, line 10, change "3411" to --341--.

Column 31, line 37, change "Judging" to --judging--.

Column 33, line 14, change "81 to 78" to --61 to 76--; and
line 67, change "[laving" to --having--.

Column 34, line 46, delete "the" (first occurrence).

Column 36, line 24, change ":fuse" to --fuse--.

In the Claims:

Claim 15, line 15, change "said" to --said parallel to serial.--.

Signed and Sealed this

Thirty-first Day of October, 2000

Attest:

Attesting Officer

Q. TODD DICKINSON
*Director of Patents and Trademarks*